(12) United States Patent  (10) Patent No.: US 8,603,351 B2
Sakamoto et al.  (45) Date of Patent: Dec. 10, 2013

(54) WORKING METHOD FOR CUTTING

(75) Inventors: Takeshi Sakamoto, Hamamatsu (JP);
Hideki Shimoi, Hamamatsu (JP); Naoki Uchiyama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 557 days.

(21) Appl. No.: 12/601,090

(22) PCT Filed: May 23, 2008

(86) PCT No.: PCT/JP2008/059562
§ 371 (c)(1),
(2), (4) Date: Dec. 22, 2009

(87) PCT Pub. No.: WO2008/146744
PCT Pub. Date: Apr. 12, 2008

(65) Prior Publication Data
US 2010/0136766 A1 Jun. 3, 2010

(30) Foreign Application Priority Data
May 25, 2007 (JP) ................................ P2007-139593

(51) Int. Cl.
*B44C 1/22* (2006.01)
(52) U.S. Cl.
USPC ............. 216/62; 438/460; 438/461; 438/462; 438/463; 438/464; 257/E21.599

(58) Field of Classification Search
None
See application file for complete search history.

(56) References Cited

U.S. PATENT DOCUMENTS

2006/0121697 A1* 6/2006 Fujii et al. .................... 438/460

FOREIGN PATENT DOCUMENTS

| JP | 4-24944 | 1/1992 |
|---|---|---|
| JP | 9-7975 | 1/1997 |
| JP | 2003-334812 | 11/2003 |
| JP | 2004-343008 | 12/2004 |
| JP | 2004-351494 | 12/2004 |
| JP | 2005-51007 | 2/2005 |
| JP | 2005-74663 | 3/2005 |
| JP | 2007-69216 | 3/2007 |
| JP | 2007-275902 | 10/2007 |

* cited by examiner

*Primary Examiner* — Lan Vinh
*Assistant Examiner* — Jiong-Ping Lu
(74) *Attorney, Agent, or Firm* — Drinker Biddle & Reath LLP

(57) ABSTRACT

An object to be processed is reliably cut along a line to cut. An object to be processed is irradiated with laser light while locating a converging point at the object, so as to form a modified region in the object along a line to cut. The object formed with the modified region is subjected to an etching process utilizing an etching liquid exhibiting a higher etching rate for the modified region than for an unmodified region, so as to etch the modified region. This can etch the object selectively and rapidly along the line to cut by utilizing a higher etching rate in the modified region.

9 Claims, 120 Drawing Sheets

Fig.11
(a)
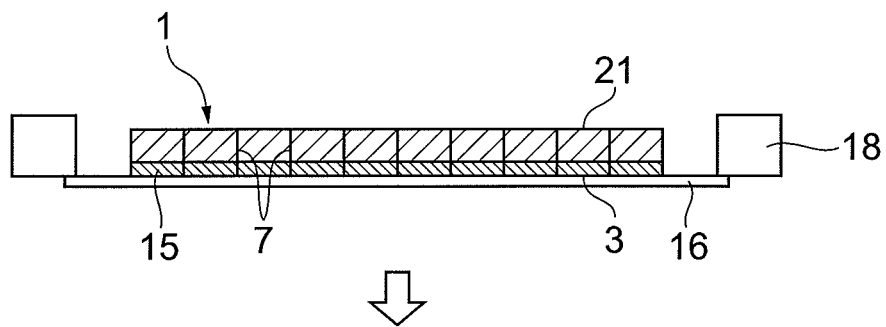
(b)
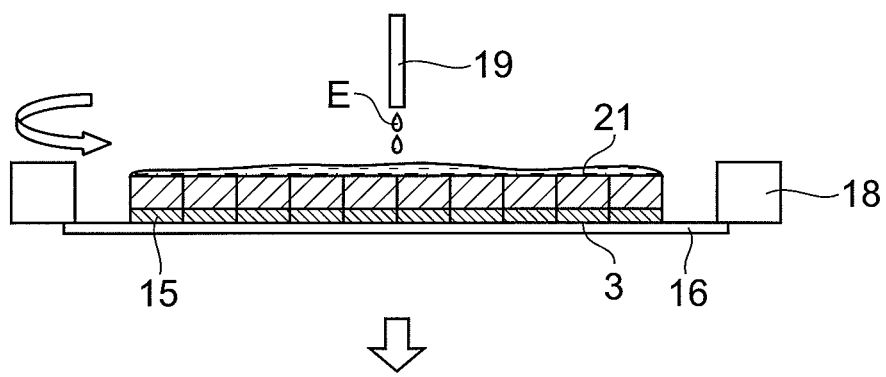
(c)
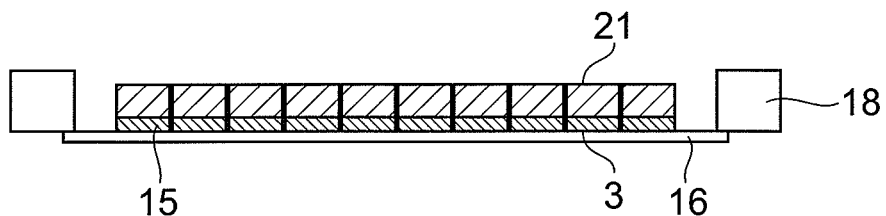

Fig.14
(a)
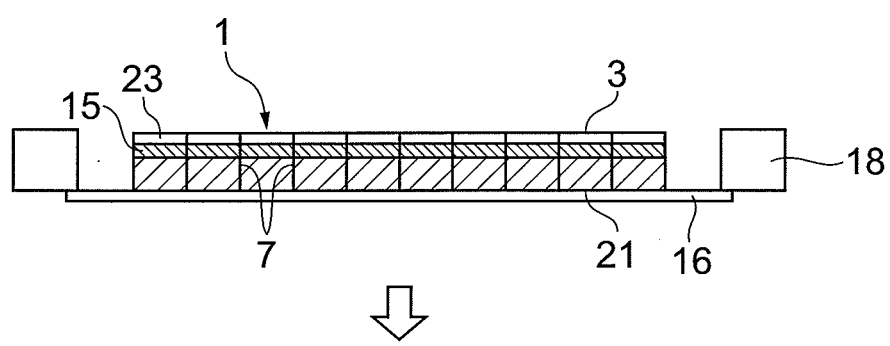
(b)
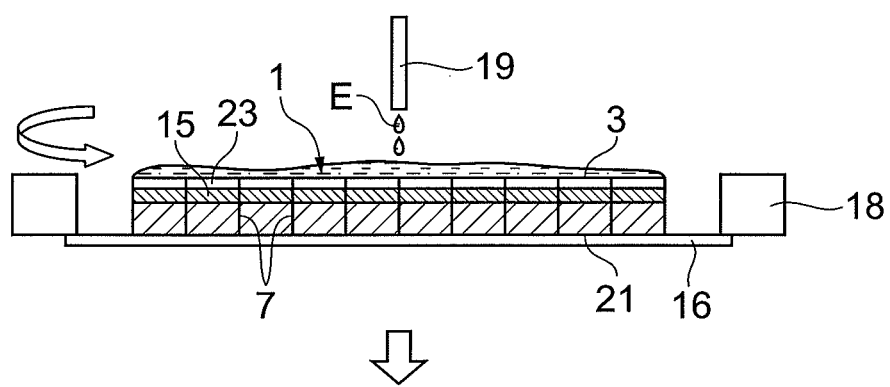
(c)
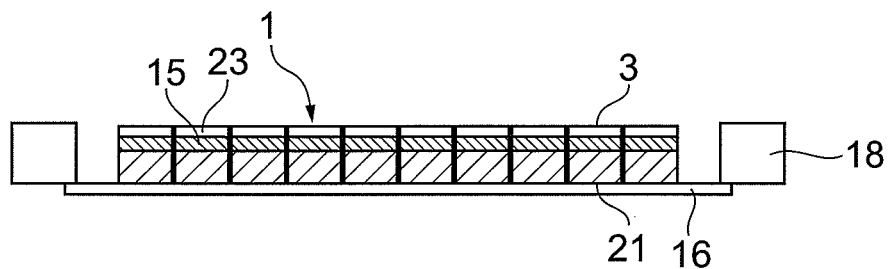

Fig.16
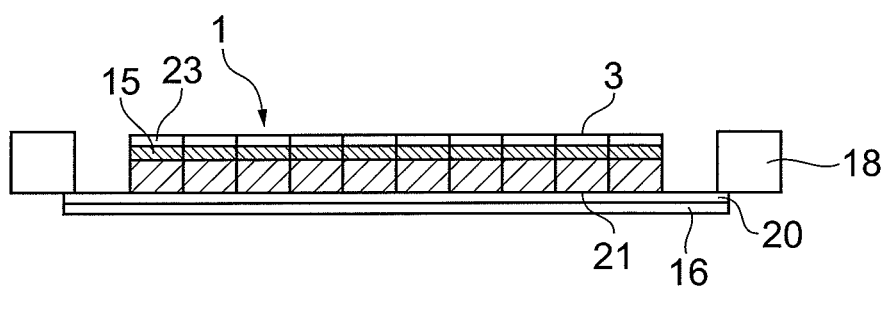
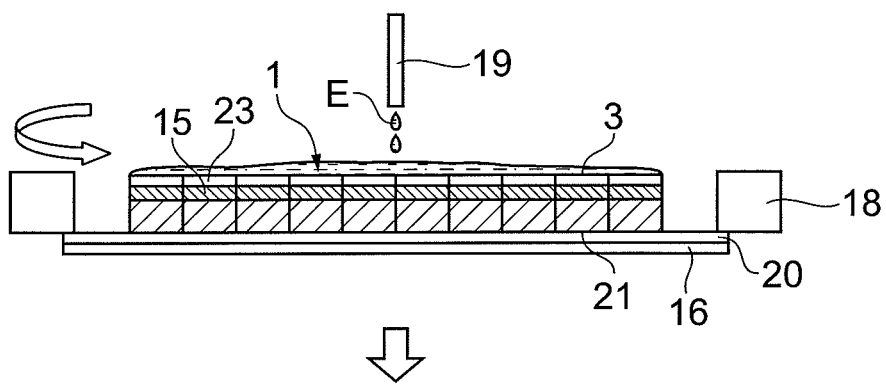
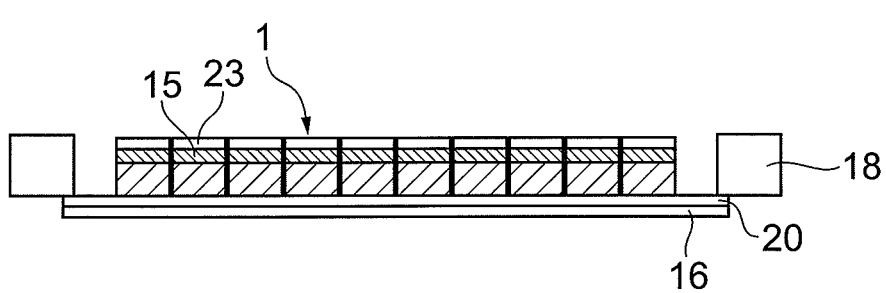

*Fig.17*
(a)
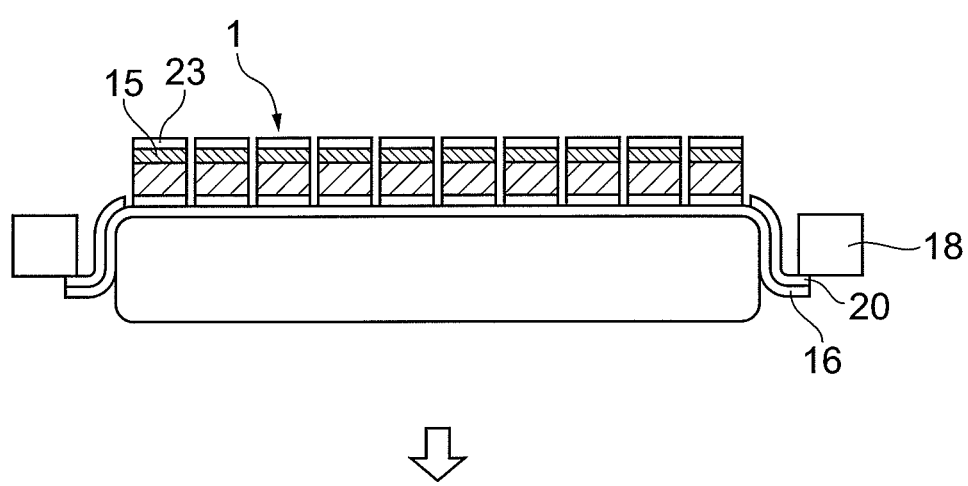
(b)
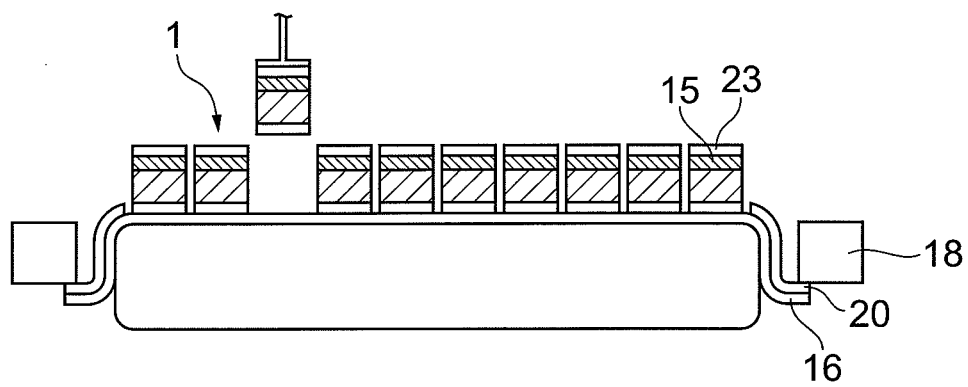

*Fig.18*

|  | SPIN ETCHING | DIPPING |
|---|---|---|
| VINYL CHLORIDE | △ | × |
| POLYOLEFIN | ○ | △ |
| PET | ◎ | ◎ |

Fig.19

|  | SPIN ETCHING | DIPPING |
|---|---|---|
| VINYL CHLORIDE | △ | × |
| POLYOLEFIN | ◎ | △ |
| PET | × | × |

Fig.20

| SUBSTRATE | ETCHING LIQUID |
|---|---|
| Si (ISOTROPIC) | MIXED LIQUID OF HNO₃ (NITRIC ACID), HF (HYDROFLUORIC ACID), AND H₂O (WATER) OR CH₃COOH (ACETIC ACID) |
| Si (ANISOTROPIC) | KOH(POTASSIUM HYDROXIDE),TMAH(AQUEOUS TETRAMETHYLAMMONIUM HYDROXIDE SOLUTION) EDP,NaOH,CsOH,NH₄OH,HYDRAZINE, ETC. |
| GaAs | MIXED LIQUID OF H₂SO₄ (SULFURIC ACID), H₂O₂ (HYDROGEN PEROXIDE SOLUTION), AND H₂O (WATER), MIXED LIQUID OF H₃PO₄ (PHOSPHORIC ACID), H₂O₂ (HYDROGEN PEROXIDE SOLUTION), AND H₂O (WATER), HNO₃(NITRIC ACID),HCl(HYDROCHLORIC ACID),CH₃OH(BROMINE METHANOL), MIXED LIQUID OF NH₄OH (AMMONIUM HYDROXIDE), H₂O₂ (HYDROGEN PEROXIDE SOLUTION), AND H₂O (WATER) |
| SILICA | MIXED LIQUID OF HF (HYDROFLUORIC ACID) AND H₂O (WATER) |
| SAPPHIRE | H₃PO₄(PHOSPHORIC ACID),H₂SO₄(SULFURIC ACID)+H₃PO₄(PHOSPHORIC ACID) |
| SiC | KOH(POTASSIUM HYDROXIDE) |
| QUARTZ CRYSTAL | NH₄F(SATURATED AQUEOUS AMMONIUM BIFLUORIDE SOLUTION) |

Fig.21

| Laser processing region name | | | Anisotropic wet etching | | Isotropic wet etching | | RIE (isotropic dry etching) | |
|---|---|---|---|---|---|---|---|---|
| | | | With fracture | Without fracture | With fracture | Without fracture | With fracture | Without fracture |
| Molten processed region | Si | Speed | ◎ | △ | ◎ | ○ | △ | △ |
| | | Cut quality | ◎ | ○ | △ | △ | ◎ | ◎ |
| Molten processed region or dielectric breakdown region | Glass | Speed | Not measured | Not measured | ○ | △ | △ | △ |
| | | Cut quality | Not measured | Not measured | ◎ | ◎ | ◎ | ◎ |
| High-density transitional region | Quartz crystal or sapphire | Speed | ○ | △ | ○ | × | × | × |
| | | Cut quality | ▲ | ○ | ▲ | △ | ◎ | ◎ |
| High-density transitional region | LiTaO₃ | Speed | ○ | △ | ○ | × | × | × |
| | | Cut quality | ▲ | ○ | ▲ | ○ | ◎ | ◎ |

Fig.25
(a)
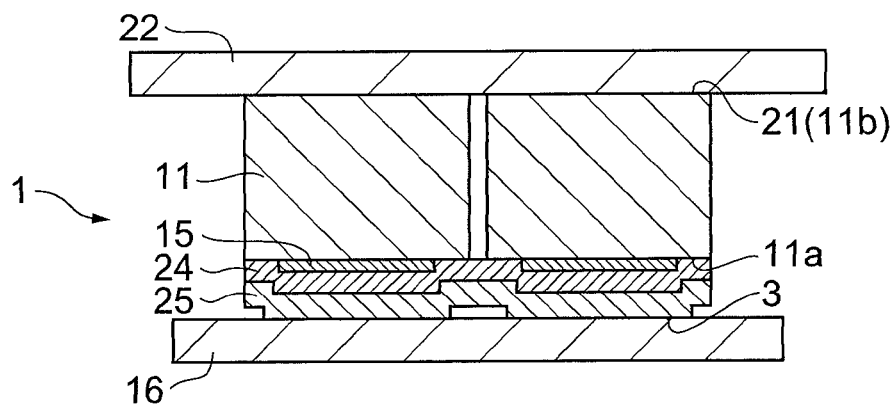
(b)
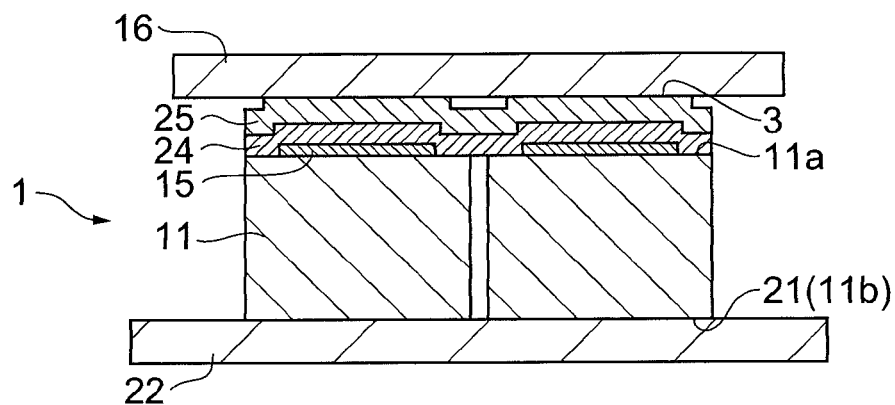
(c)
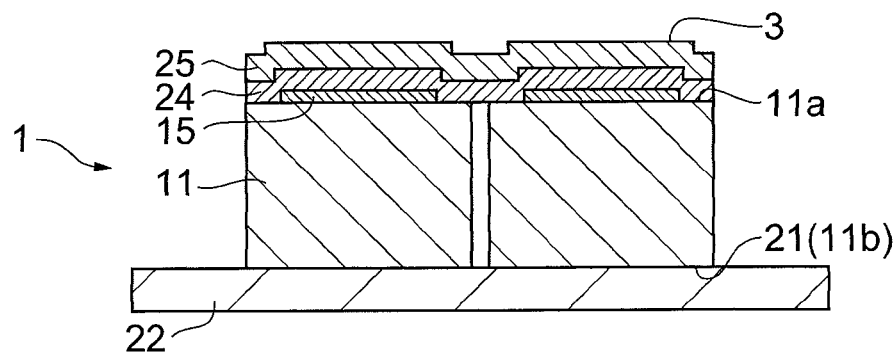

Fig.26
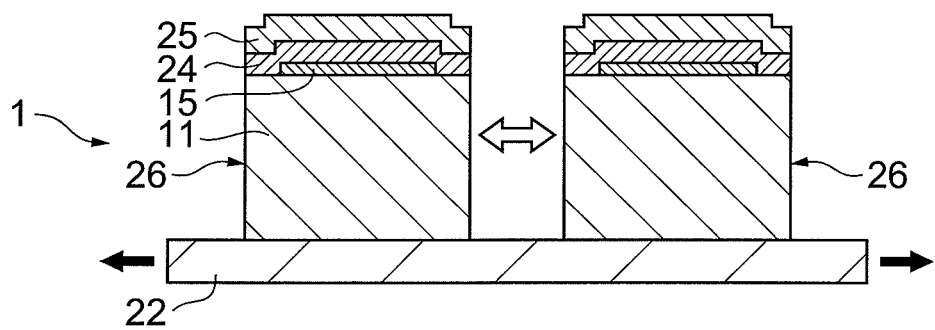
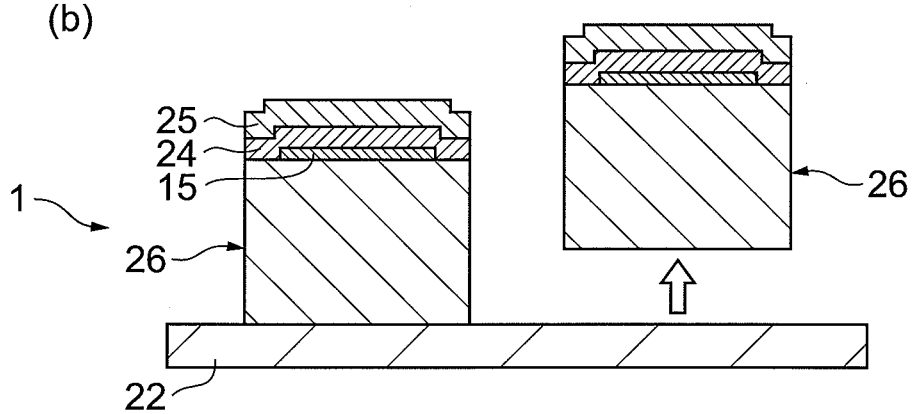

Fig.27
(a)
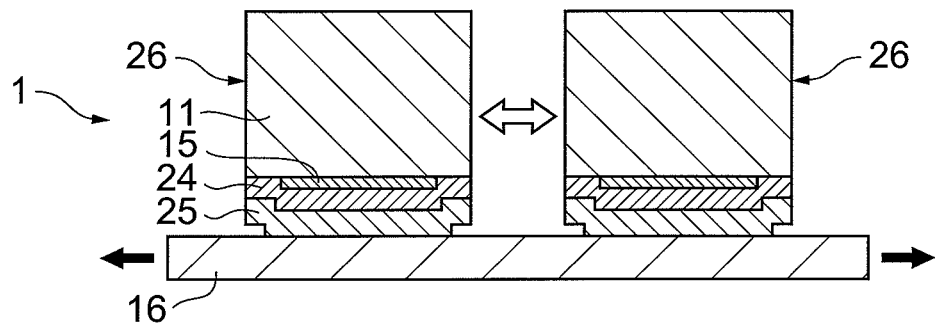
(b)
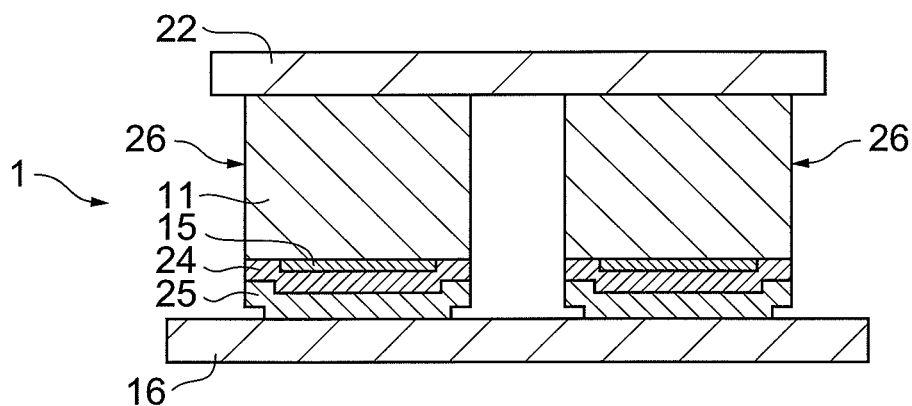
(c)
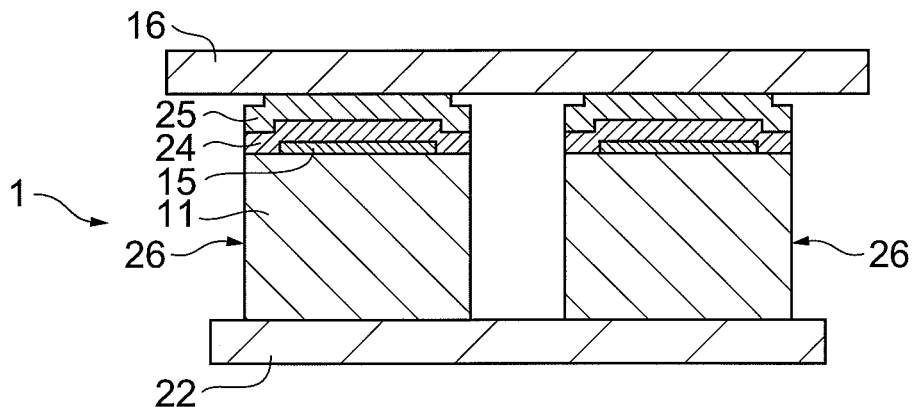

Fig.28
(a)
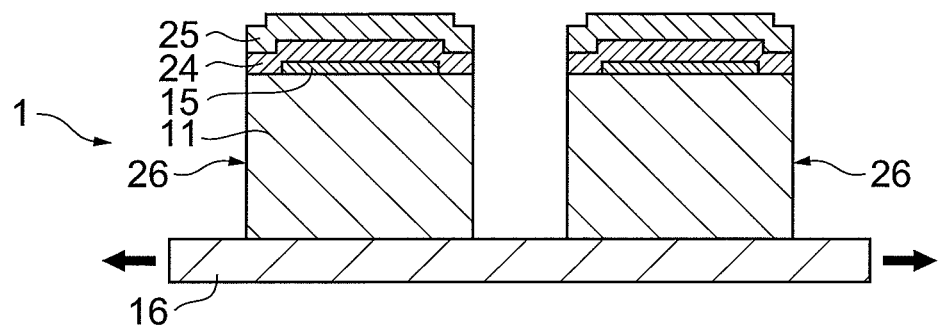
(b)
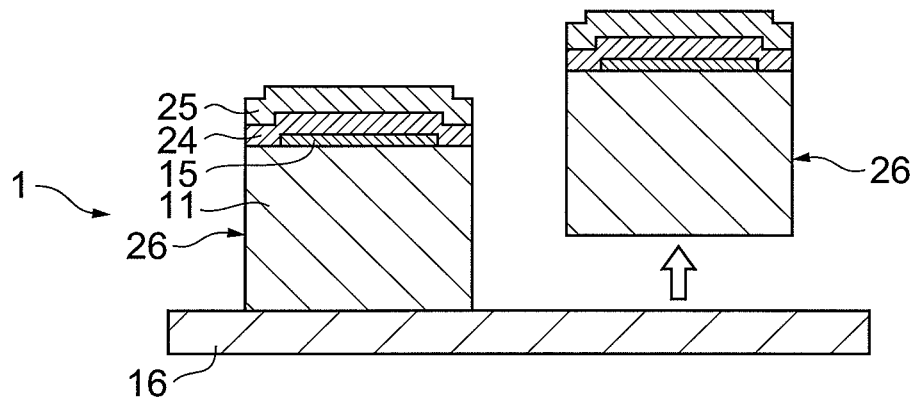

Fig.31
(a)
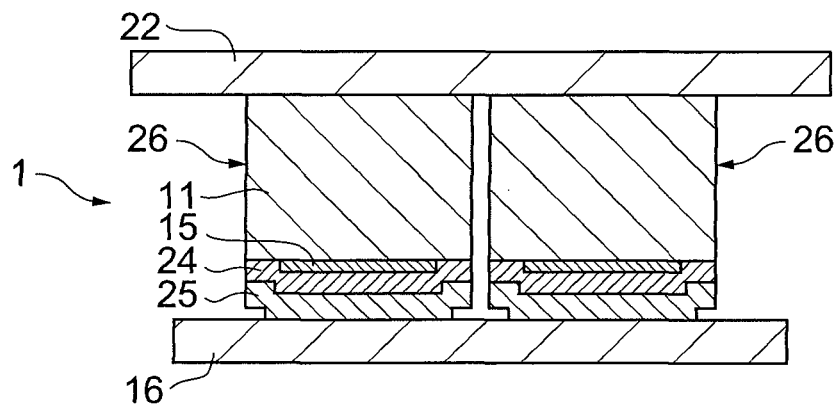
(b)
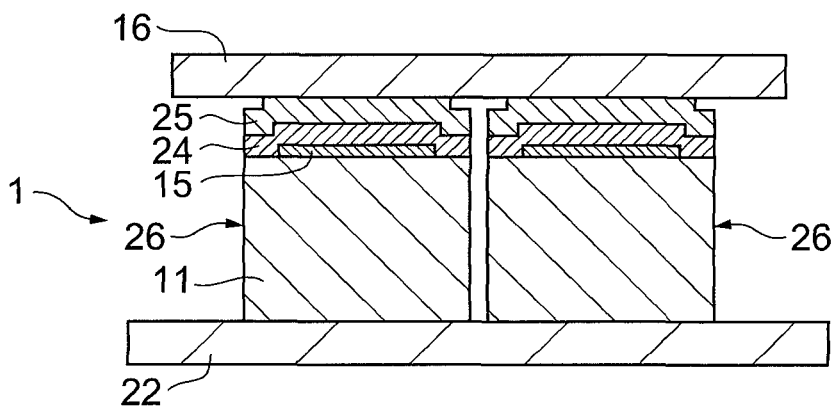
(c)
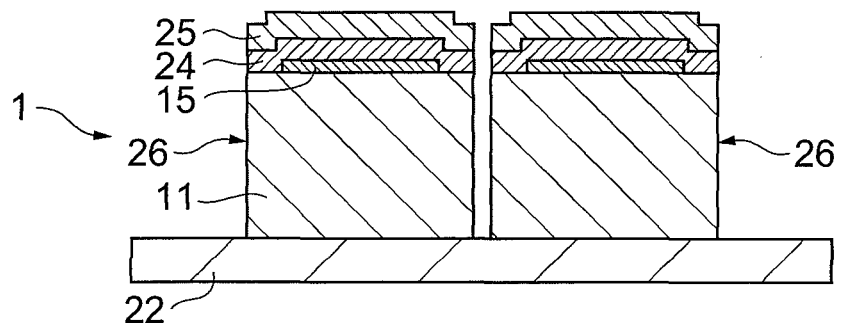

Fig.33
(a)
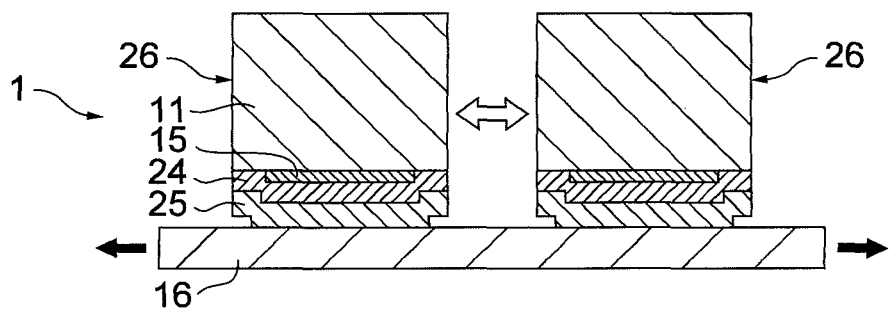
(b)
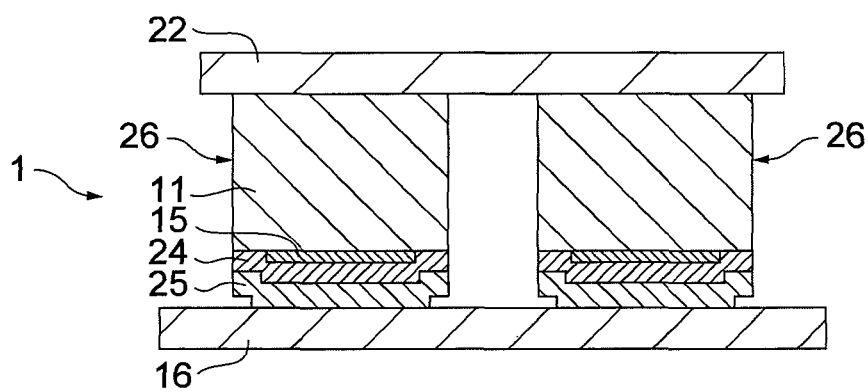
(c)
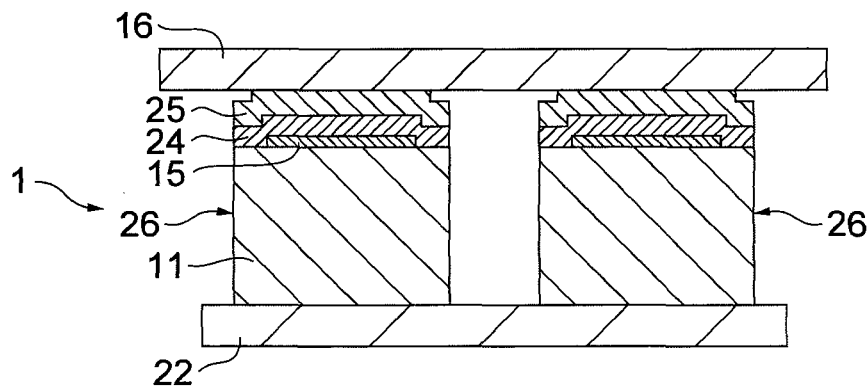

Fig.36
(a)
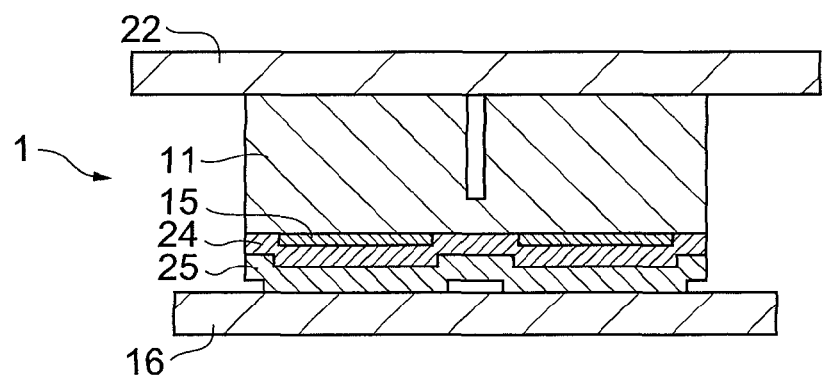
(b)
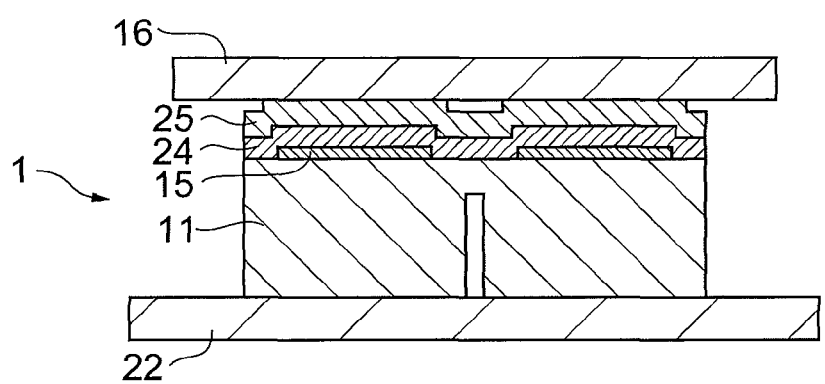
(c)
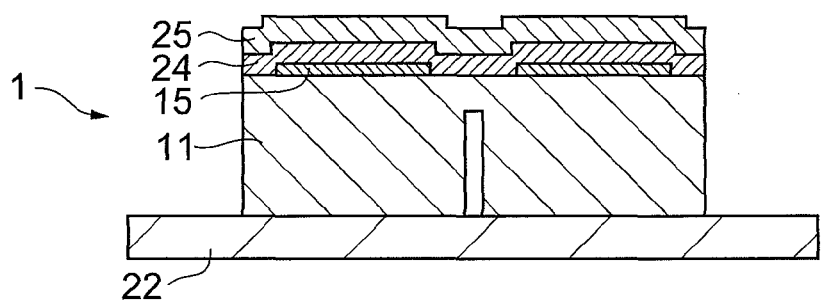

Fig.38
(a)
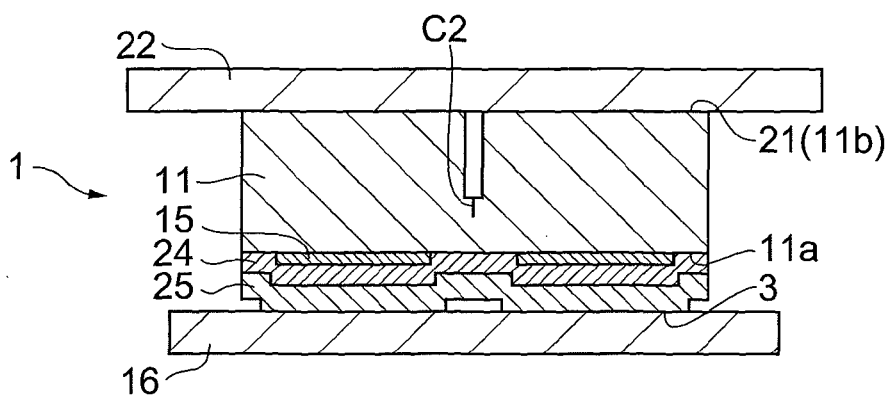
(b)
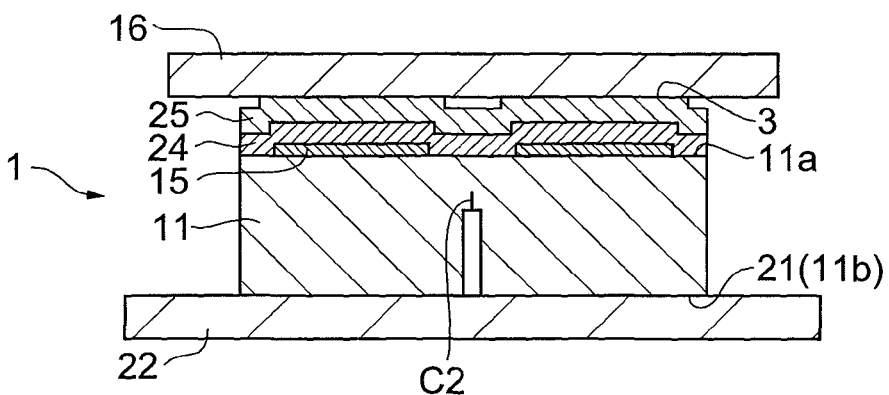
(c)
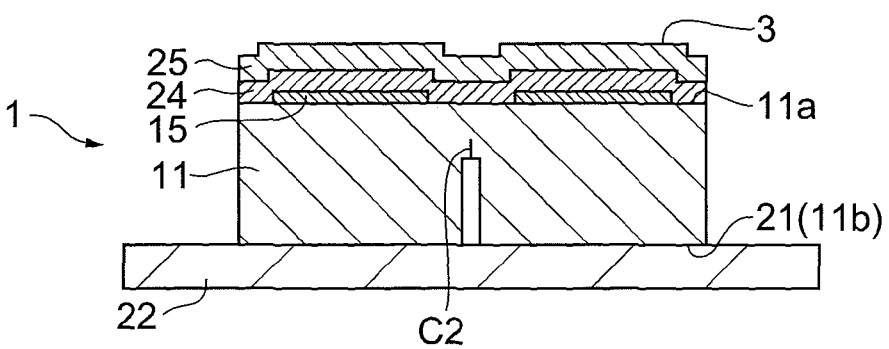

Fig.40
(a)
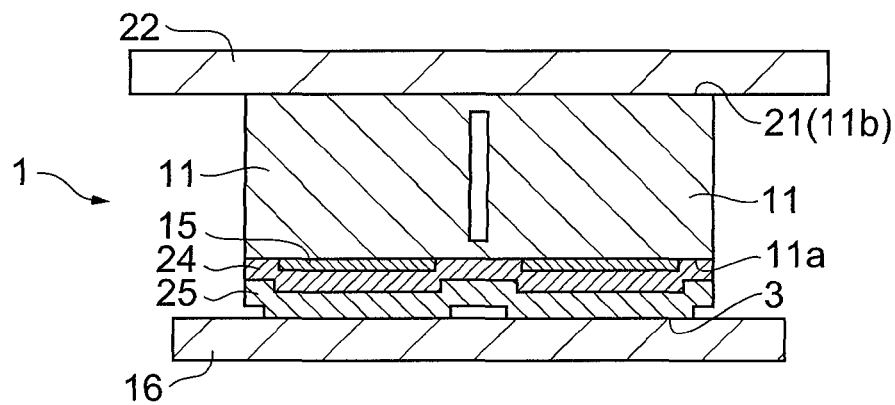
(b)
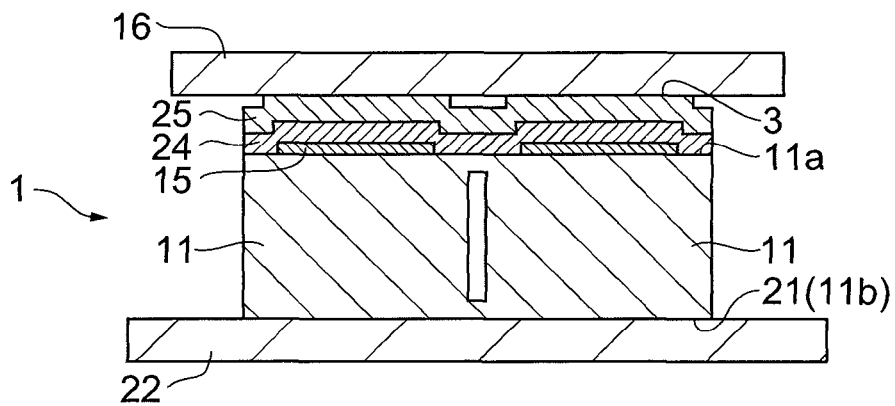
(c)
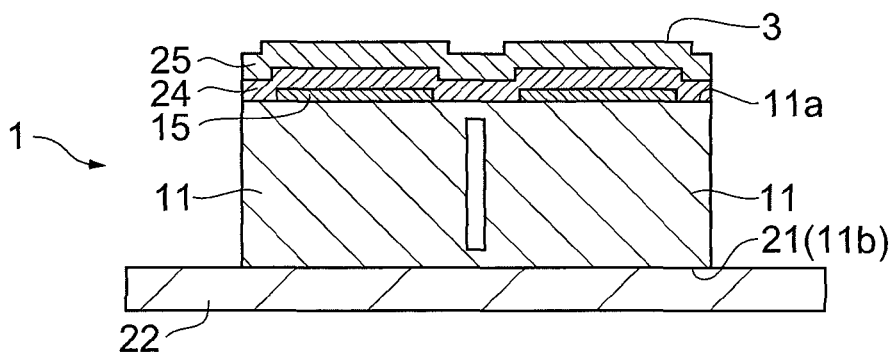

Fig.42
(a)
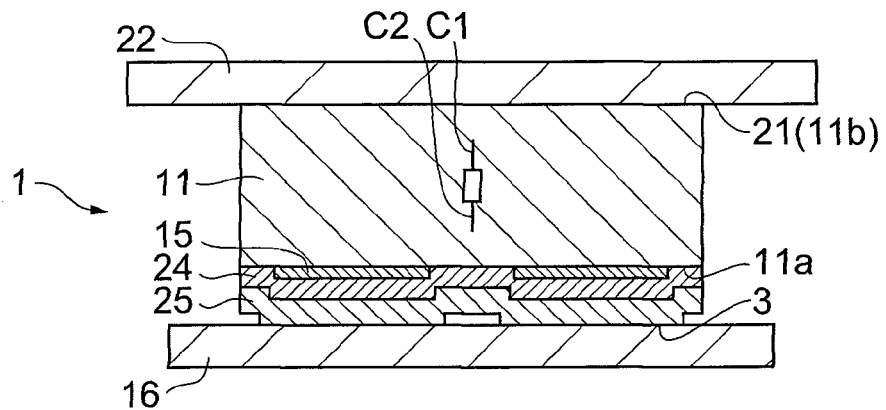
(b)
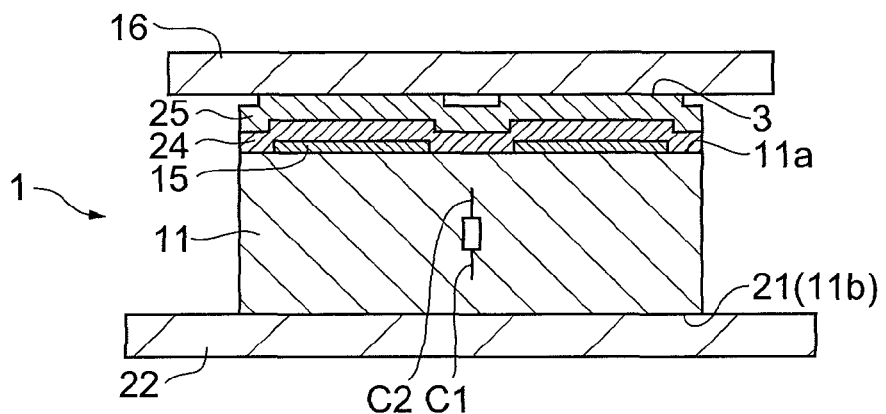
(c)
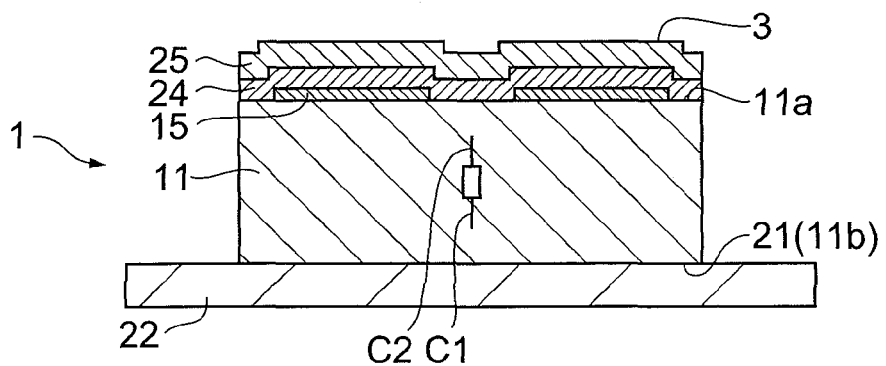

Fig.45
(a)
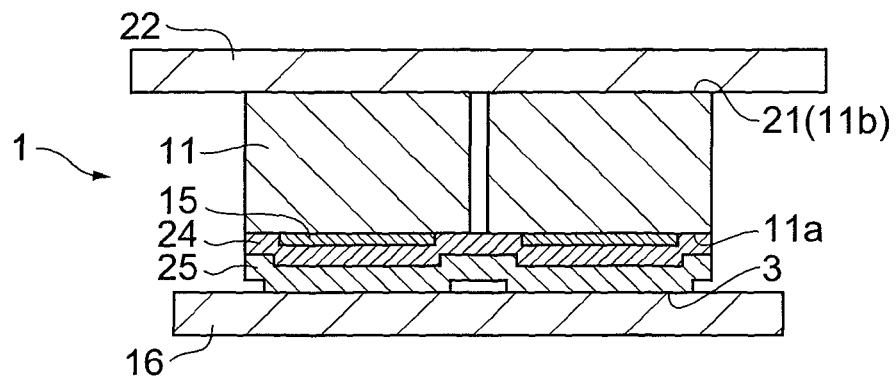
(b)
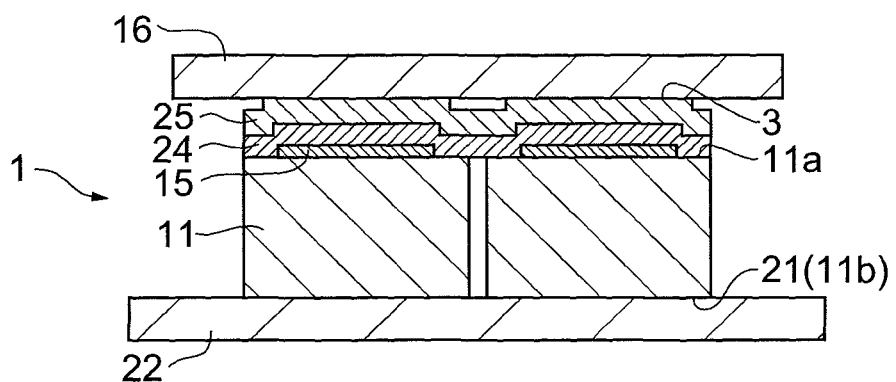
(c)
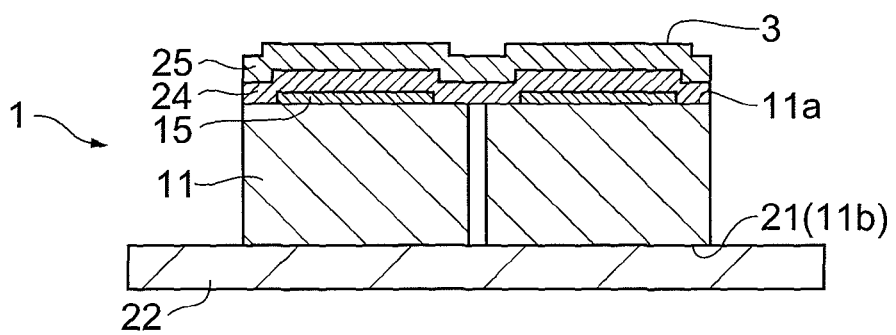

Fig.47
(a)
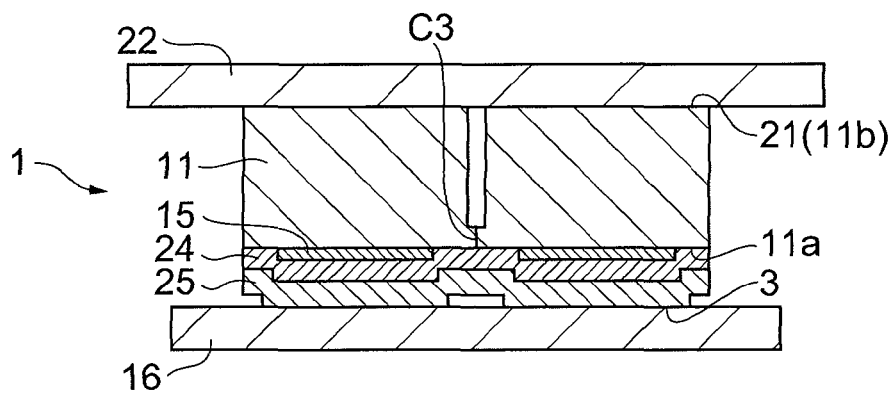
(b)
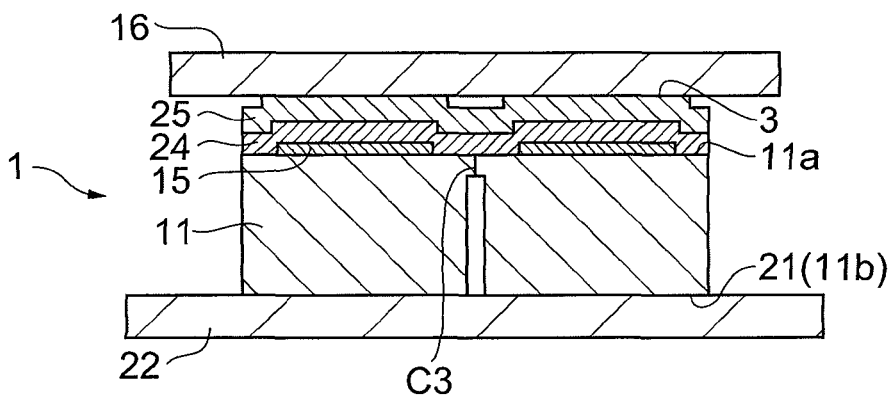
(c)
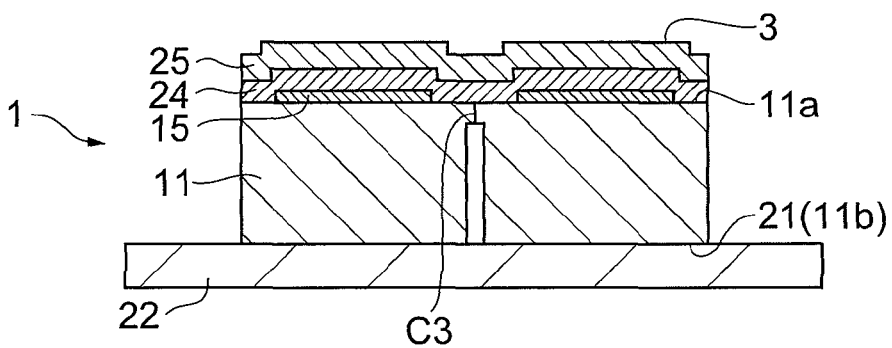

Fig.49
(a)
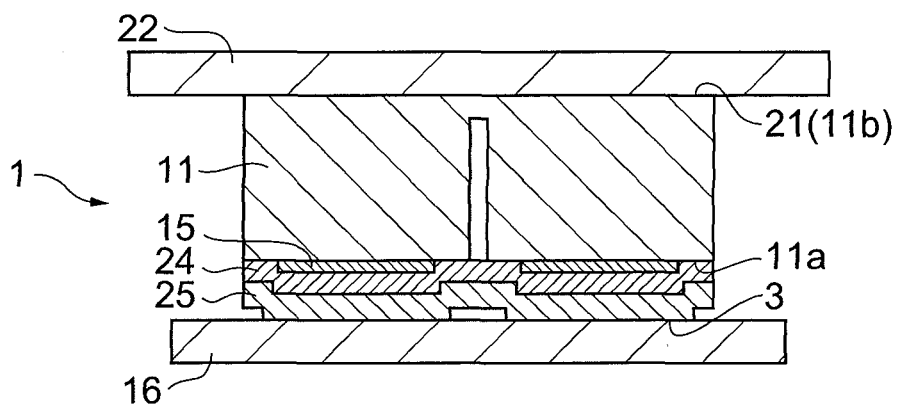
(b)
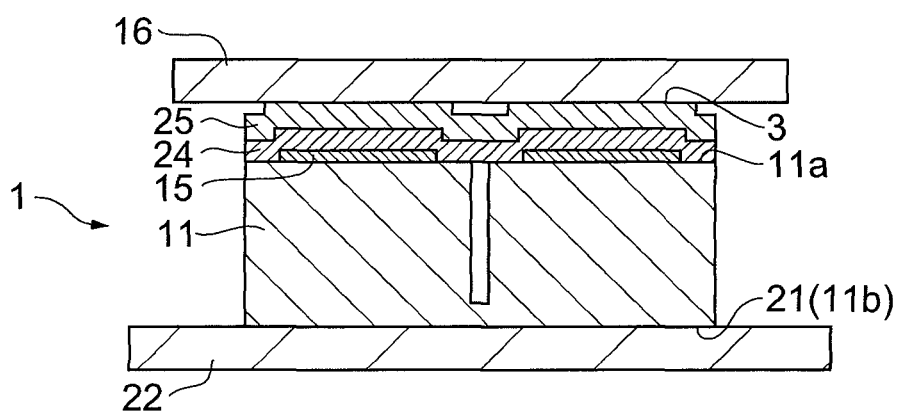
(c)
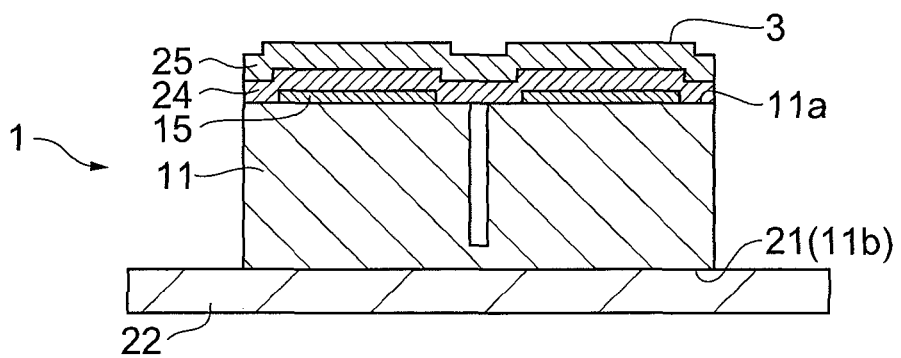

Fig.50
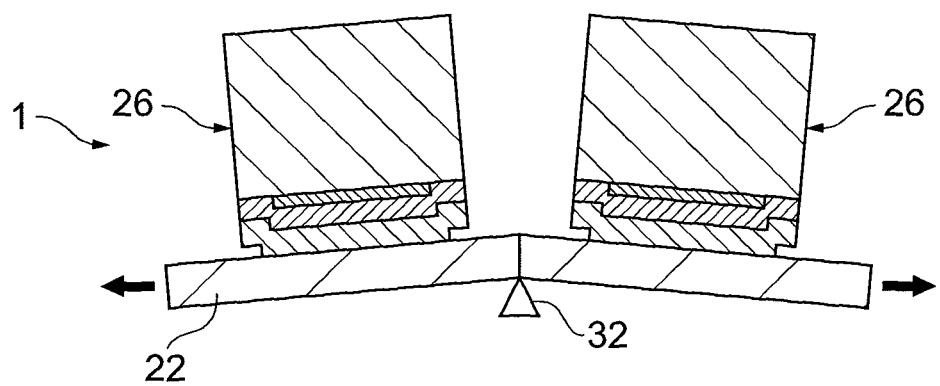
(a)
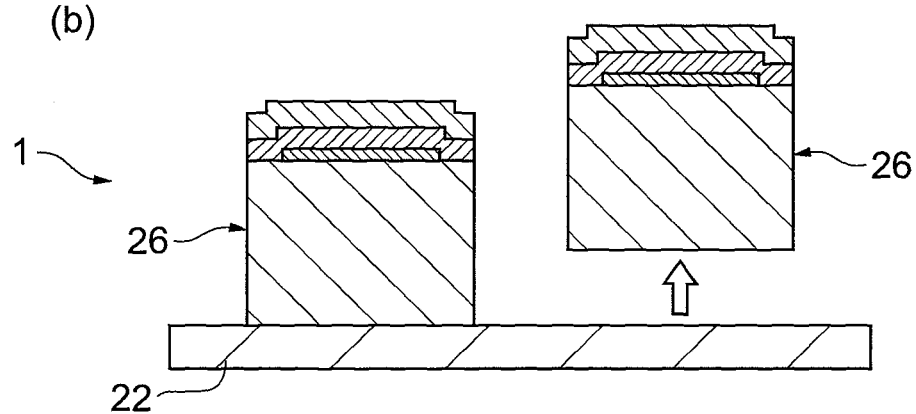
(b)

*Fig.52*
(a)
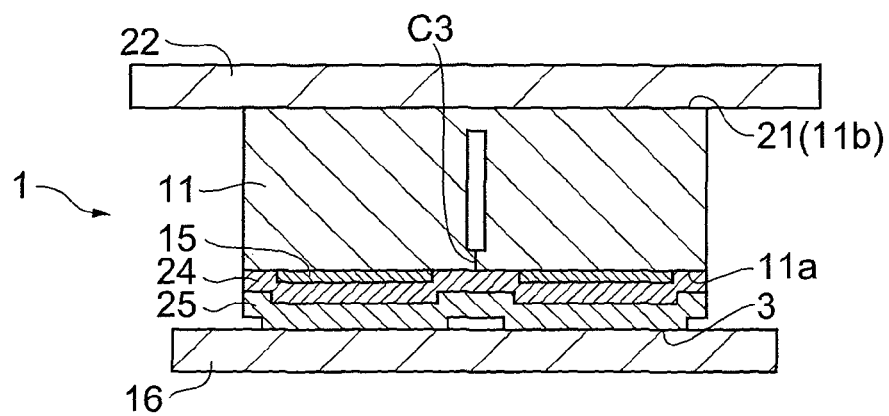
(b)
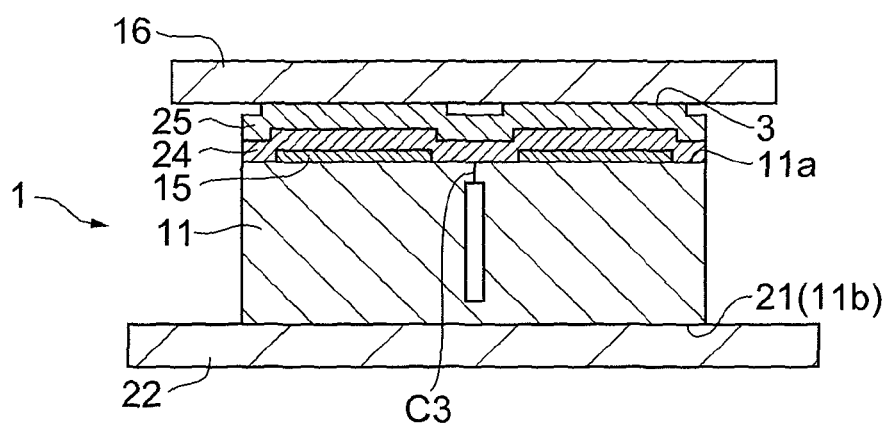
(c)
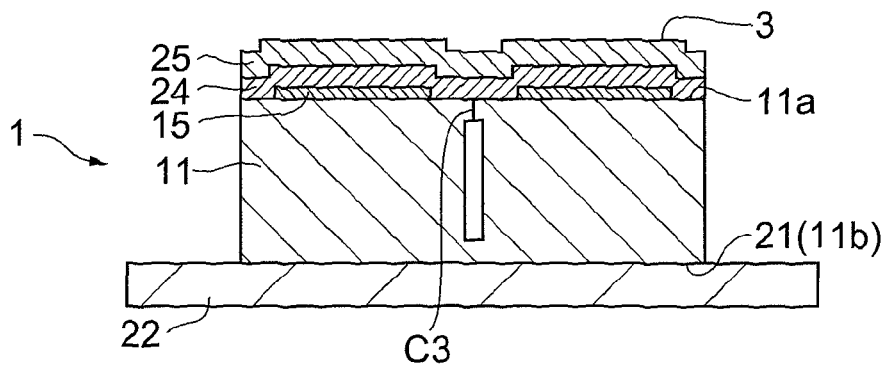

*Fig.55*
(a)
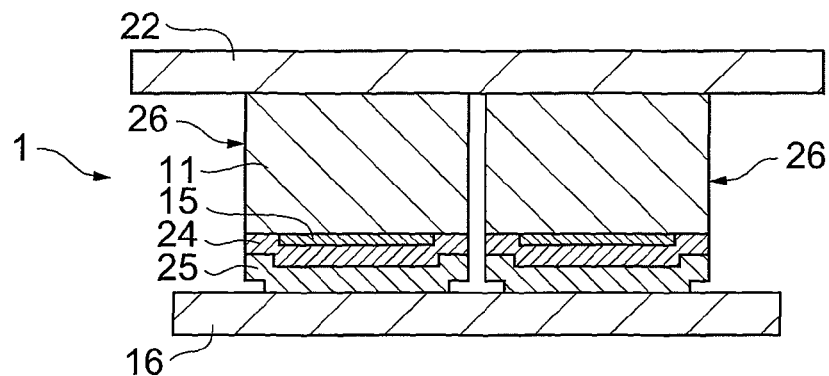
(b)
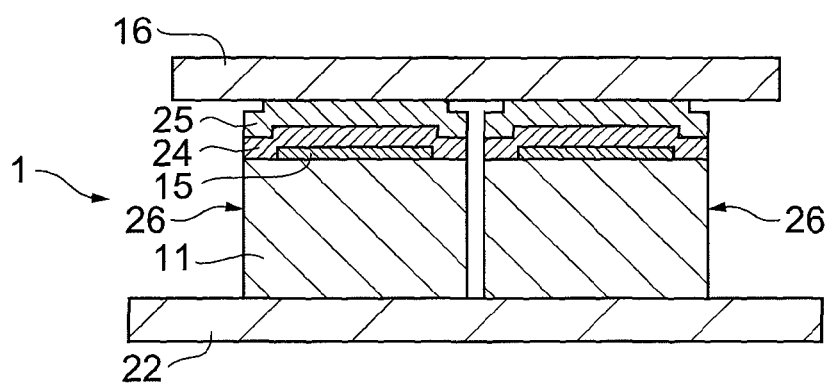
(c)
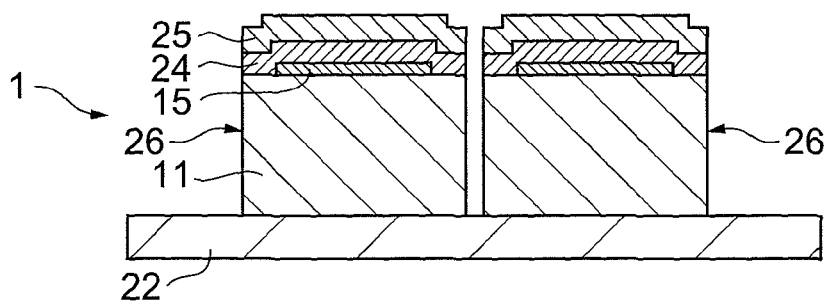

Fig.57
(a)
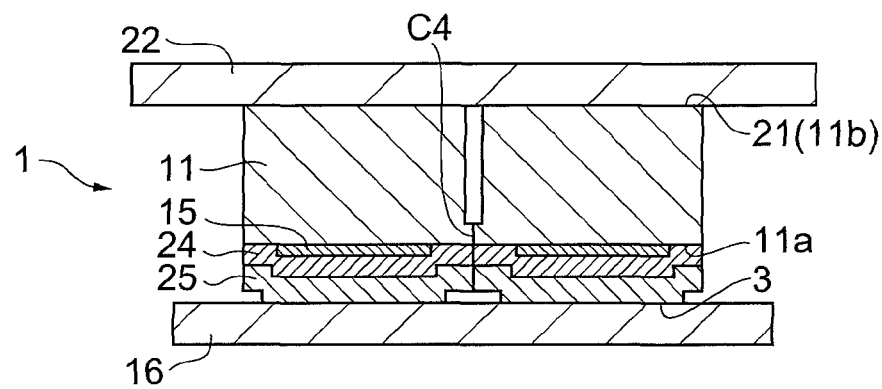
(b)
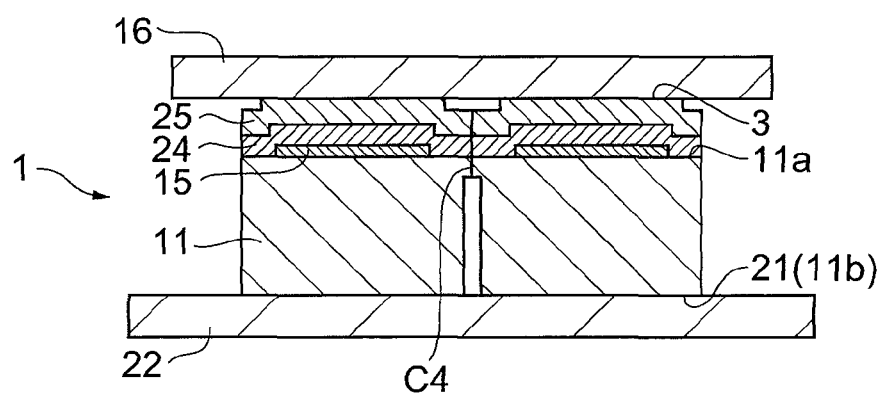
(c)
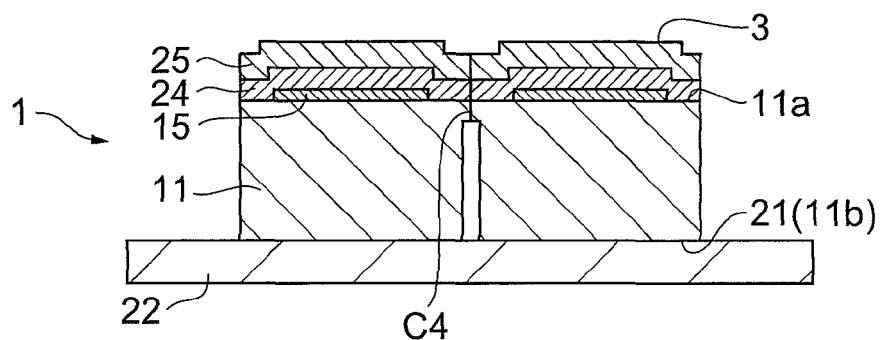

Fig.60
(a)
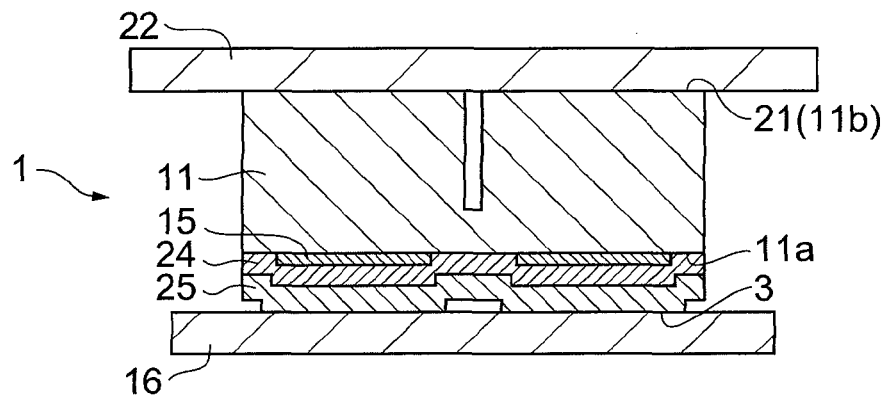
(b)
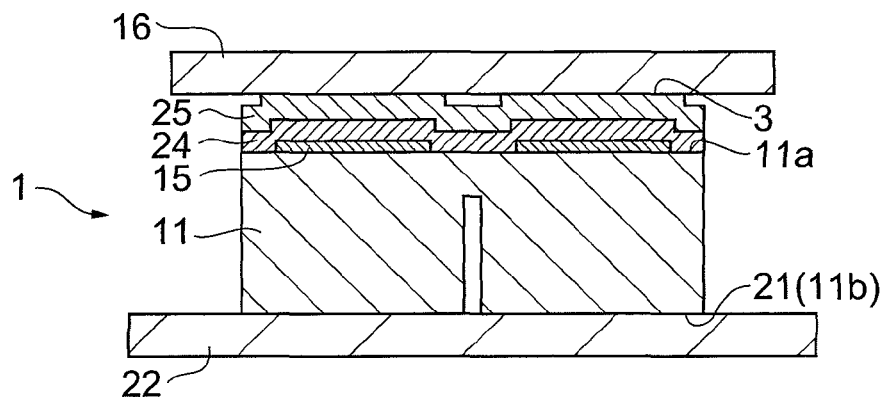
(c)
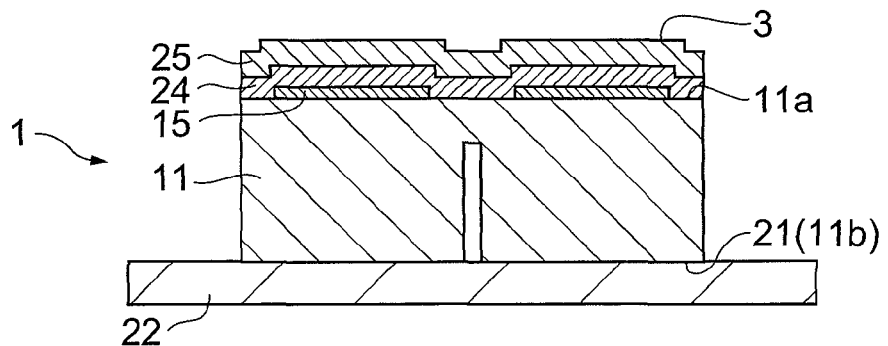

Fig.61
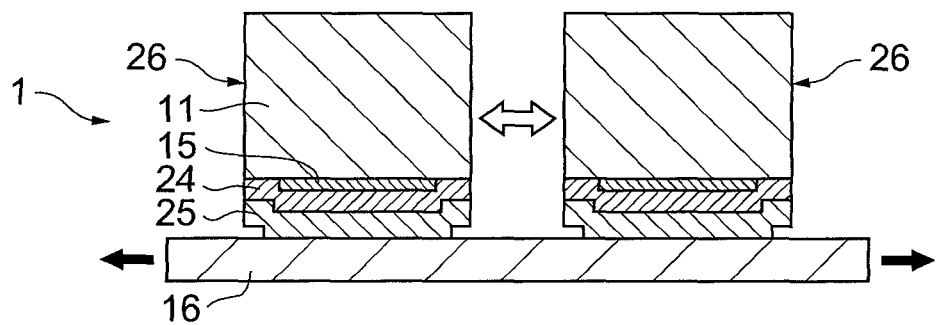
(a)
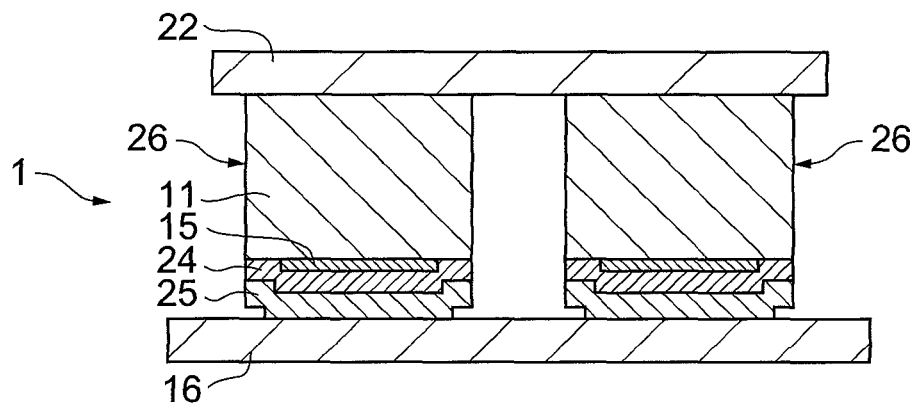
(b)
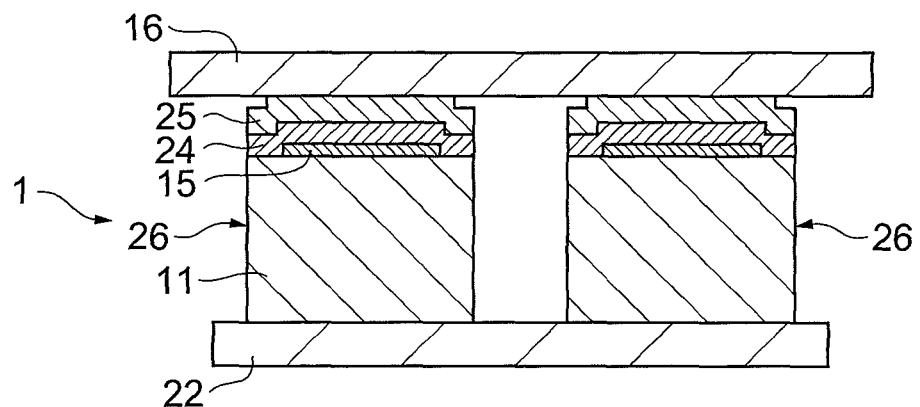
(c)

Fig.62
(a)
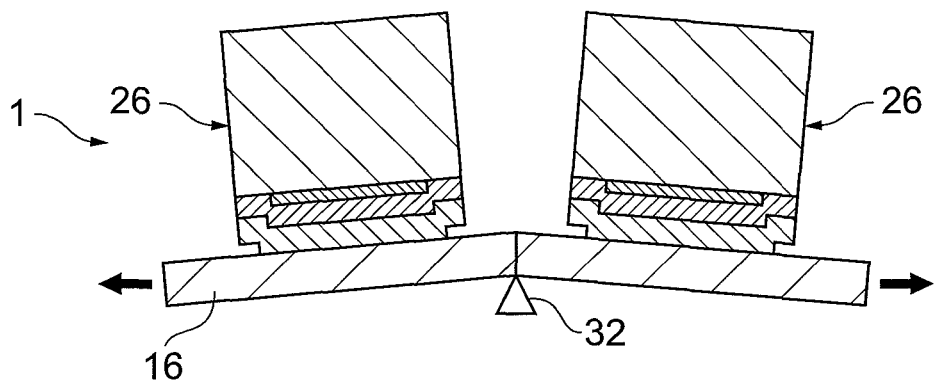
(b)
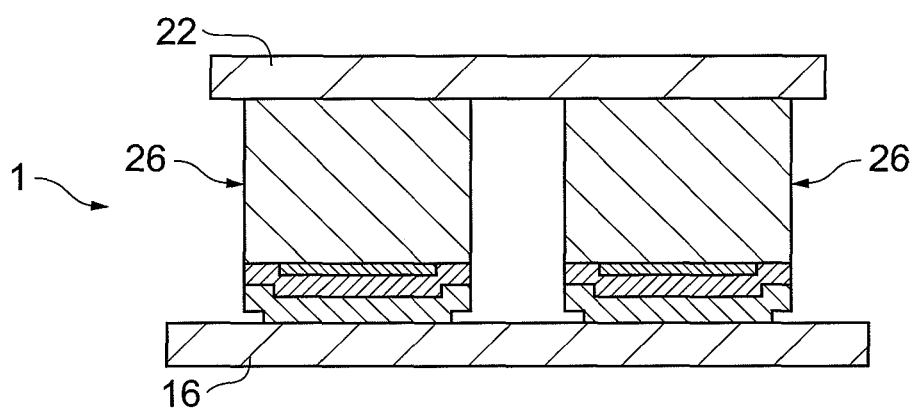
(c)
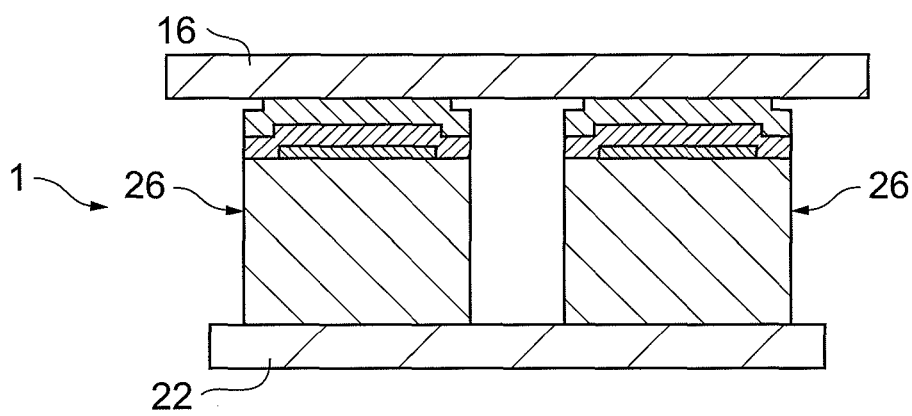

Fig.65
(a)
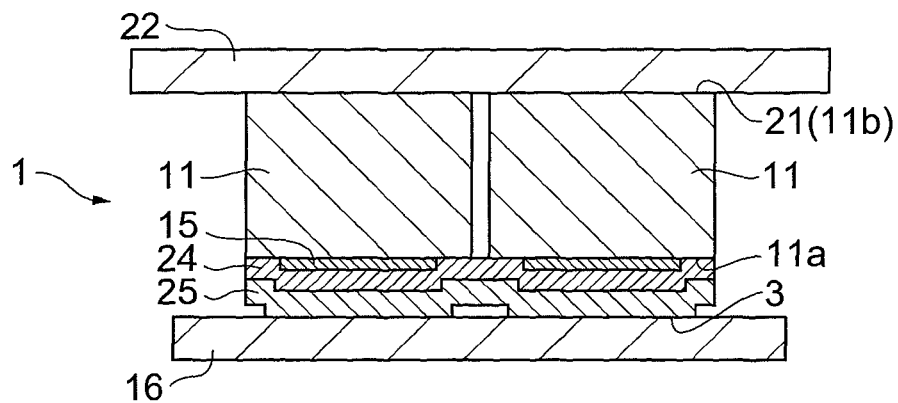
(b)
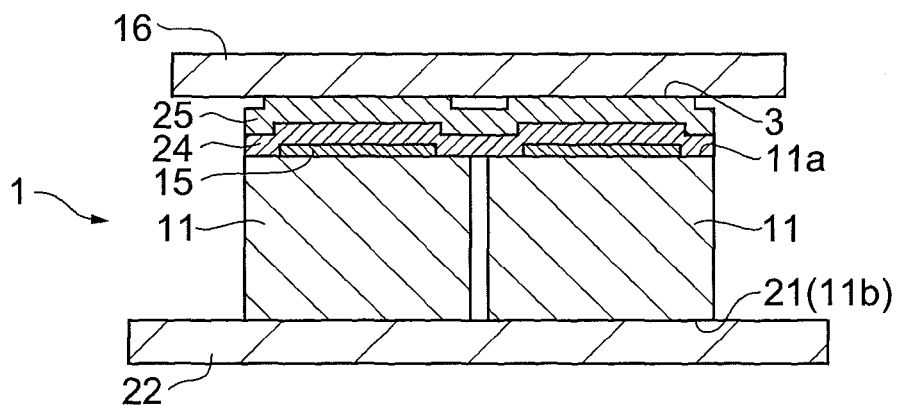
(c)
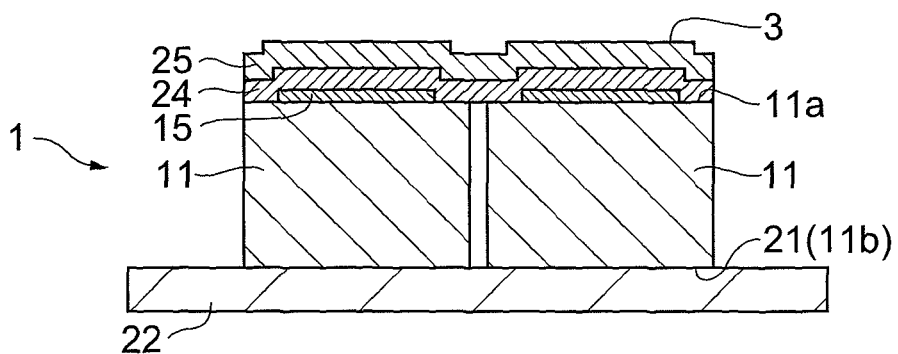

Fig.66
(a)
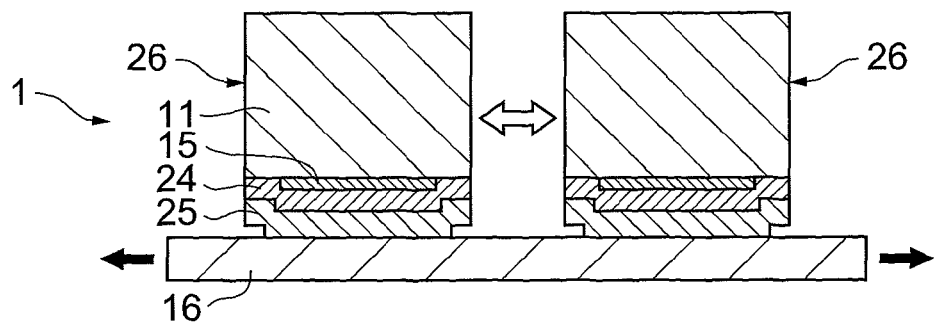
(b)
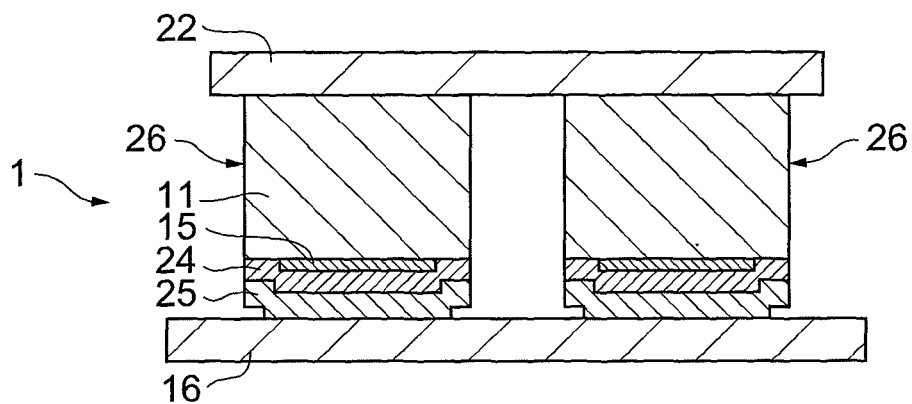
(c)
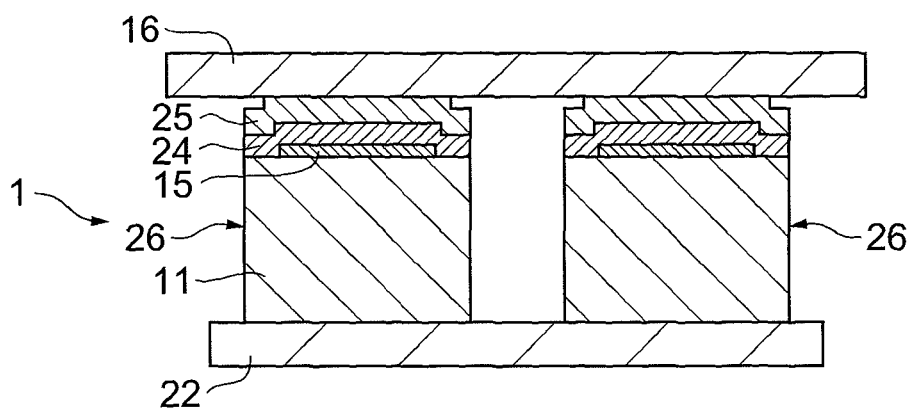

Fig.69
(a)
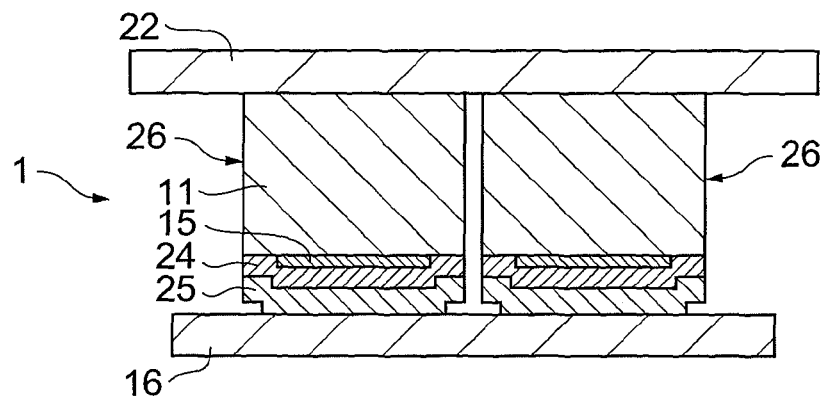
(b)
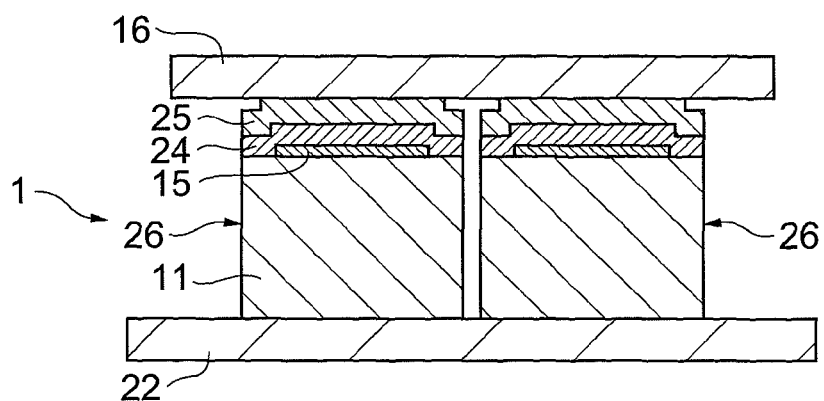
(c)
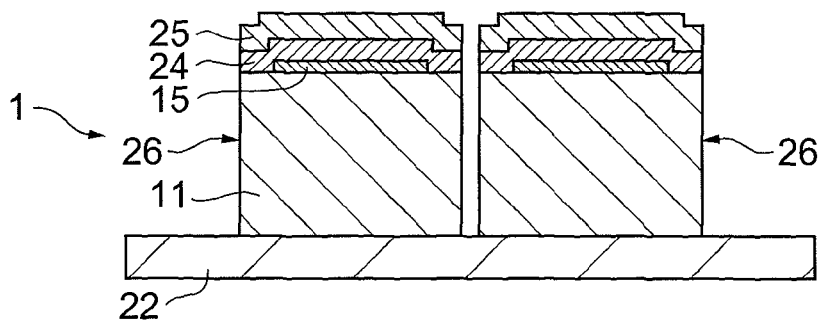

Fig.70
(a)
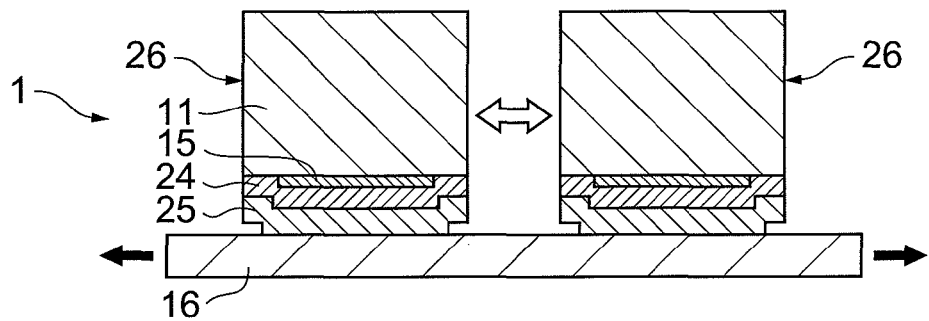
(b)
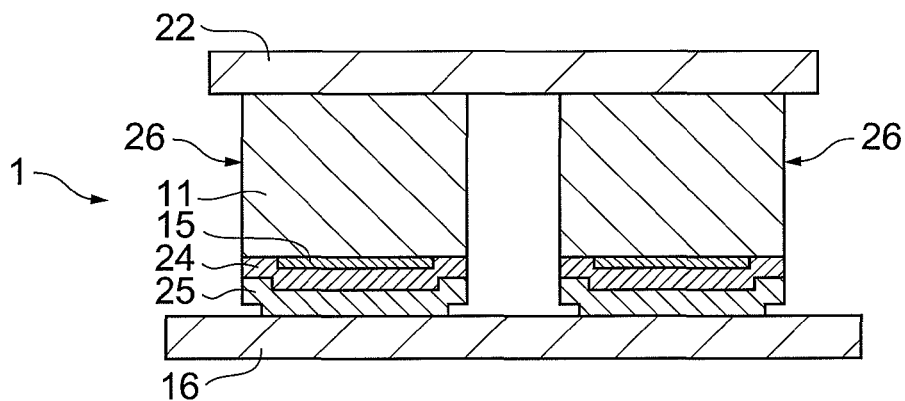
(c)
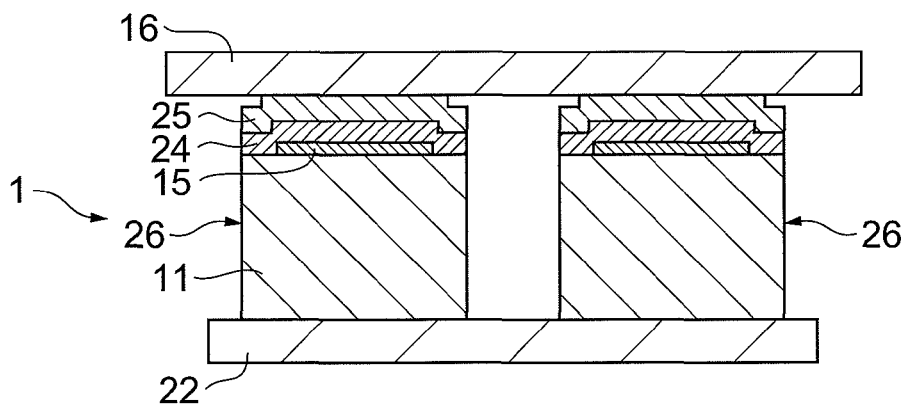

Fig.72
(a)
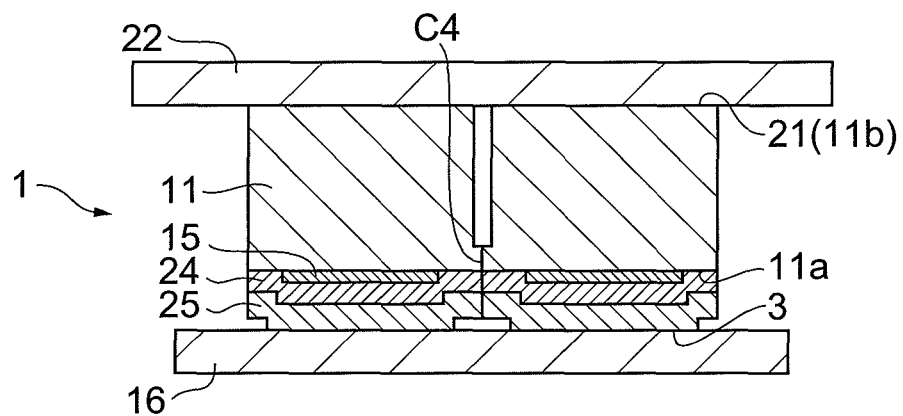
(b)
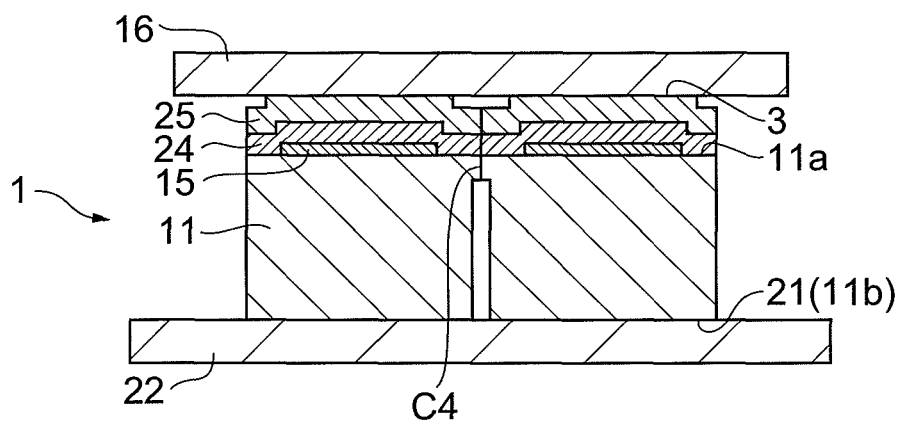
(c)
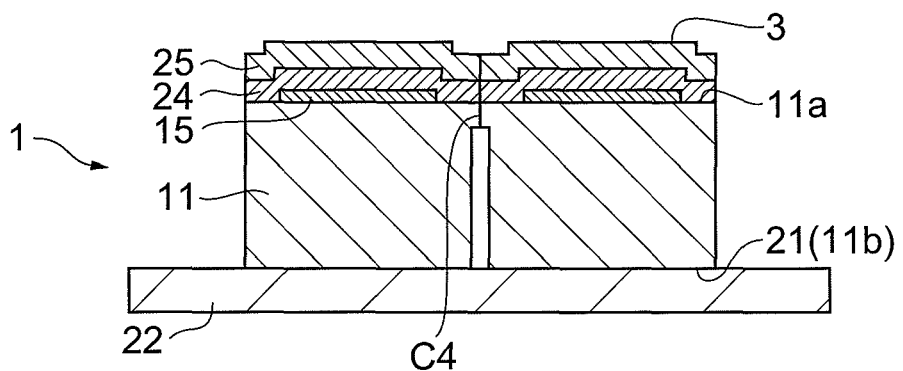

Fig.73
(a)
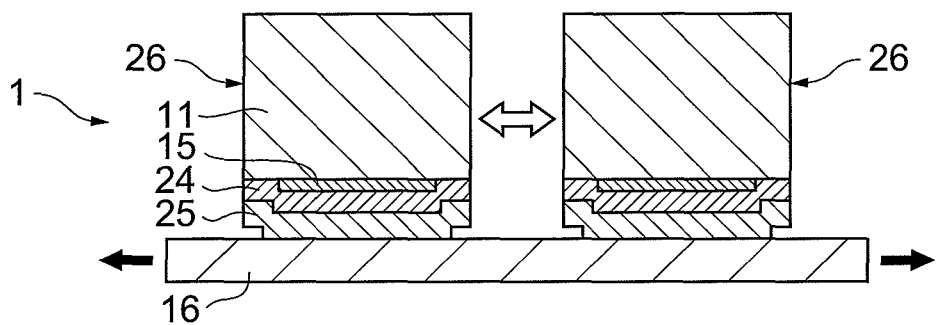
(b)
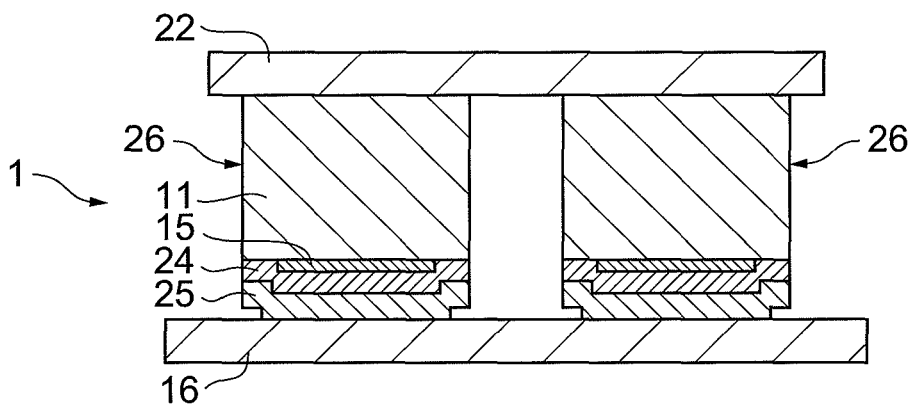
(c)
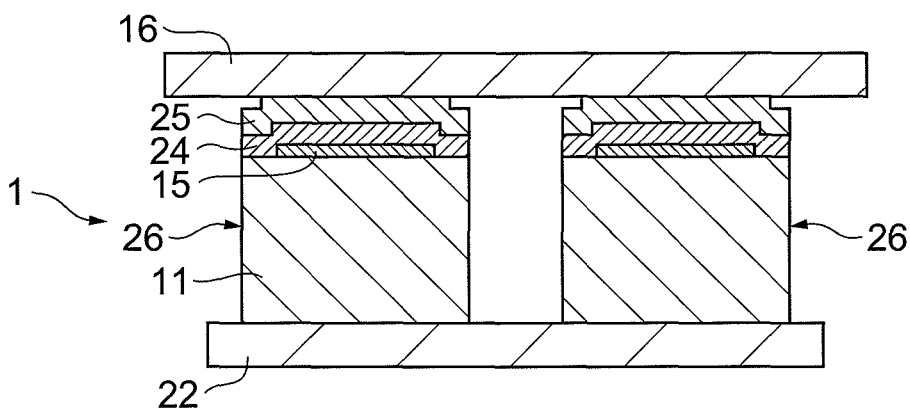

Fig.76
(a)
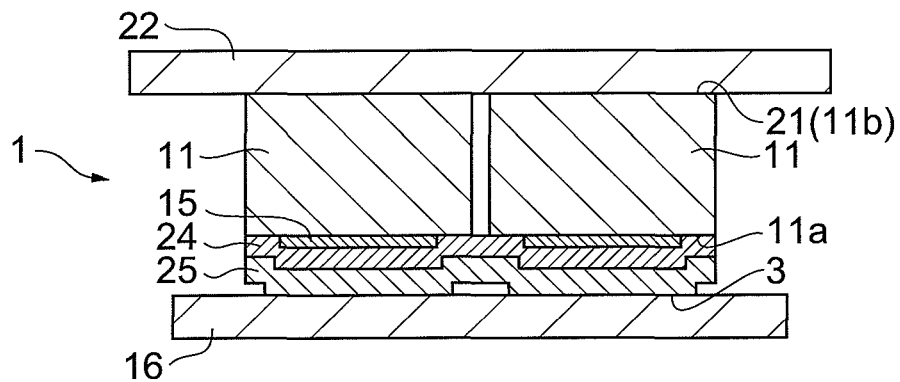
(b)
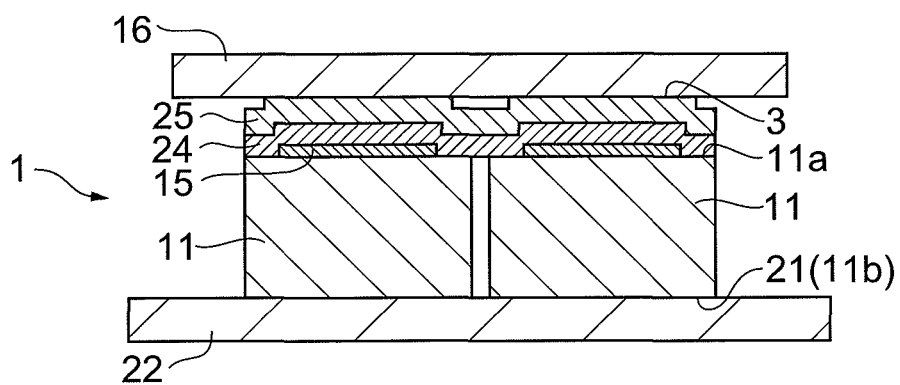
(c)
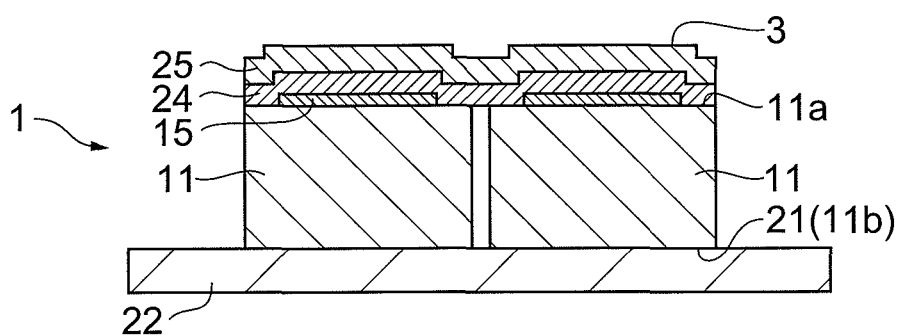

Fig.78
(a)
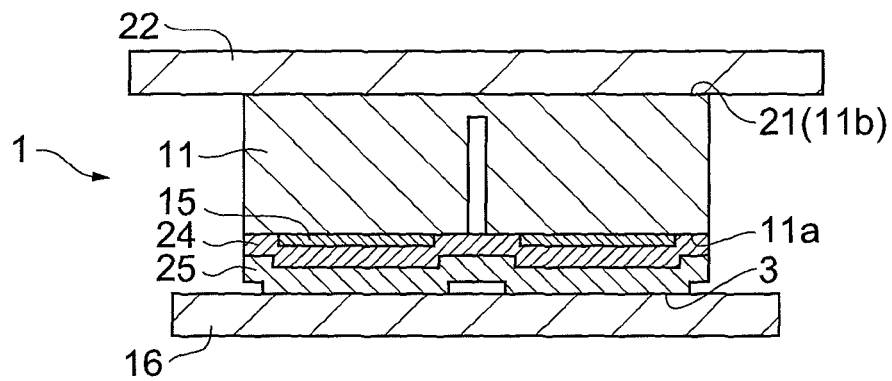
(b)
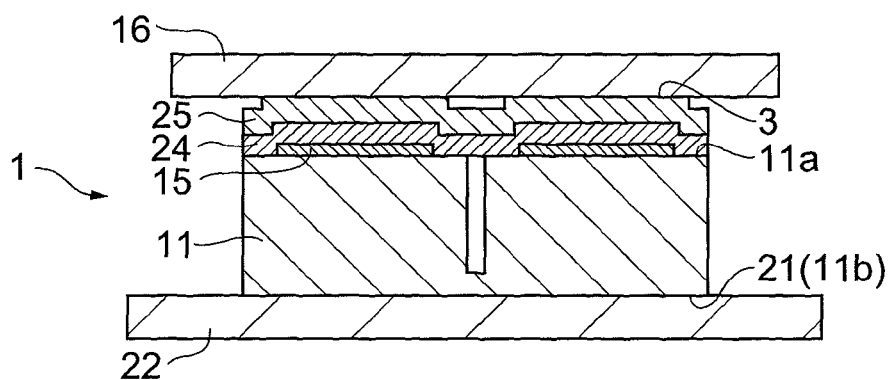
(c)
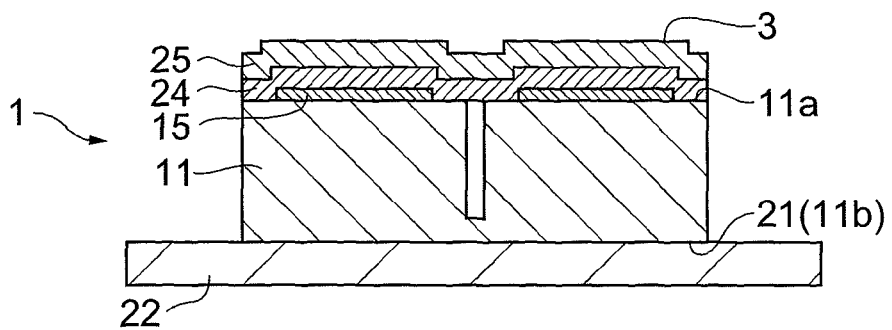

Fig.81
(a)
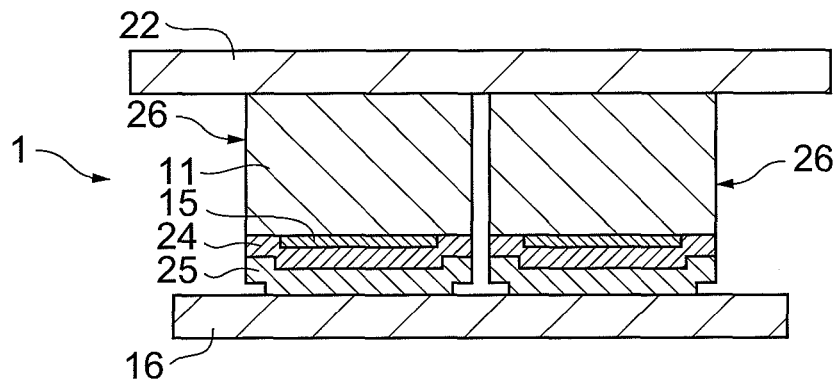
(b)
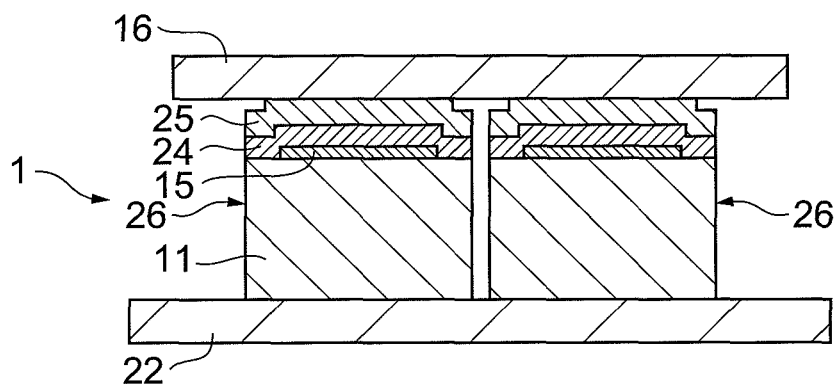
(c)
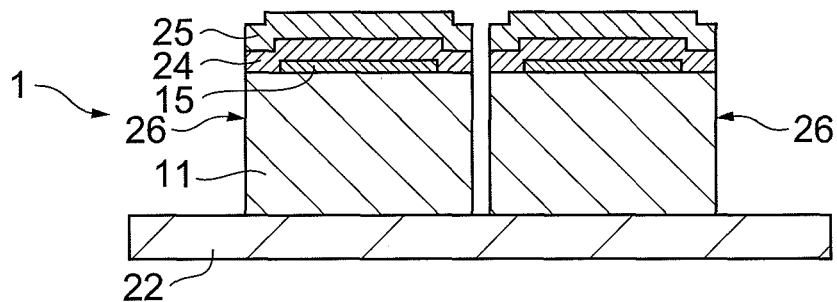

Fig.83
(a)
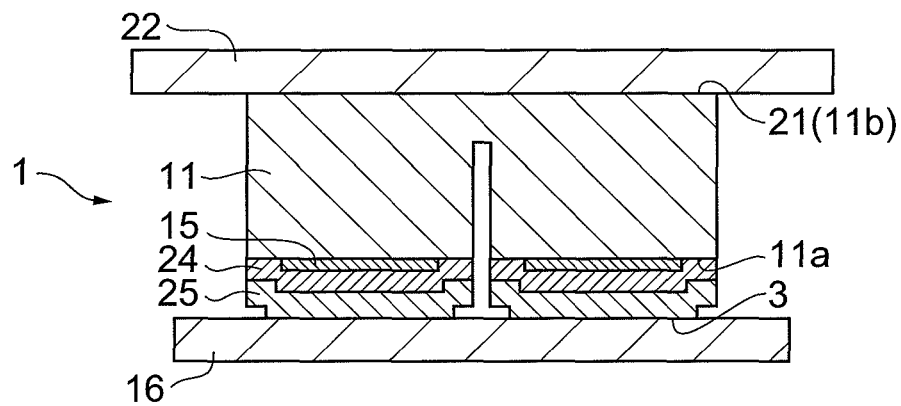
(b)
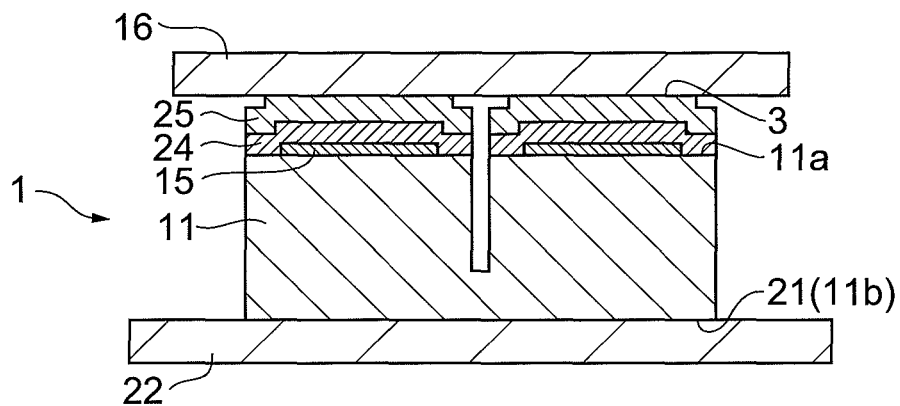
(c)
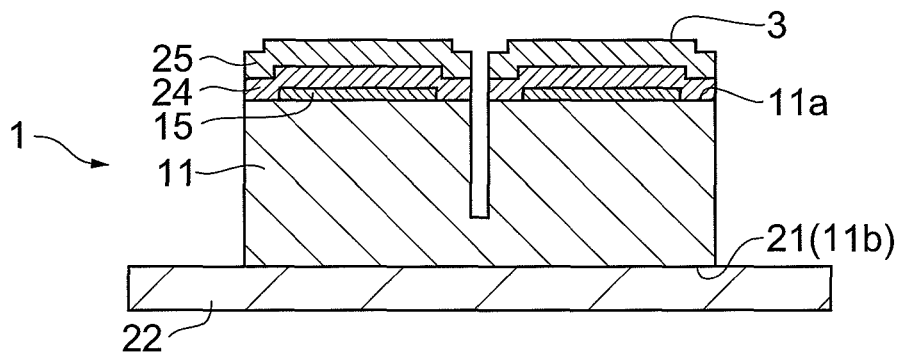

Fig.86
(a)
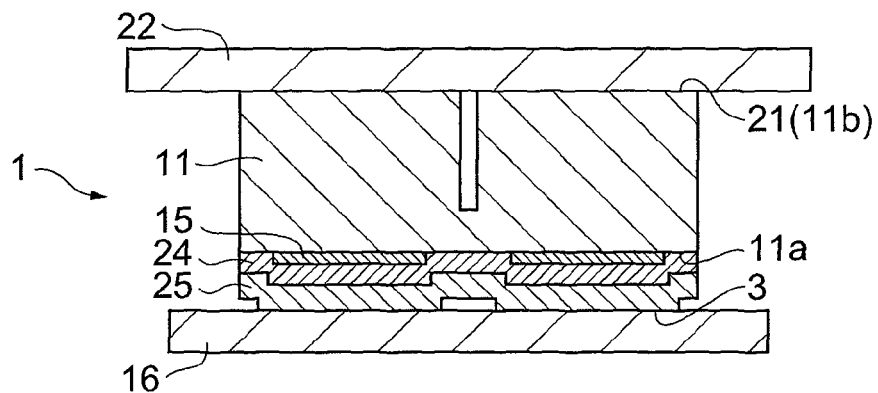
(b)
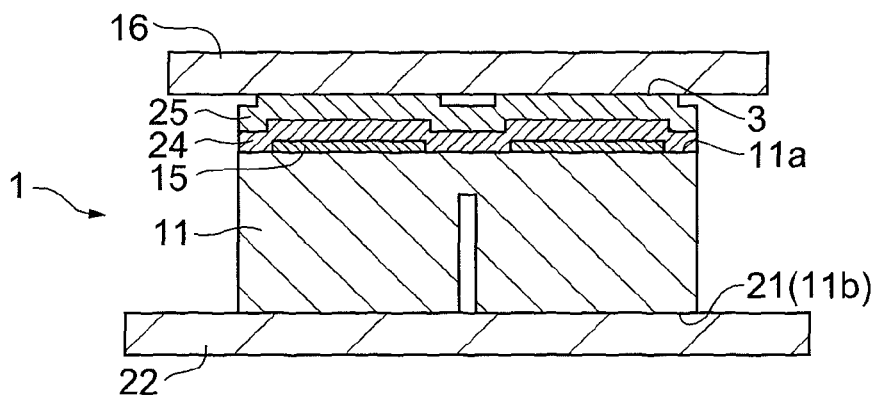
(c)
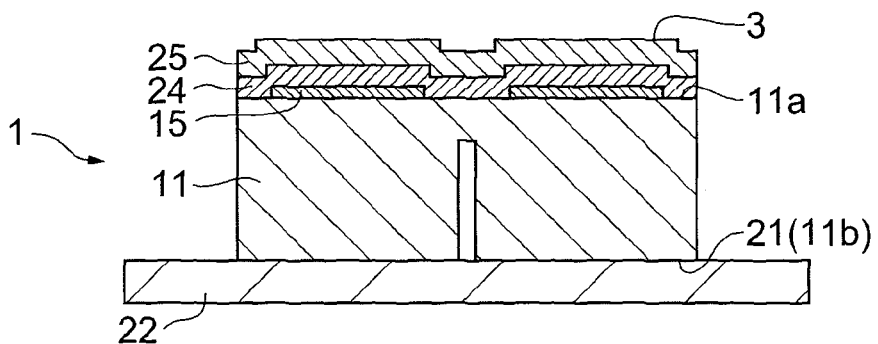

Fig.87
(a)
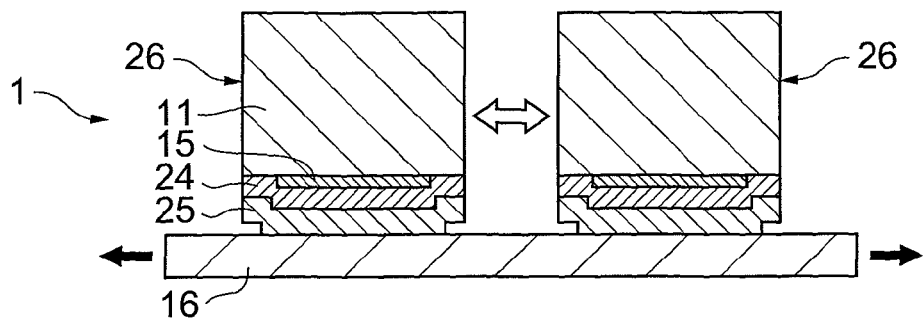
(b)
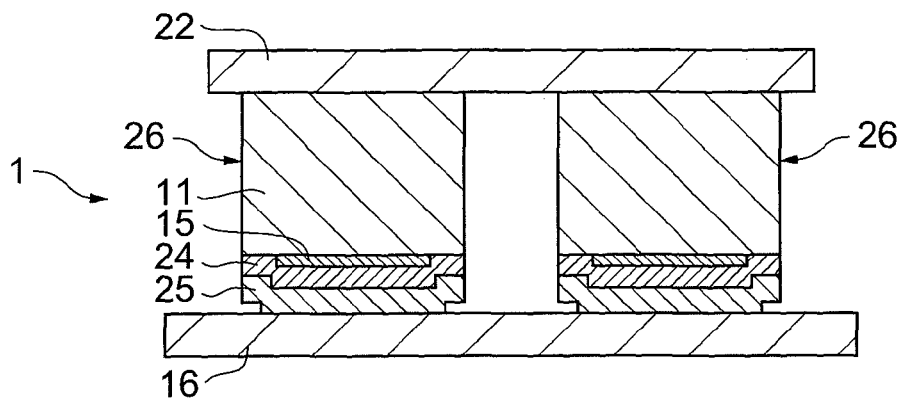
(c)
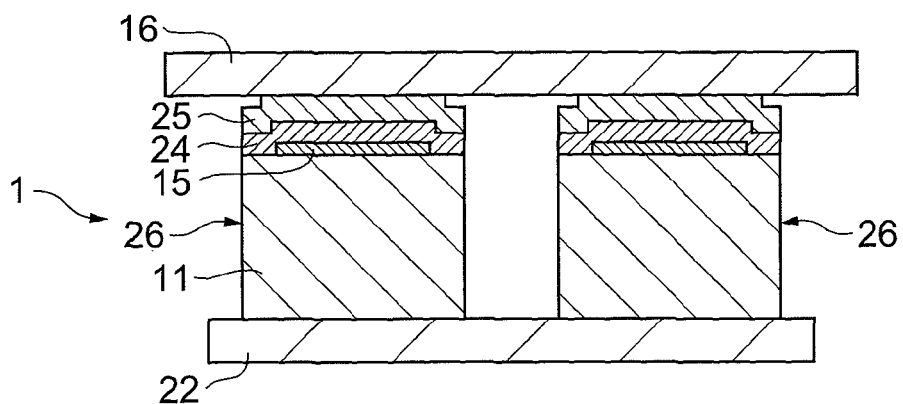

Fig.88
(a)
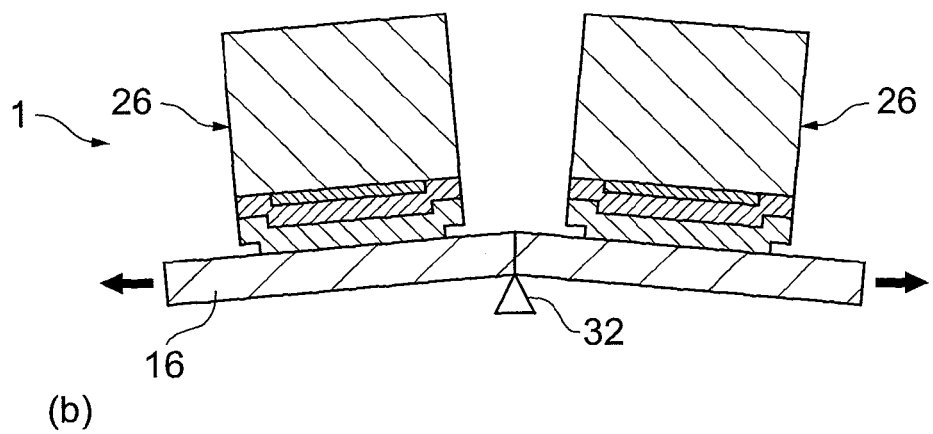
(b)
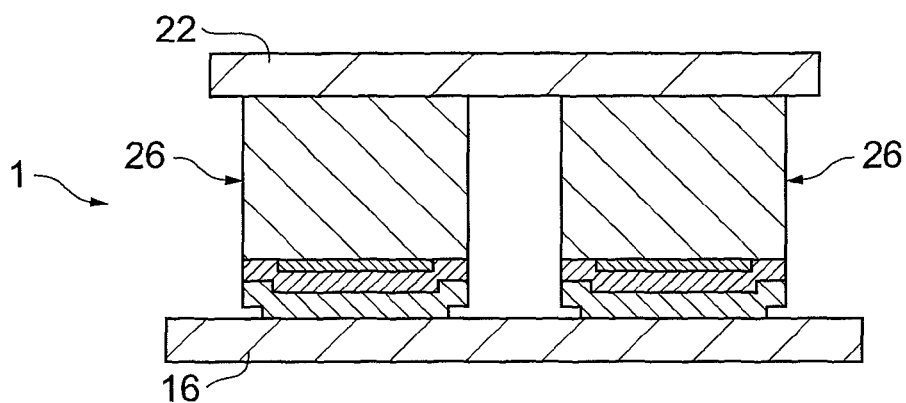
(c)
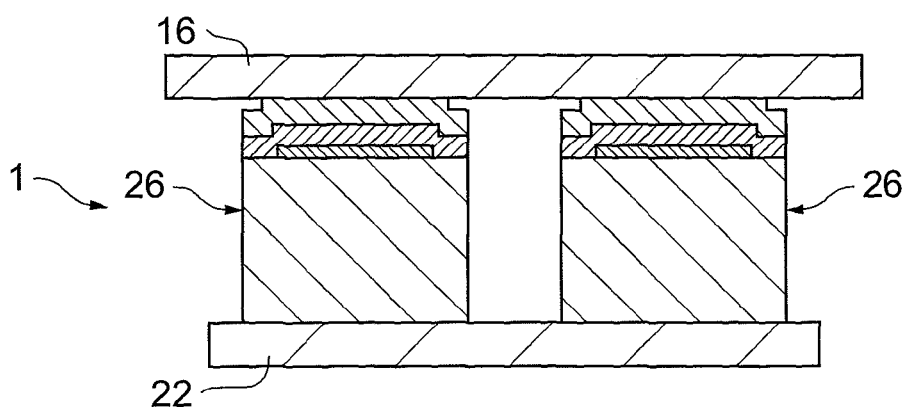

Fig.91
(a)
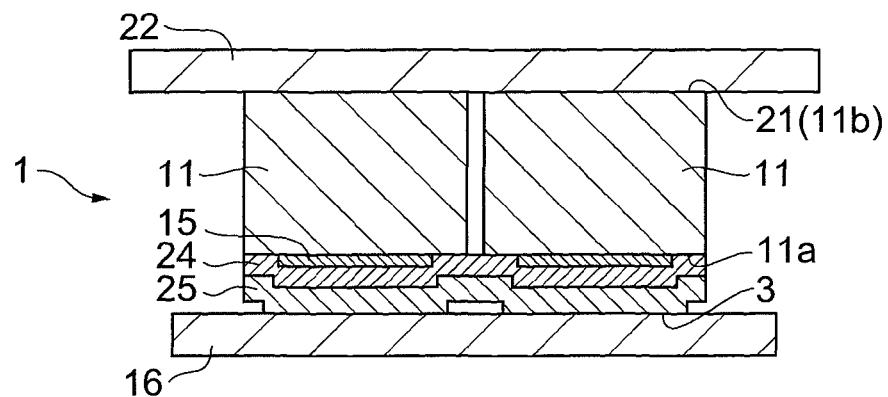
(b)
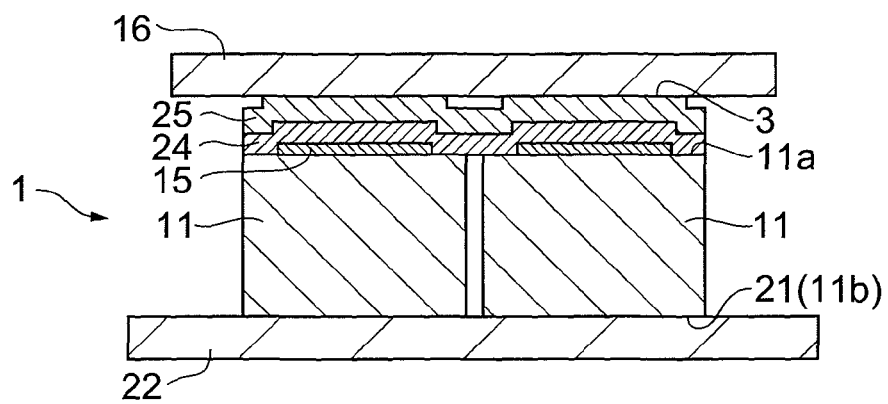
(c)
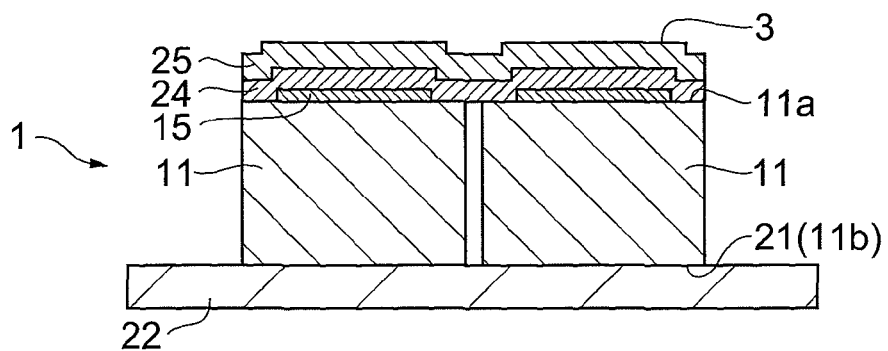

*Fig.92*
(a)
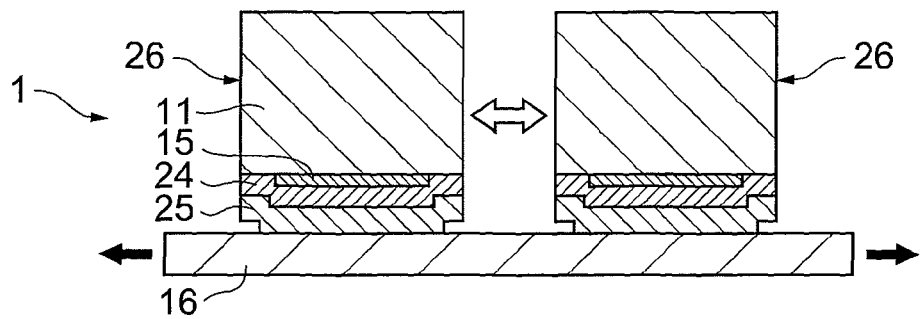
(b)
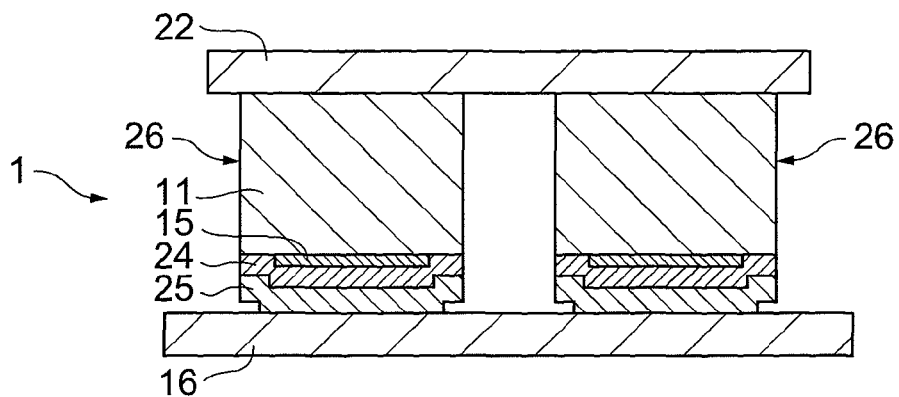
(c)
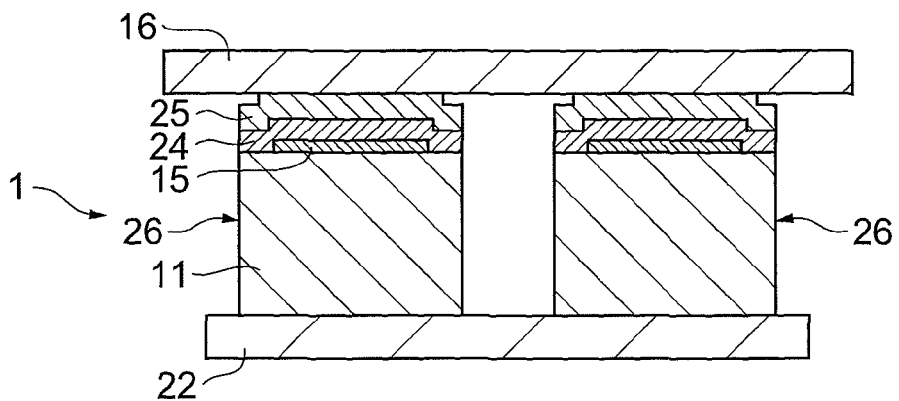

Fig.95
(a)
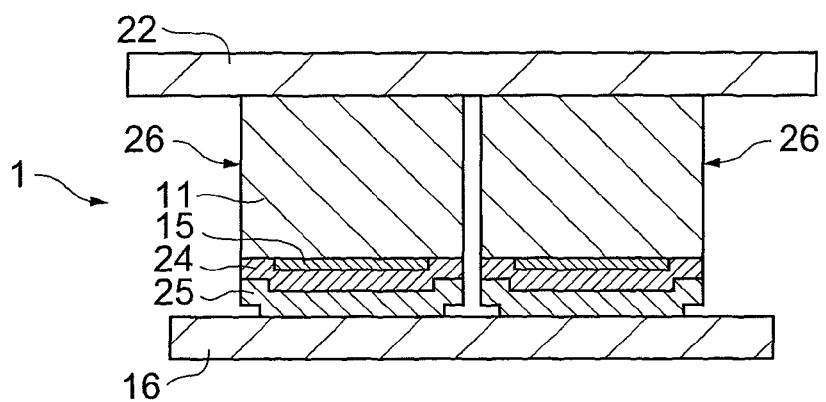
(b)
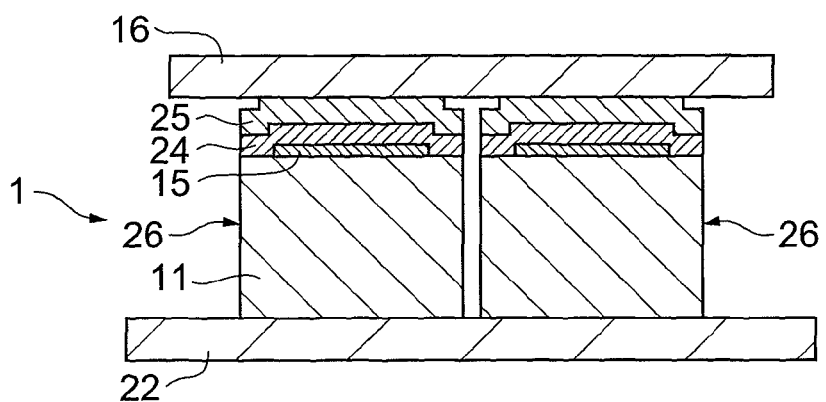
(c)
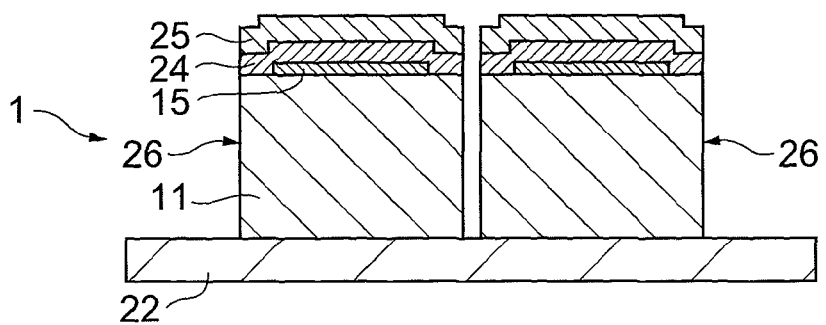

Fig.96
(a)
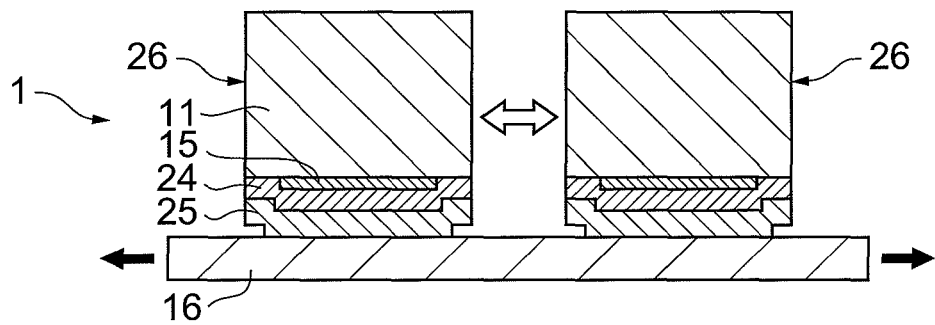
(b)
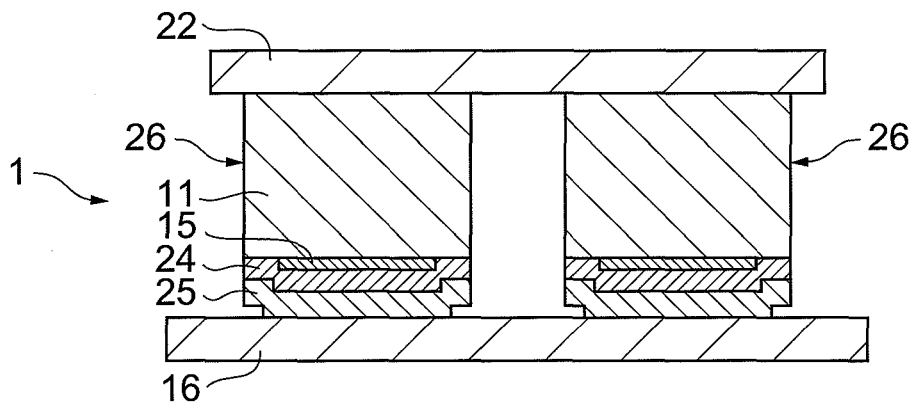
(c)
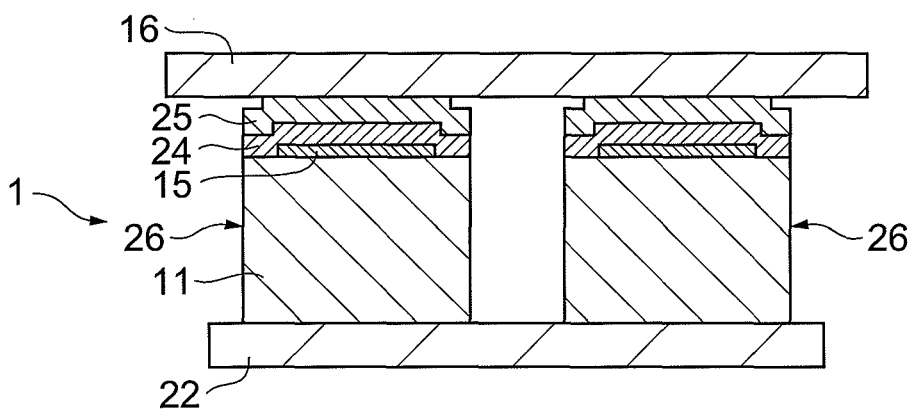

Fig.99
(a)
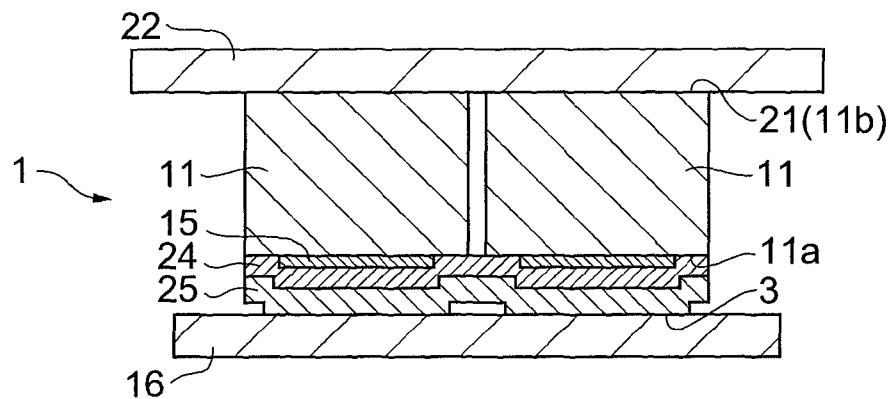
(b)
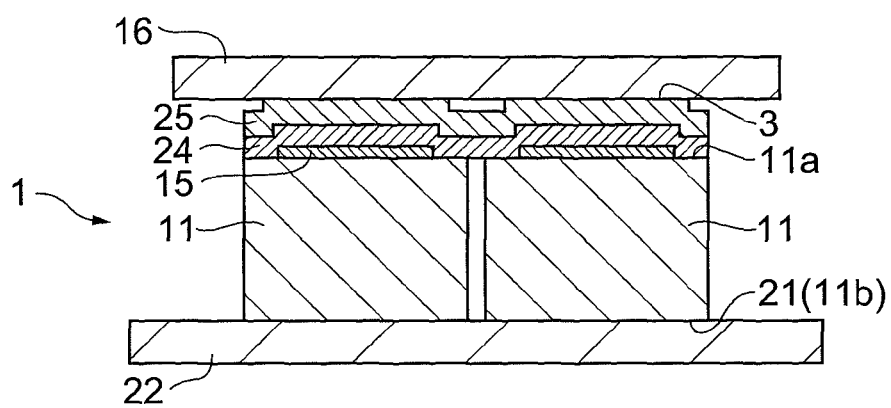
(c)
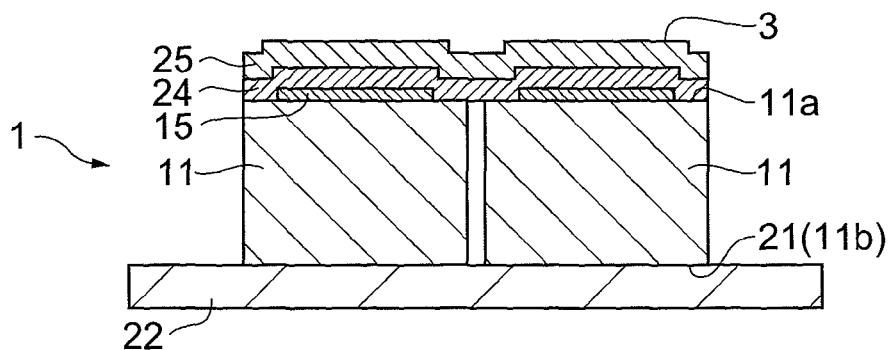

Fig.100
(a)
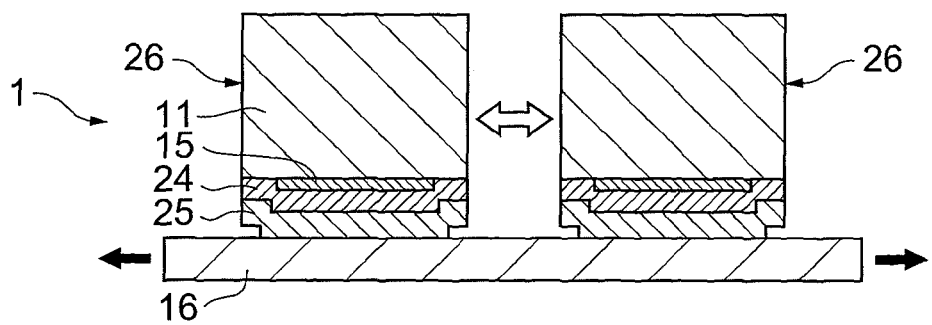
(b)
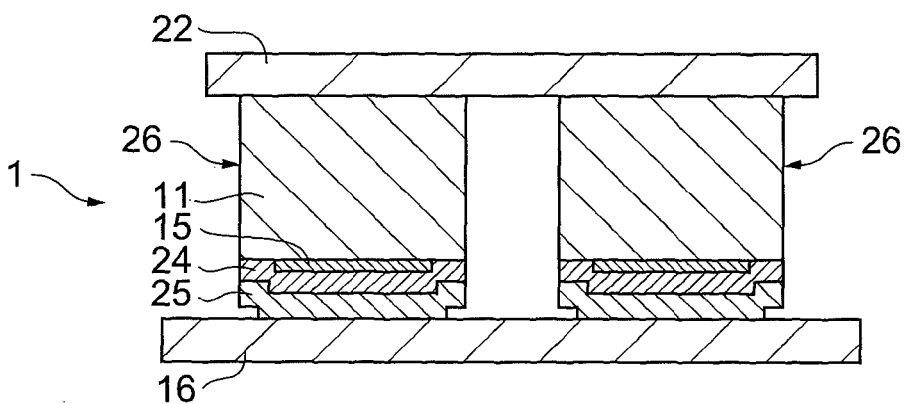
(c)
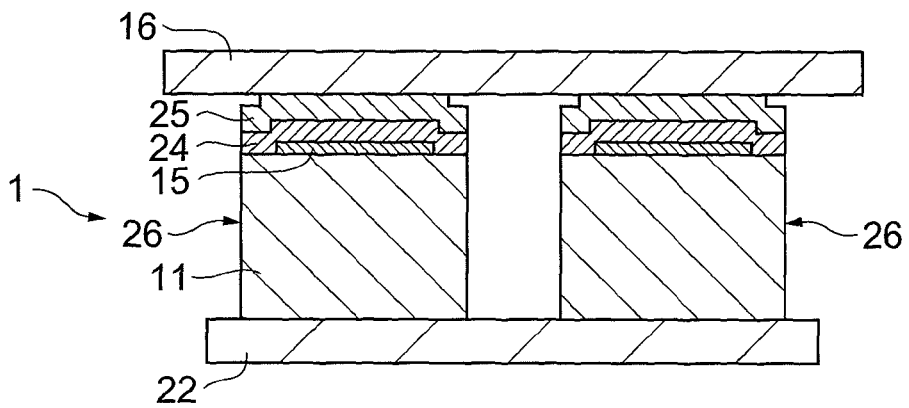

Fig.102
(a)
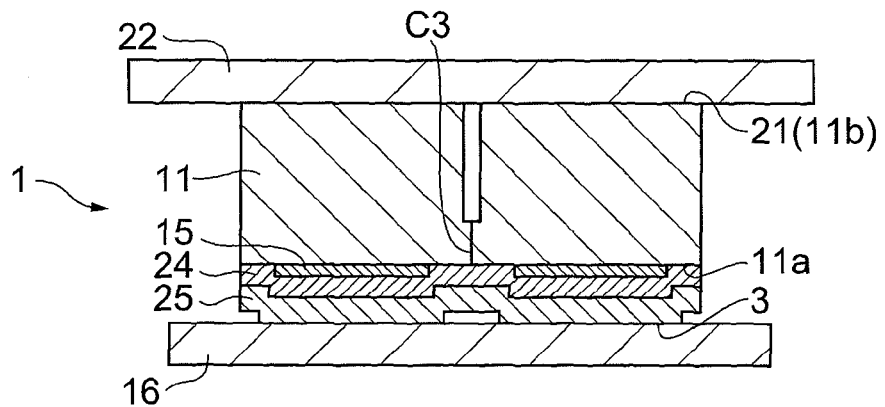
(b)
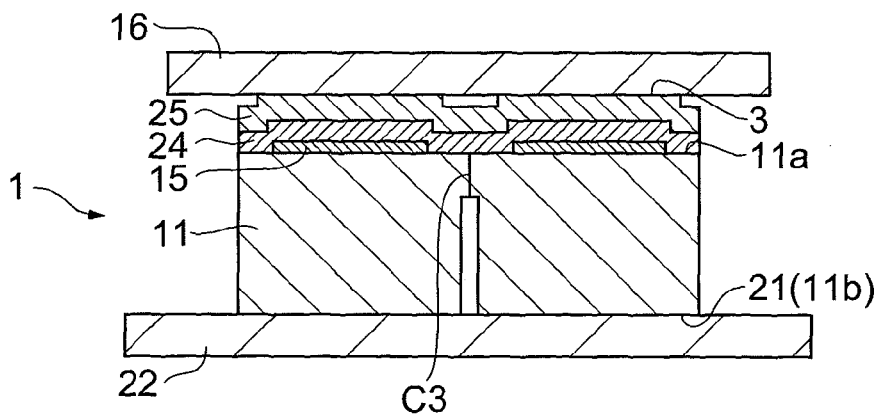
(c)
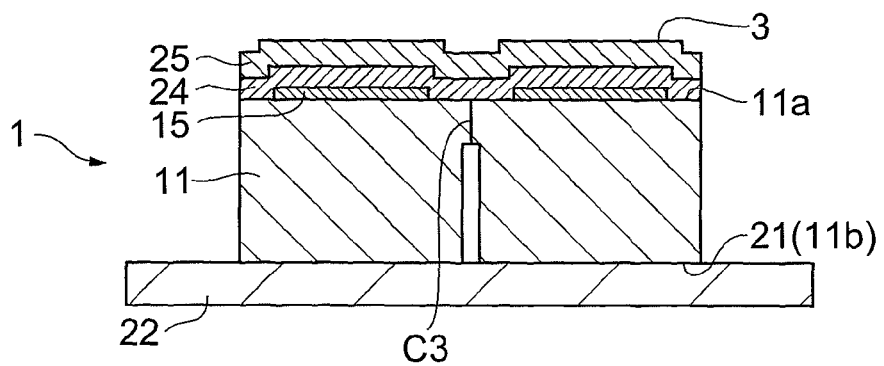

Fig.105
(a)
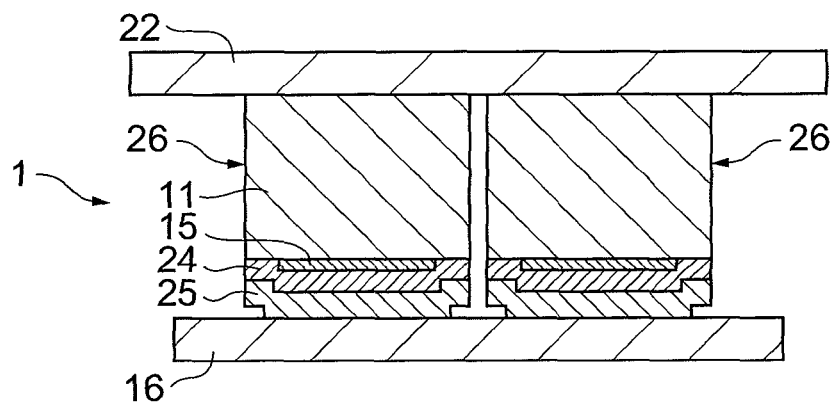
(b)
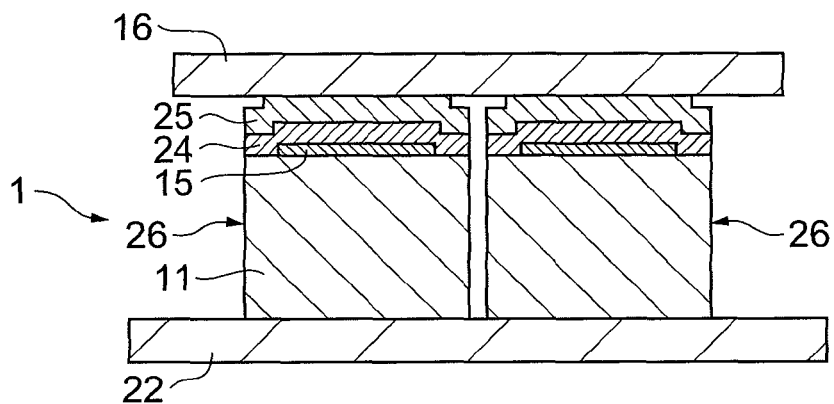
(c)
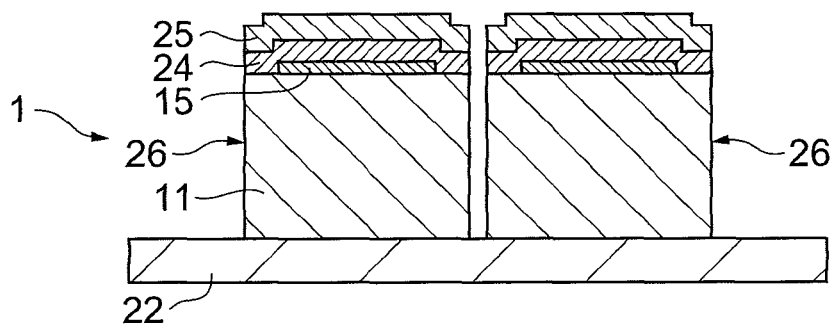

Fig.106
(a)
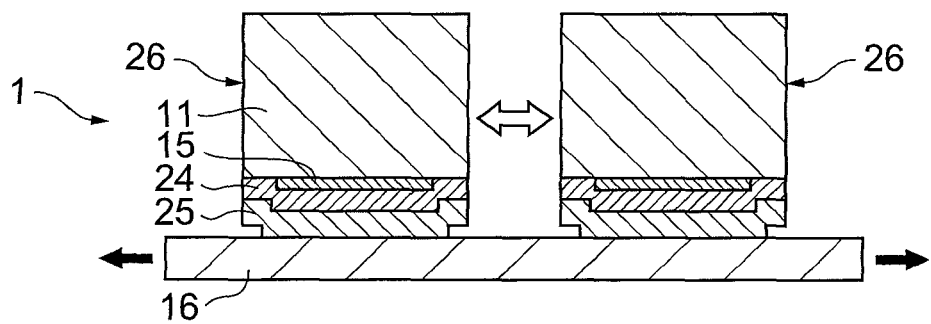
(b)
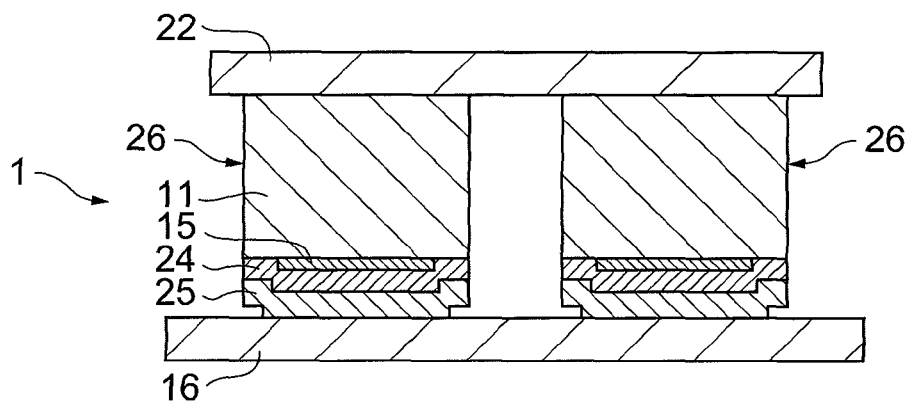
(c)
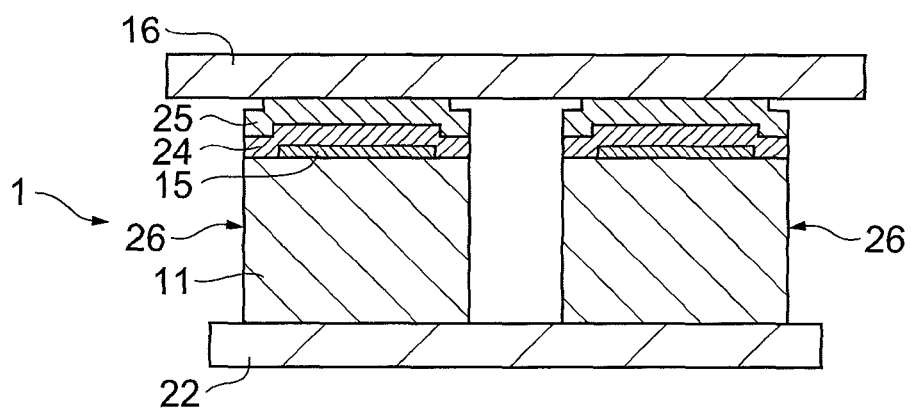

Fig.108
(a)
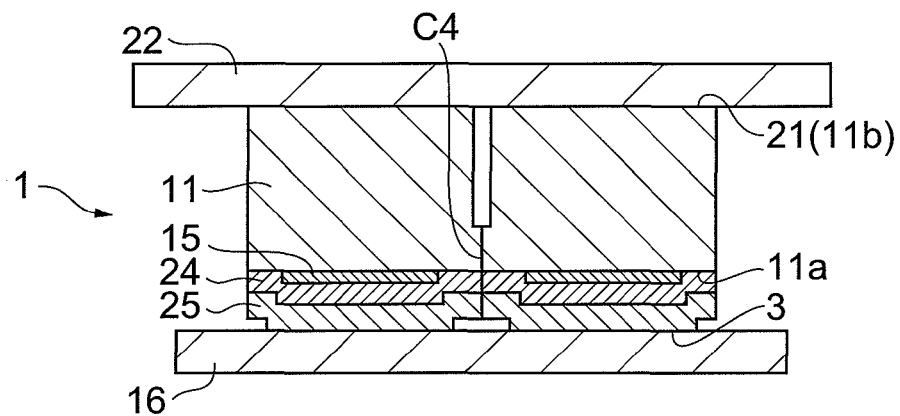
(b)
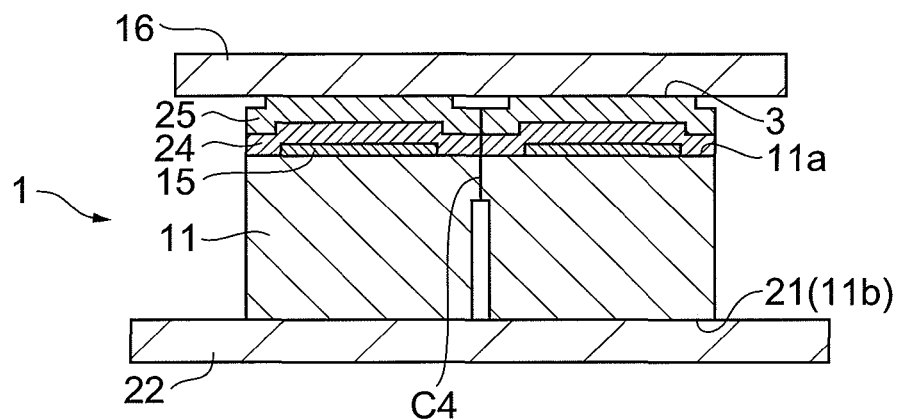
(c)
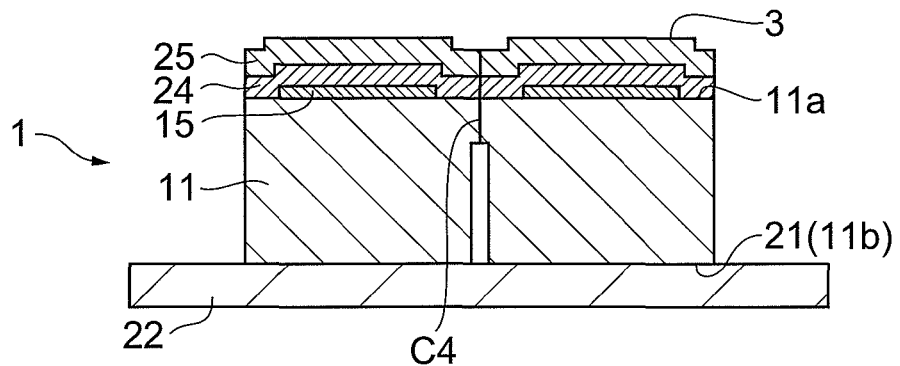

Fig.109
(a)
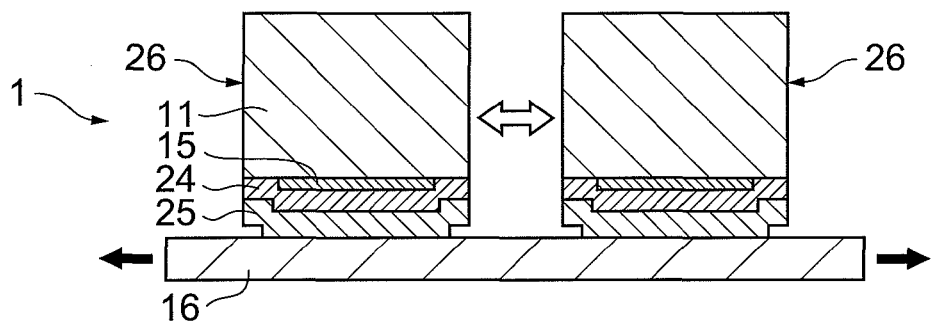
(b)
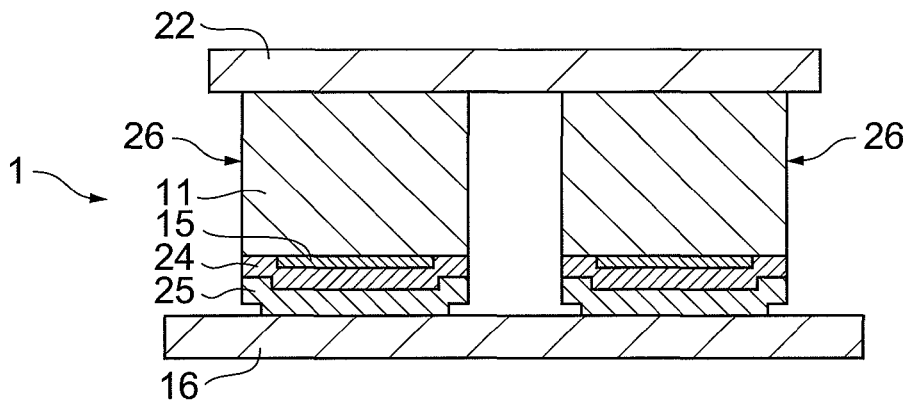
(c)
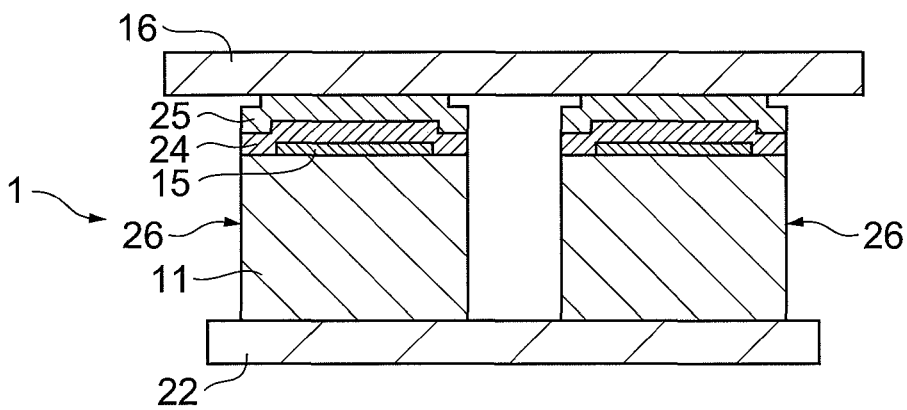

Fig.110
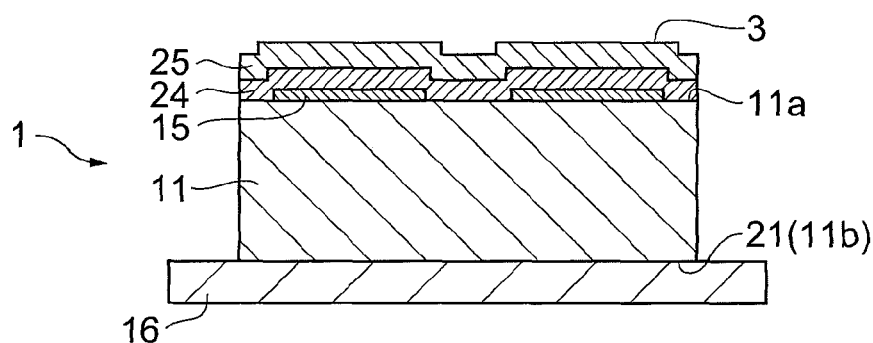
(a)
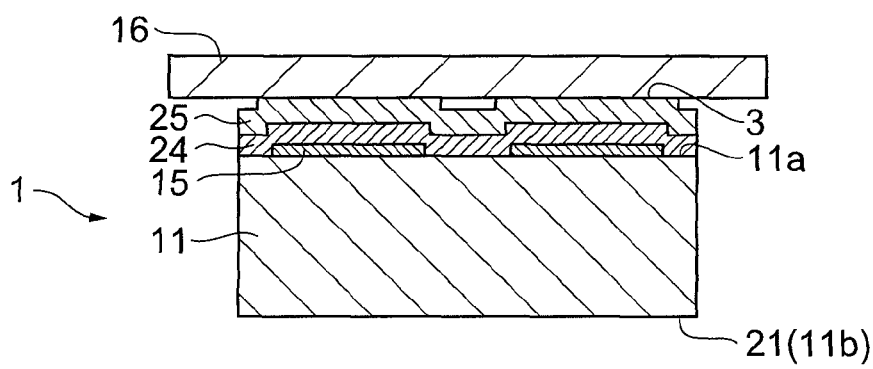
(b)
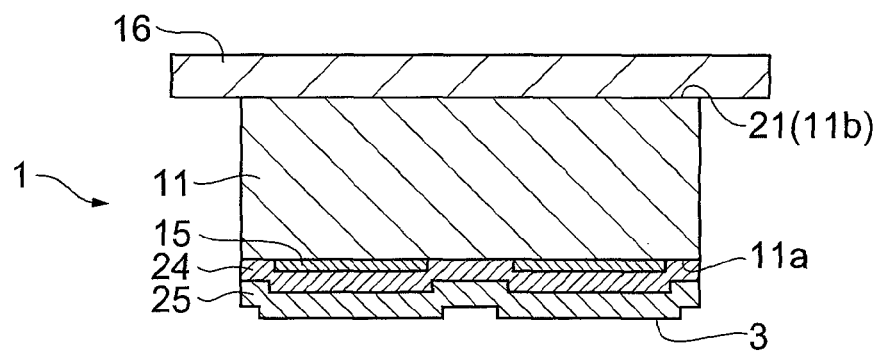
(c)

Fig.111
(a)
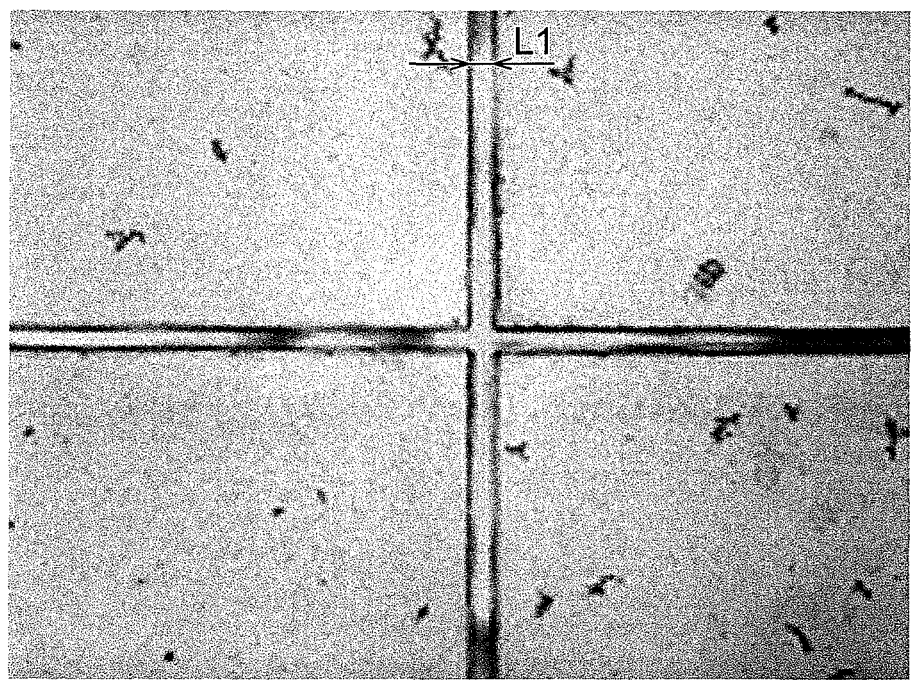
(b)
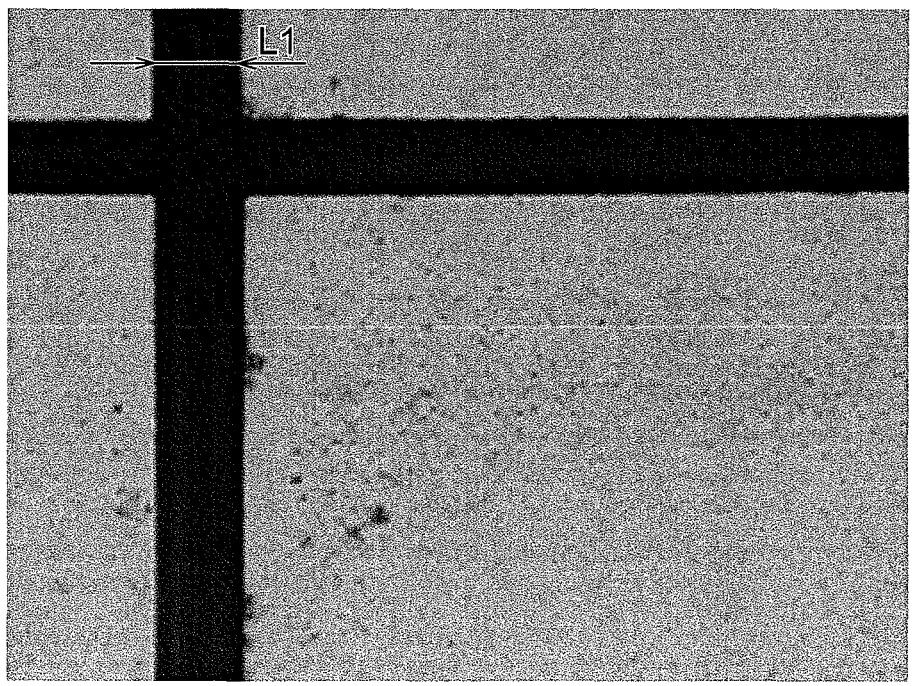

Fig.112
(a)
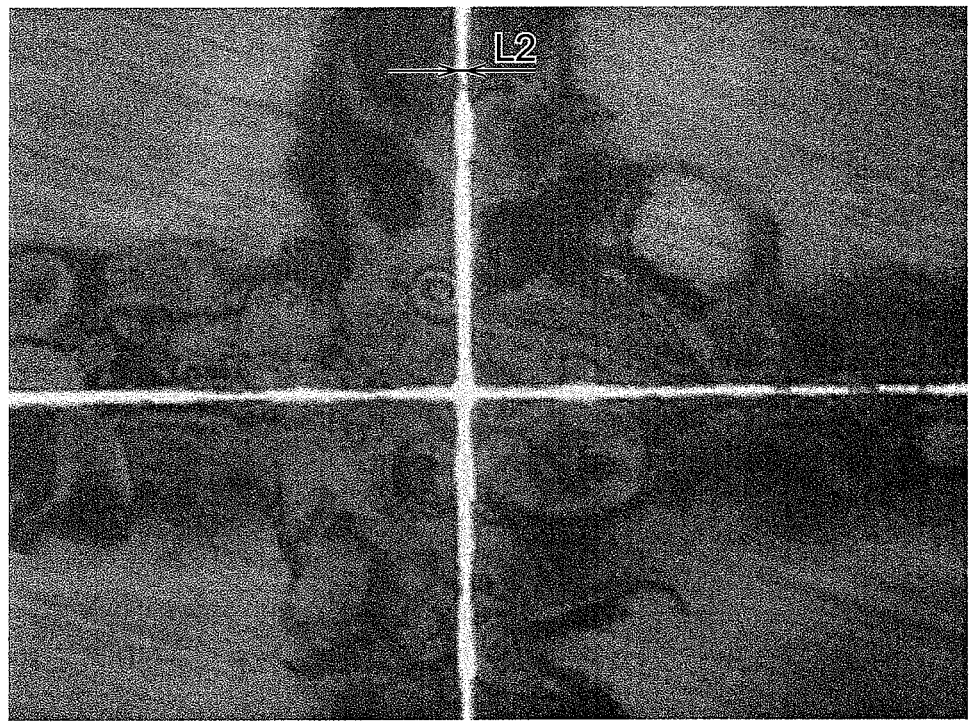
(b)
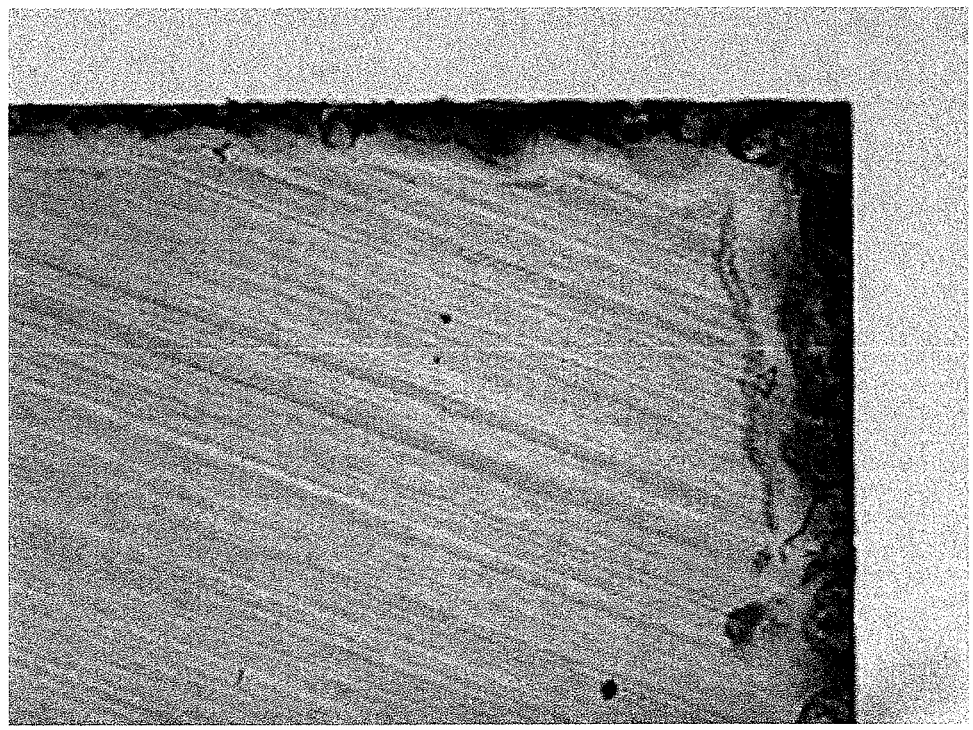

Fig.115

| MATERIAL | UV PROCESS | TEMP. | TIME | | |
|---|---|---|---|---|---|
| | | | 5SEC | 10SEC | 30SEC |
| POLYOLEFIN | NO | 70°C | — | — | 0.8mm |
| | | | — | — | 2.5mm |
| | | 75°C | — | 0.8mm | ○ |
| | | | — | 2.5mm | ○ |
| | | 78°C | 0.5mm | 1.0mm | 2.0mm |
| | | | 1.5mm | 3.0mm | 5.0mm |

*Fig.116*

| MATERIAL | UV PROCESS | TEMP. | TIME | | |
|---|---|---|---|---|---|
| | | | 10SEC | 30SEC | 60SEC |
| PET | NO | 77°C | ○ | ○ | 4.5mm |

*Fig.117*

|  | WAVING | PEELING | EVALUATION |
|---|---|---|---|
| DICING TAPE(VINYL CHLORIDE) | ○ | ○ | ○ |
| DICING TAPE(POLYOLEFIN) | ○ | ○ | ○ |
| BG TAPE(PET) | ○ | ○ | ○ |

Fig.118

| | UV PROCESS | EVALUATION ITEM | 65 | 70 | 75 | 78 | 85 | 92 |
|---|---|---|---|---|---|---|---|---|
| DICING TAPE (VINYL CHLORIDE) | × | WAVING | – | – | × | – | – | – |
| | | PEELING | – | – | × | – | – | – |
| DICING TAPE (POLYOLEFIN) | × | WAVING | ○ | ○ | ○ | × | × | × |
| | | PEELING | ○ | ○ | ○ | ○ | ○ | × |
| BG TAPE (PET) | × | WAVING | – | – | – | – | × | × |
| | | PEELING | – | – | – | – | ○ | × |

TEMP. (°C)

Fig.119
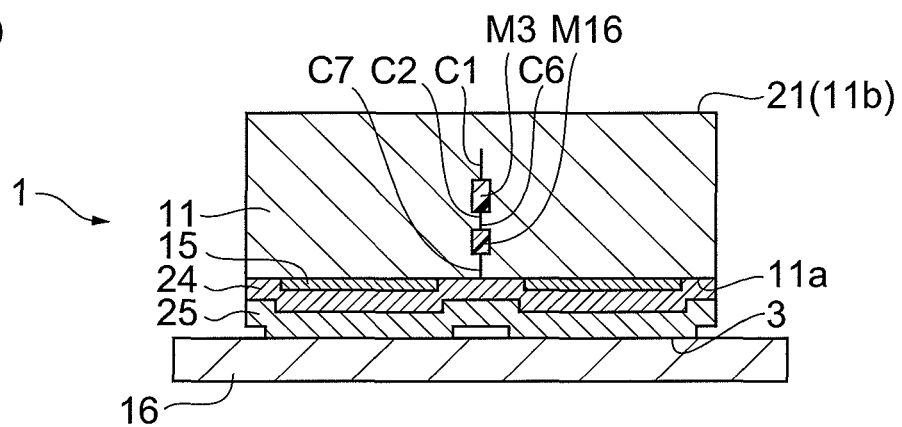
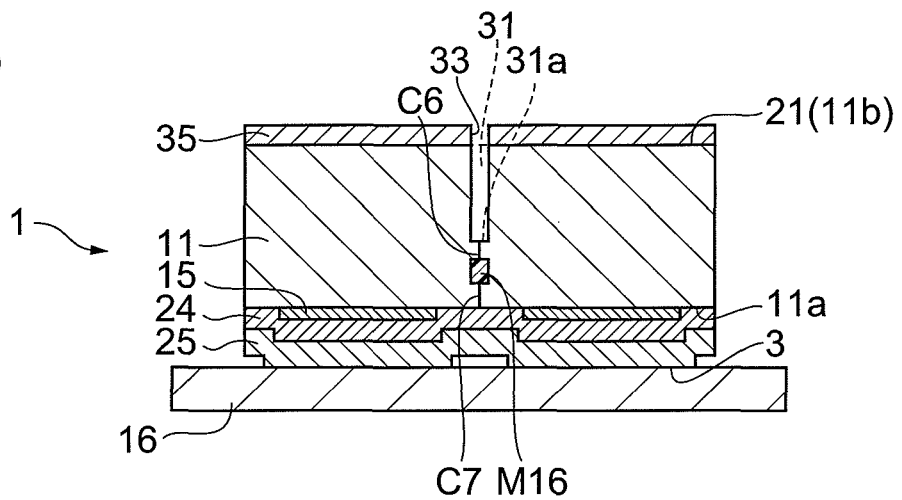
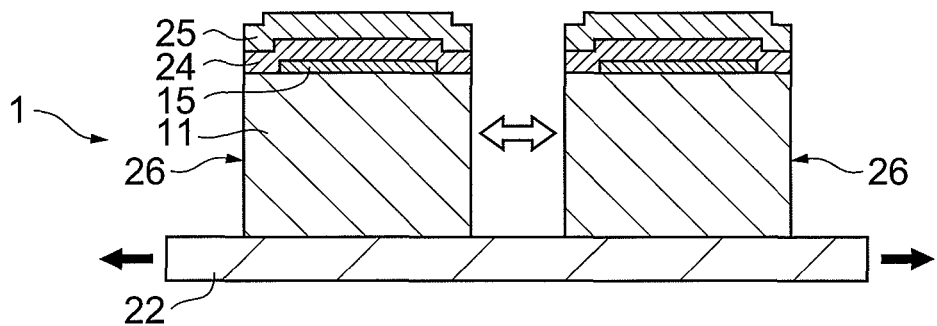

WORKING METHOD FOR CUTTING

TECHNICAL FIELD

The present invention relates to a working method for cutting a planar object to be processed along a line to cut.

BACKGROUND ART

Known as a conventional laser processing method is one which irradiates a planar object to be processed with laser light while locating a converging point at the object so as to form a modified region within the object along a line to cut the object (see Patent Literature 1, for example). Such a working method for cutting applies an external stress to the object formed with the modified region along the line to cut, for example, so as to cut the object into a plurality of chips from the modified region acting as a start point.

Patent Literature 1: Japanese Patent Application Laid-Open No. 2004-343008

DISCLOSURE OF INVENTION

Technical Problem

At the time when applying the external stress to the object in a working method for cutting such as the one mentioned above, however, the force acting on each chip becomes smaller as the chip size is smaller, whereby the object may not be cut reliably depending on circumstances. On the other hand, there is a case where the object is cut by a plasma etching method. In this case, however, it takes a long time to etch a thick object to be processed, while the time available for etching is limited, whereby the etching may end incompletely without reliably cutting the object.

It is therefore an object of the present invention to provide a working method for cutting by which an object to be processed can reliably be cut along a line to cut.

Solution to Problem

For achieving the above-mentioned object, the working method for cutting in accordance with the present invention is a working method for cutting a planar object to be processed along a line to cut, the method comprising the steps of irradiating the object with laser light while locating a converging point at the object, so as to form a modified region in the object along the line to cut, and thereafter etching the modified region formed along the line to cut by an etching process utilizing an etchant exhibiting a higher etching rate for the modified region than for an unmodified region.

This working method for cutting forms a modified region in an object to be processed along a line to cut and subjects the object to an etching process, so as to etch the modified region. This can etch the object to cut selectively and rapidly along the line by utilizing a higher etching rate in the modified region. Therefore, in the case where an external stress is applied in order to cut the object, for example, the object can reliably be cut along the line to cut even when the external stress is small. Since the etching is rapid as mentioned above, even a thick object to be processed can be etched reliably along the line to cut, for example.

Preferably, the method further comprises the step of attaching the object to holding member for holding the object. This can prevent the cut object from scattering. When etching the object attached to the holding member, it will be preferred if the modified region and fractures occurring from the modified region if any are kept from reaching an interface with the holding member (the forming of the modified region and fractures is stopped in front of the interface). This is because the etchant reaching the interface through the modified region and fractures may cause the object to peel off from the holding member and contaminate device surfaces.

Here, after subjecting the object to the etching process, the holding member may be expanded, so as to cut the object along the line to cut. Also, the modified region may be etched, so as to cut the object along the line to cut.

Preferably, the modified region is formed at a predetermined position such that an etched cut section of the object attains a predetermined surface form. In this case, forming the modified region at a predetermined position in the object allows the etched cut section of the object to attain a desirable surface form such as that of letter V or a semicircle by utilizing a higher etching rate in the modified region, whereby the bending strength of the object can be set to a desirable level, for example.

Preferably, the modified region is formed in the object such that a fracture occurs from the modified region. In this case, for example, the fracture may be utilized so as to be infiltrated with the etchant, thus making it possible to promote the progress of etching and accelerate the etching speed.

Preferably, the modified region is formed in the object such that the modified region or a fracture occurring from the modified region is exposed at an outer surface of the object. In this case, for example, the etchant aggressively infiltrates into the object from the exposed modified region or fracture, thereby making it possible to inhibit the outer surface of the object from being etched and damaged.

Preferably, the modified region is formed in the object such that the modified region or a fracture occurring from the modified region is kept from being exposed at an outer surface of the object. This can inhibit the object from dispersing over the surroundings when forming the modified region.

When a crystal plane of a principal plane of the object is a (111) plane, the object has a cleavage plane in a direction inclining to its thickness direction, whereby the cut section tends to tilt with respect to the thickness direction in general. Since the object is selectively etched along the line to cut as mentioned above, the present invention can cut the object such that the cut section is parallel to the thickness direction even when the crystal plane of the principal plane of the object is the (111) plane.

Preferably, the step of forming the modified region forms a plurality of modified regions in the thickness direction of the object, while the step of etching the modified region carries out the etching process such that at least one of the plurality of modified regions remains as a cutting modified region to become a base point for the cutting. This cuts the object from the cutting modified region acting as a cutting start point even when the object is not completely cut by the etching (e.g., when the etching is carried out so as not to reach a device surface), whereby the object can be cut easily with a favorable precision.

Advantageous Effects of Invention

The present invention makes it possible to cut an object to be processed reliably along a line to cut.

BRIEF DESCRIPTION OF DRAWINGS

FIG. 11 is a diagram illustrating an example of an etching process by a spin-etching scheme;

FIG. 14 is a diagram illustrating still another example of the etching process in FIG. 11;

FIG. 16 is a diagram illustrating still another example of the etching process in FIG. 11;

FIG. 17 is a diagram illustrating a sequel to FIG. 16;

FIG. 18 is a chart illustrating whether materials of a holder are adequate or not;

FIG. 19 is a chart illustrating whether the materials of the holder are adequate or not;

FIG. 20 is a chart illustrating examples of an etching liquid;

FIG. 21 is a chart illustrating whether etching effects are superior or inferior for different materials;

FIG. 25 is a view illustrating a sequel to FIG. 24;

FIG. 26 is a view illustrating a sequel to FIG. 25;

FIG. 27 is a schematic sectional view, taken along the line XXIII-XXIII of FIG. 22, for explaining the working method for cutting in accordance with a second embodiment;

FIG. 28 is a view illustrating a sequel to FIG. 27;

FIG. 31 is a view illustrating a sequel to FIG. 30;

FIG. 33 is a schematic sectional view, taken along the line XXIII-XXIII of FIG. 22, for explaining the working method for cutting in accordance with a fifth embodiment;

FIG. 36 is a view illustrating a sequel to FIG. 35;

FIG. 38 is a view illustrating a sequel to FIG. 37;

FIG. 40 is a view illustrating a sequel to FIG. 39;

FIG. 42 is a view illustrating a sequel to FIG. 41;

FIG. 45 is a view illustrating a sequel to FIG. 44;

FIG. 47 is a view illustrating a sequel to FIG. 46;

FIG. 49 is a view illustrating a sequel to FIG. 48;

FIG. 50 is a schematic sectional view, taken along the line XXIII-XXIII of FIG. 22, for explaining the working method for cutting in accordance with a fourteenth embodiment;

FIG. 52 is a view illustrating a sequel to FIG. 51;

FIG. 55 is a view illustrating a sequel to FIG. 54;

FIG. 57 is a view illustrating a sequel to FIG. 56;

FIG. 60 is a view illustrating a sequel to FIG. 59;

FIG. 61 is a schematic sectional view, taken along the line XXIII-XXIII of FIG. 22, for explaining the working method for cutting in accordance with a twenty-first embodiment;

FIG. 62 is a schematic sectional view, taken along the line XXIII-XXIII of FIG. 22, for explaining the working method for cutting in accordance with a twenty-second embodiment;

FIG. 65 is a view illustrating a sequel to FIG. 64;

FIG. 66 is a schematic sectional view, taken along the line XXIII-XXIII of FIG. 22, for explaining the working method for cutting in accordance with a twenty-fourth embodiment;

FIG. 69 is a view illustrating a sequel to FIG. 68;

FIG. 70 is a schematic sectional view, taken along the line XXIII-XXIII of FIG. 22, for explaining the working method for cutting in accordance with a twenty-seventh embodiment;

FIG. 72 is a view illustrating a sequel to FIG. 71;

FIG. 73 is a schematic sectional view, taken along the line XXIII-XXIII of FIG. 22, for explaining the working method for cutting in accordance with a thirtieth embodiment;

FIG. 76 is a view illustrating a sequel to FIG. 75;

FIG. 78 is a view illustrating a sequel to FIG. 77;

FIG. 81 is a view illustrating a sequel to FIG. 80;

FIG. 83 is a view illustrating a sequel to FIG. 82;

FIG. 86 is a view illustrating a sequel to FIG. 85;

FIG. 87 is a schematic sectional view, taken along the line XXIII-XXIII of FIG. 22, for explaining the working method for cutting in accordance with a fortieth embodiment;

FIG. 88 is a schematic sectional view, taken along the line XXIII-XXIII of FIG. 22, for explaining the working method for cutting in accordance with a forty-first embodiment;

FIG. 91 is a view illustrating a sequel to FIG. 90;

FIG. 92 is a schematic sectional view, taken along the line XXIII-XXIII of FIG. 22, for explaining the working method for cutting in accordance with a forty-third embodiment;

FIG. 95 is a view illustrating a sequel to FIG. 94;

FIG. 96 is a schematic sectional view, taken along the line XXIII-XXIII of FIG. 22, for explaining the working method for cutting in accordance with a forty-sixth embodiment;

FIG. 99 is a view illustrating a sequel to FIG. 98;

FIG. 100 is a schematic sectional view, taken along the line XXIII-XXIII of FIG. 22, for explaining the working method for cutting in accordance with a forty-eighth embodiment;

FIG. 102 is a view illustrating a sequel to FIG. 101;

FIG. 105 is a view illustrating a sequel to FIG. 104;

FIG. 106 is a schematic sectional view, taken along the line XXIII-XXIII of FIG. 22, for explaining the working method for cutting in accordance with a fifty-third embodiment;

FIG. 108 is a view illustrating a sequel to FIG. 107;

FIG. 109 is a schematic sectional view, taken along the line XXIII-XXIII of FIG. 22, for explaining the working method for cutting in accordance with a fifty-sixth embodiment;

FIG. 110 is a schematic sectional view, taken along the line XXIII-XXIII of FIG. 22, for explaining an object to be processed in the working method for cutting in accordance with another embodiment;

FIG. 111 is a photographic view illustrating the front face of an object to be processed after laser processing;

FIG. 112 is a photographic view illustrating the rear face of the object in FIG. 111;

FIG. 115 is a chart illustrating resistance evaluation results of a holder made of polyolefin with respect to the etching liquid;

FIG. 116 is a chart illustrating resistance evaluation results of a holder made of PET with respect to the etching liquid;

FIG. 117 is a chart illustrating resistance evaluation results of holders with respect to the etching liquid at normal temperature;

FIG. 118 is a chart illustrating resistance evaluation results of holders with respect to the etching liquid at different temperatures;

FIG. 119 is a schematic sectional view, taken along the line XXIII-XXIII of FIG. 22, for explaining the working method for cutting in accordance with a fifty-seventh embodiment.

REFERENCE SIGNS LIST

1 . . . object to be processed; 3 . . . front face (outer surface) of the object to be processed; 5 . . . line to cut; 11 . . . silicon wafer (object to be processed); 11a . . . front face (principal plane) of the silicon wafer; 11b . . . rear face (outer surface or principal plane) of the silicon wafer; 16, 22 . . . holder or dicing tape (holding member); 21 . . . rear face (outer surface or principal plane) of the object to be processed; 41 . . . outer peripheral face (outer surface); C1 to C7 . . . fracture; E . . . etching liquid (etchant); L . . . laser light; M1 to M15 . . . modified region; M16 . . . cutting modified region (modified region); P . . . converging point

DESCRIPTION OF EMBODIMENTS

In the following, preferred embodiments of the present invention will be explained in detail with reference to the drawings. In the explanation of drawings, the same or equivalent parts will be referred to with the same signs while omitting their overlapping descriptions.

The working methods for cutting in accordance with the embodiments irradiate an object to be processed with laser light while locating a converging point at the object, so as to form a modified region in the object along a line to cut the object. Then, the object formed with the modified region is subjected to an etching process by utilizing an etchant (which will also be referred to as an "etching liquid" in the following) exhibiting a higher etching rate for the modified region than for the remaining region (unmodified region), so as to etch the modified region. Therefore, the forming of the modified region and the etching process in the working methods for cutting in the embodiments will be explained individually at first.

[Forming of Modified Region]

The forming of the modified region in the working methods for cutting in accordance with the embodiments will be explained with reference to FIGS. 1 to 9.

Figure 1:
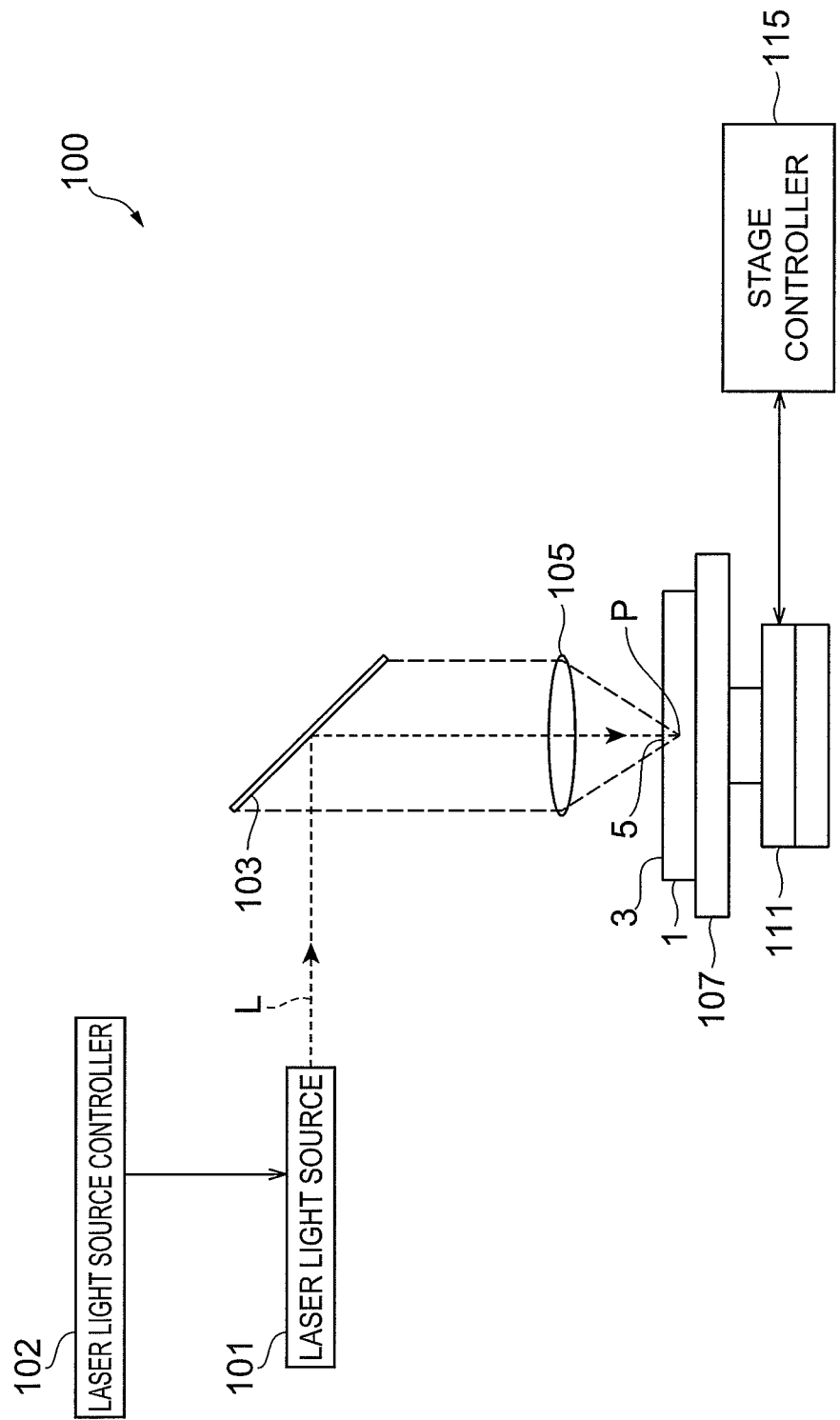
FIG. 1 is a schematic structural diagram of a laser processing apparatus in accordance with an embodiment.

As illustrated in FIG. 1, a laser processing apparatus 100 comprises a laser light source 101 for pulsatingly oscillating laser light (processing laser light) L, a dichroic mirror 103 arranged such as to change the direction of the optical axis of the laser light L by 90°, and a condenser lens 105 for converging the laser light L. The laser processing apparatus 100 further comprises a mount table 107 for mounting an object to be processed 1 which is irradiated with the laser light L converged by the condenser lens 105, a stage 111 for moving the support table 107 along X, Y, and Z axes, a laser light source controller 102 for regulating the laser light source 101 in order to adjust the output, pulse width, and the like of the laser light L, and a stage controller 115 for regulating movements of the stage 111.

In the laser processing apparatus 100, the laser light L emitted from the laser light source 101 changes the direction of its optical axis by 90° with the dichroic mirror 103, and then is converged by the condenser lens 105 into the object 1 on the mount table 107. At the same time, the stage 111 is shifted, so that the object 1 is moved relative to the laser light L along a line to cut 5. As a consequence, a modified region is formed in the object 1 along the line to cut 5. This modified region will be explained in detail in the following.

Figure 2:
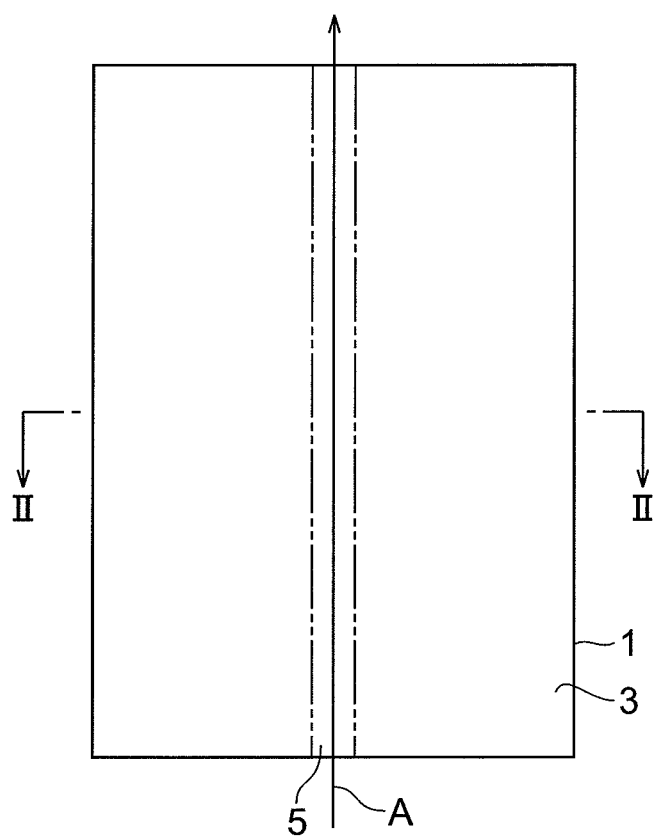
FIG. 2 is a view illustrating an object to be processed in the embodiment.
Figure 3:
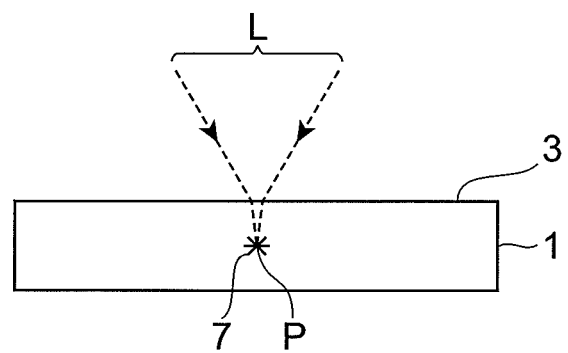
FIG. 3 is a sectional view of the object taken along the line III-III of FIG. 1.
Figure 4:
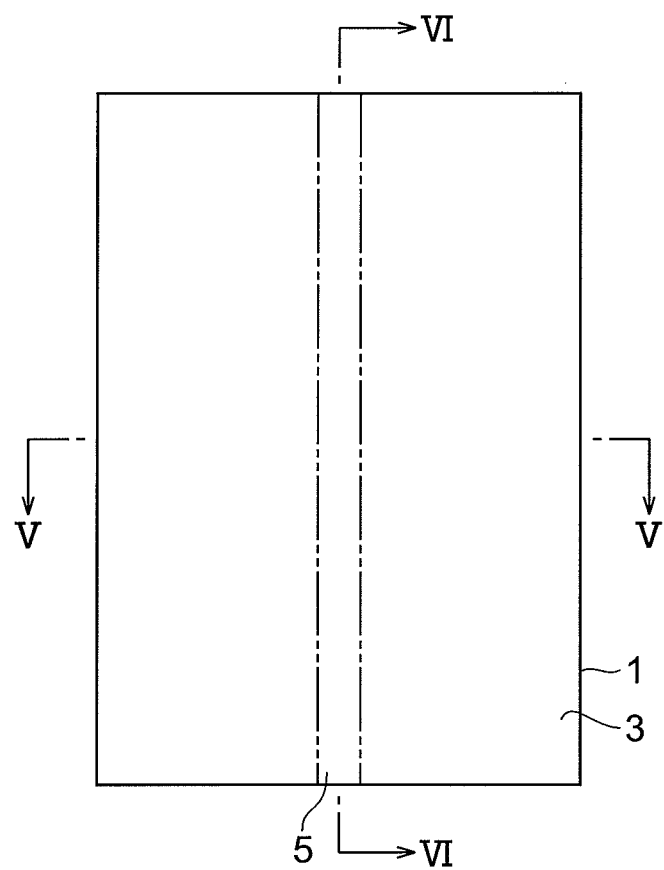
FIG. 4 is a plan view of the object after laser processing.
Figure 5:
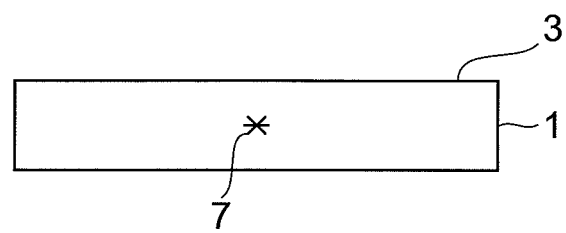
FIG. 5 is a sectional view of the object taken along the line V-V of FIG. 4.
Figure 6:
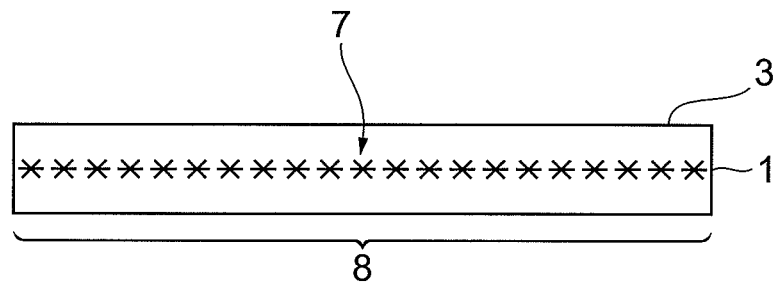
FIG. 6 is a sectional view of the object taken along the line VI-VI of FIG. 4.

As illustrated in FIG. 2, the line to cut 5 for cutting the planar object 1 is set therein. The line to cut 5 is a virtual line extending straight. When forming a modified region within the object 1, the laser light L is relatively moved along the line to cut 5 (i.e., in the direction of arrow A in FIG. 2) while locating a converging point P within the object 1 as illustrated in FIG. 3. This forms a modified region 7 within the object 1 along the line to cut 5 as illustrated in FIGS. 4 to 6.

The converging point P is a position at which the laser light L is converged. The line to cut 5 may be curved instead of being straight, and may be a line actually drawn on the front face 3 of the object 1 without being restricted to the virtual line. The modified region 7 may be formed either continuously or intermittently. It will be sufficient if the modified region 7 is formed at least within the object 1. There are cases where fractures are formed from the modified region acting as a start point, and the fractures and modified region may be exposed at outer surfaces (the front face, rear face, and outer peripheral face) of the object 1.

In the working methods for cutting in accordance with the embodiments, the laser light L is absorbed in particular in the vicinity of the converging point within the object 1 while being transmitted therethrough, whereby the modified region 7 is formed in the object 1 (i.e., internal absorption type laser processing). Therefore, the front face 3 of the object 1 hardly absorbs the laser light L and thus does not melt. In the case of forming a removing part such as a hole or groove by melting it away from the front face 3 (i.e., surface absorption type laser processing), the processing region gradually progresses from the front face 3 side to the rear face side in general. Hence, no modified region which rapidly increases the etching rate is formed in the vicinity of the removing part.

The modified region formed by the working methods for cutting in accordance with the embodiments refers to regions whose physical characteristics such as density, refractive index, and mechanical strength have attained states different from those of their surroundings. Examples of the modified region include (1) molten processed regions, (2) crack regions or dielectric breakdown regions, (3) refractive index changed regions, and their mixed regions.

The modified region in the working methods for cutting in accordance with the embodiments can be formed by local absorption of laser light or a phenomenon known as multiphoton absorption. A material becomes transparent when its absorption bandgap $E_G$ is greater than photon energy hv, so that a condition under which absorption occurs in the material is $hv > E_G$. However, even when optically transparent, the material generates absorption under a condition of $nhv > E_G$ (where n=2, 3, 4, . . . ) if the intensity of laser light becomes very high. This phenomenon is known as multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

Also, modified regions formed by employing ultrashort-pulse laser light having a pulse width of several picoseconds to femtoseconds may be utilized as described in D. Du, X. Liu, G. Korn, J. Squier, and G. Mourou, "Laser Induced Breakdown by Impact Ionization in $SiO_2$ with Pulse Widths from 7 ns to 150 fs", Appl. Phys. Lett. 64(23), Jun. 6, 1994.

(1) Case where the Modified Region Includes a Molten Processed Region

An object to be processed (e.g., semiconductor material such as silicon) is irradiated with the laser light L while locating a converging point within the object under a condition with a field intensity of at least $1 \times 10^8$ (W/cm$^2$) at the converging point and a pulse width of 1 μs or less. As a consequence, the laser light L is absorbed in the vicinity of the converging point, so that the inside of the object is locally heated, and this heating forms a molten processed region within the object.

The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example.

Figure 7:
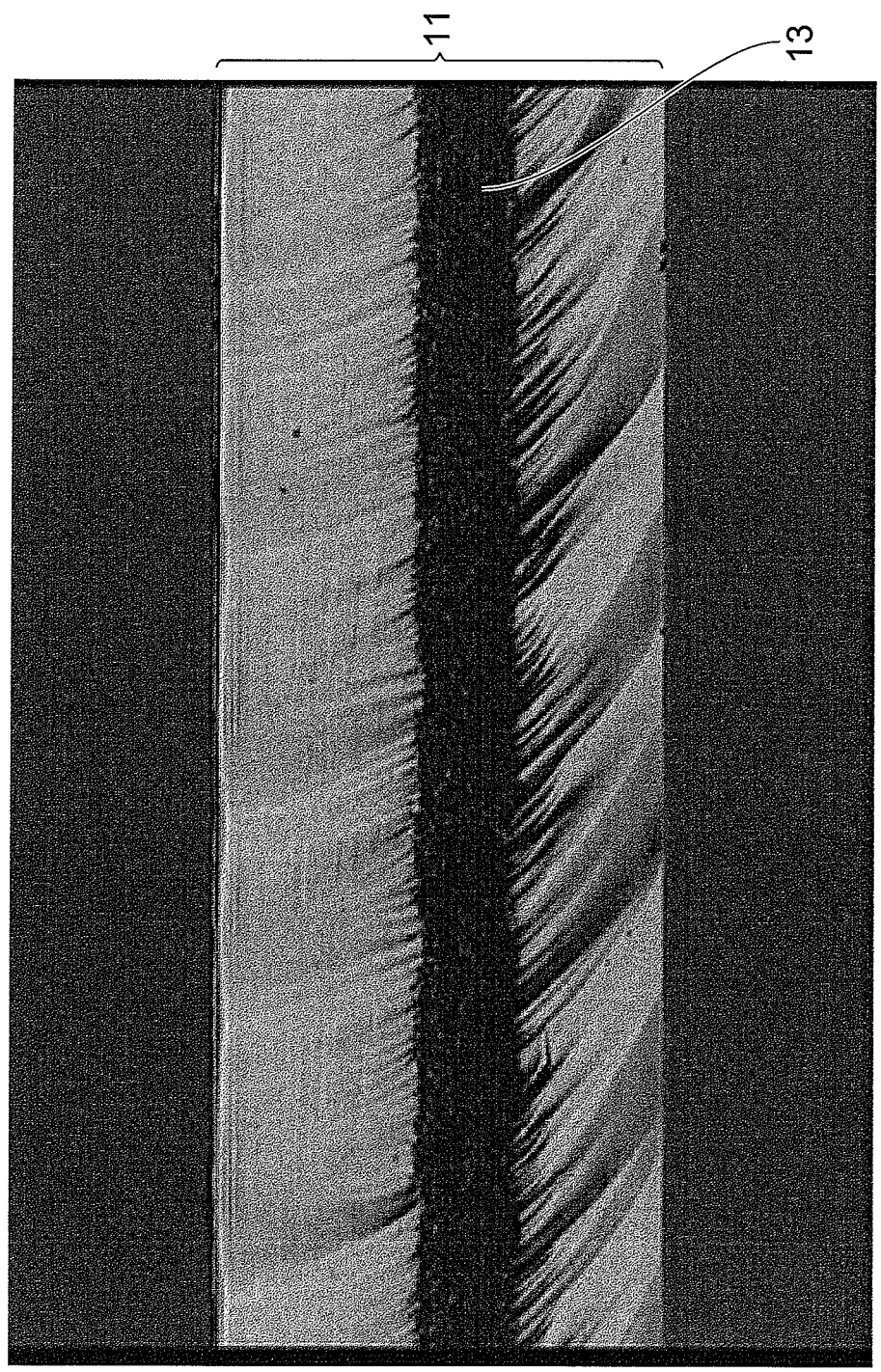
FIG. 7 is a graph illustrating relationships between the peak power density of laser light and crack spot size.

FIG. 7 is a view representing a photograph of a cross section in a part of a silicon wafer (semiconductor substrate) irradiated with laser light. As illustrated in FIG. 7, a molten processed region 13 is formed within a silicon wafer 11.

Figure 8:
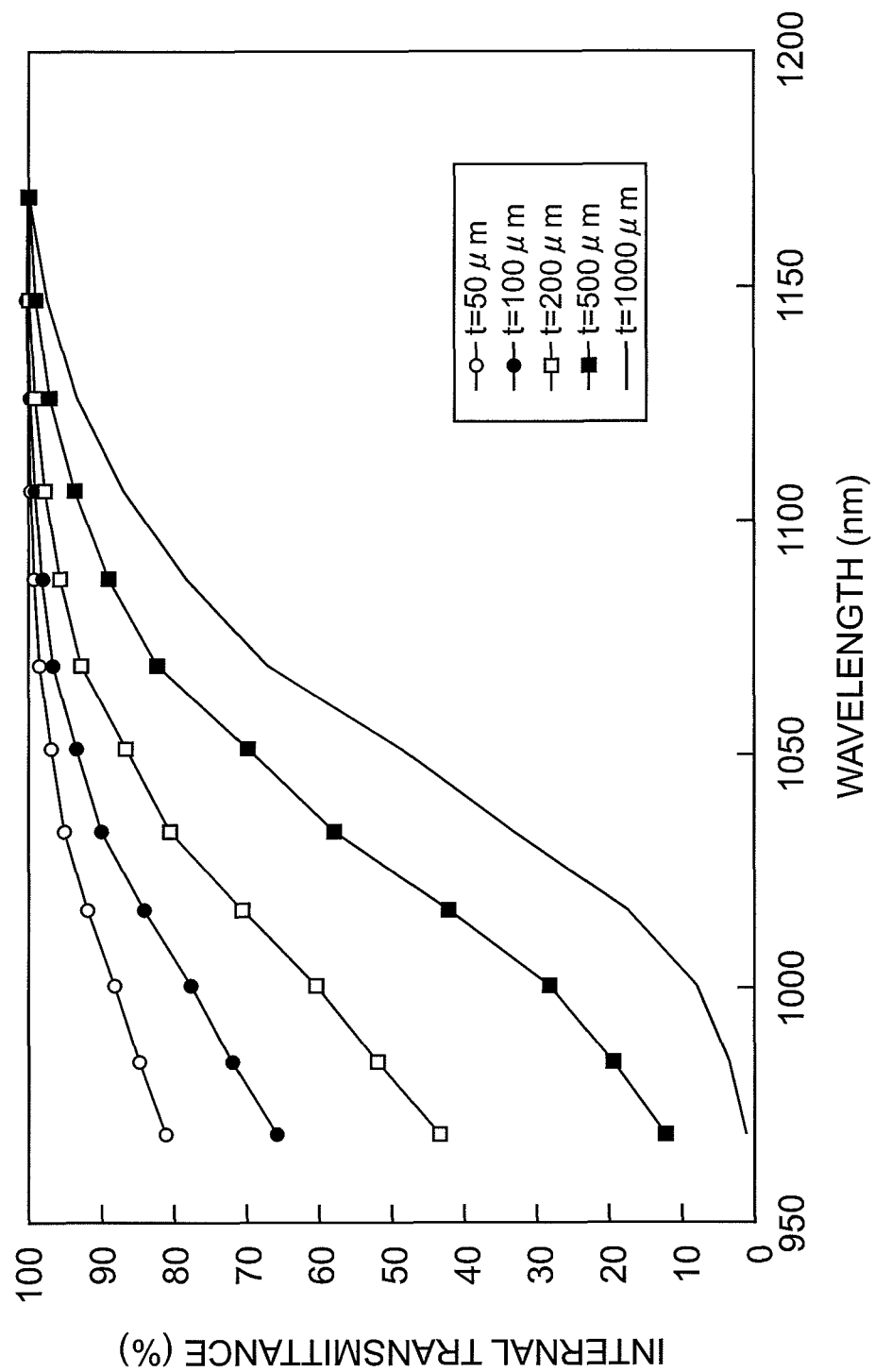
FIG. 8 is a photographic view of a cut section of a silicon wafer irradiated with laser light.

The fact that the molten processed region 13 is formed within a material transparent to the wavelength of laser light incident thereon will now be explained. FIG. 8 is a graph illustrating relationships between the laser light wavelength and the transmittance within the silicon substrate. Here, the respective reflected components on the front and rear face sides of the silicon substrate are eliminated, so as to indicate the internal transmittance alone. The respective relationships are represented in the cases where the thickness t of the silicon substrate is 50 μm, 100 μm, 200 μm, 500 μm, and 1000 μm.

For example, at the Nd:YAG laser wavelength of 1064 nm, the laser light L appears to be transmitted through the silicon substrate by at least 80% when the silicon substrate has a thickness of 500 μm or less. Since the silicon wafer 11 represented in FIG. 7 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light L is absorbed only slightly within the silicon wafer 11 but is substantially transmitted therethrough. When converged within the silicon wafer under the condition of at least $1\times10^8$ $(W/cm^2)$ with a pulse width of 1 μs or less, however, the laser light L is locally absorbed at the converging point and its vicinity, whereby the molten processed region 13 is formed within the silicon wafer 11.

There is a case where fractures occur in the silicon wafer from the molten processed region acting as a start point. There is also a case where fractures are formed as being incorporated in the molten processed region. In the latter case, the fractures may be formed over the whole surface of the molten processed region or in only a part or a plurality of parts thereof. These fractures may grow naturally or as a force is exerted on the silicon wafer. The fractures naturally growing from the molten processed region include both of cases where they grow from a state in which the molten processed region is molten and where they grow when the molten processed region is re-solidified from the molten state. In either case, the molten processed region is formed only within the silicon wafer and, when at a cut section, within the cut section as illustrated in FIG. 8.

(2) Case where the Modified Region Includes a Crack Region

An object to be processed (e.g., glass or a piezoelectric material made of LiTaO$_3$) is irradiated with the laser light L while locating a converging point therewithin under a condition with a field intensity of at least $1\times10^8$ $(W/cm^2)$ at the converging point and a pulse width of 1 μs or less. This magnitude of pulse width is a condition under which the laser light L is absorbed within the object so that a crack region is formed therein. This generates a phenomenon of optical damage by multiphoton absorption within the object. This optical damage induces a thermal distortion within the object, thereby forming a crack region including a crack or a plurality of cracks within the object. The crack region may also be referred to as a dielectric breakdown region.

Figure 9:
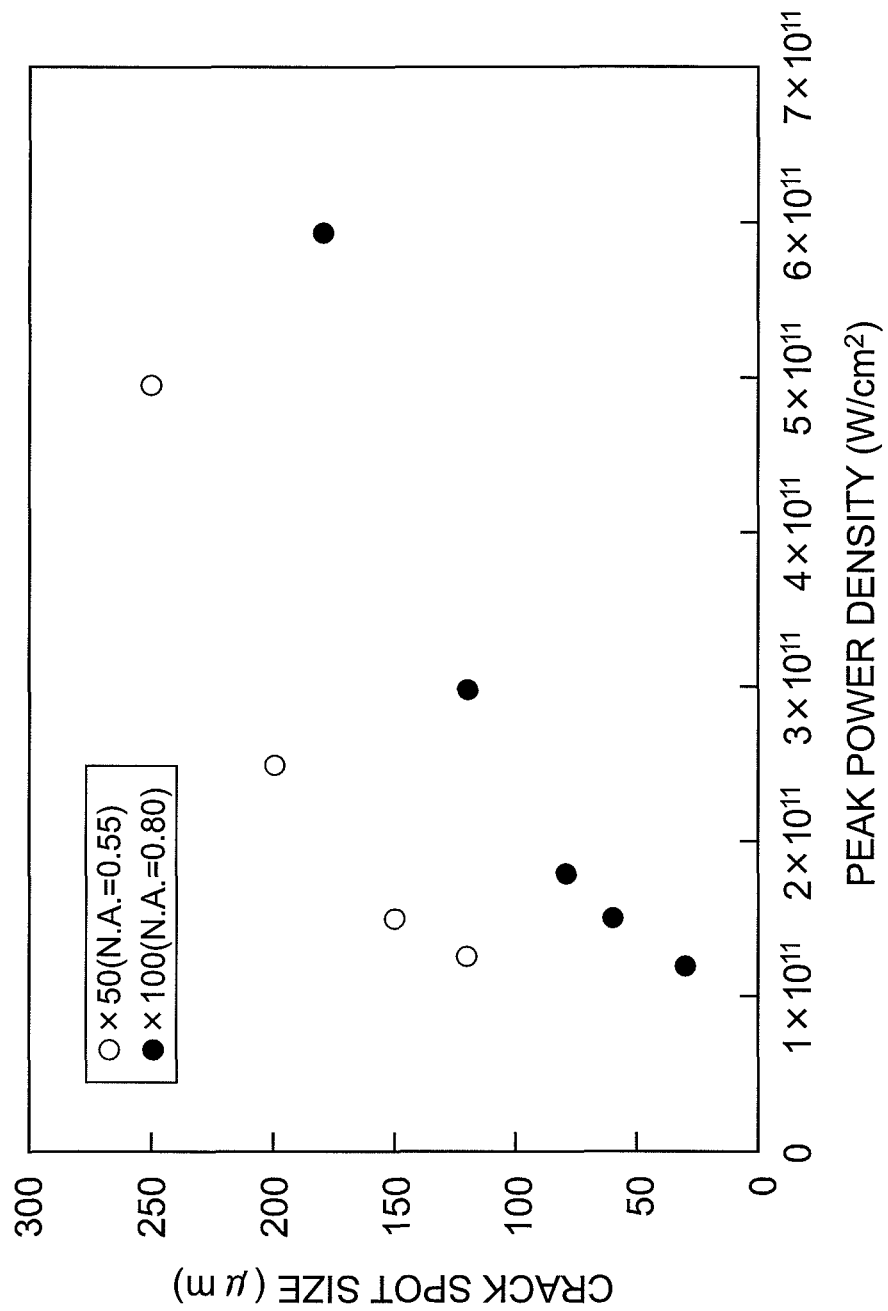
FIG. 9 is a graph illustrating relationships between the laser light wavelength and the transmittance within a silicon substrate.
Figure 10:
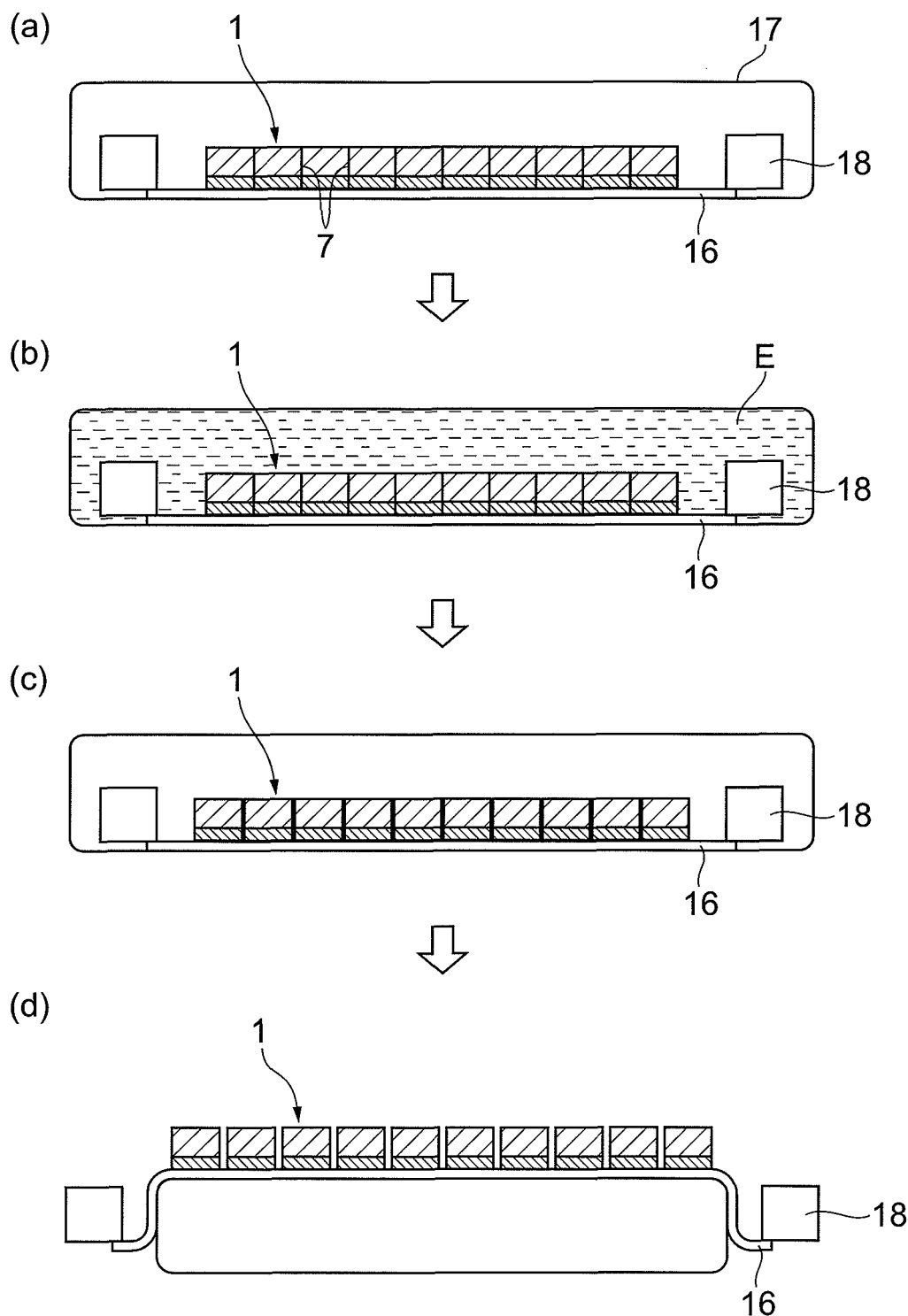
FIG. 10 is a diagram illustrating an example of an etching process by a dipping scheme.
Figure 12:
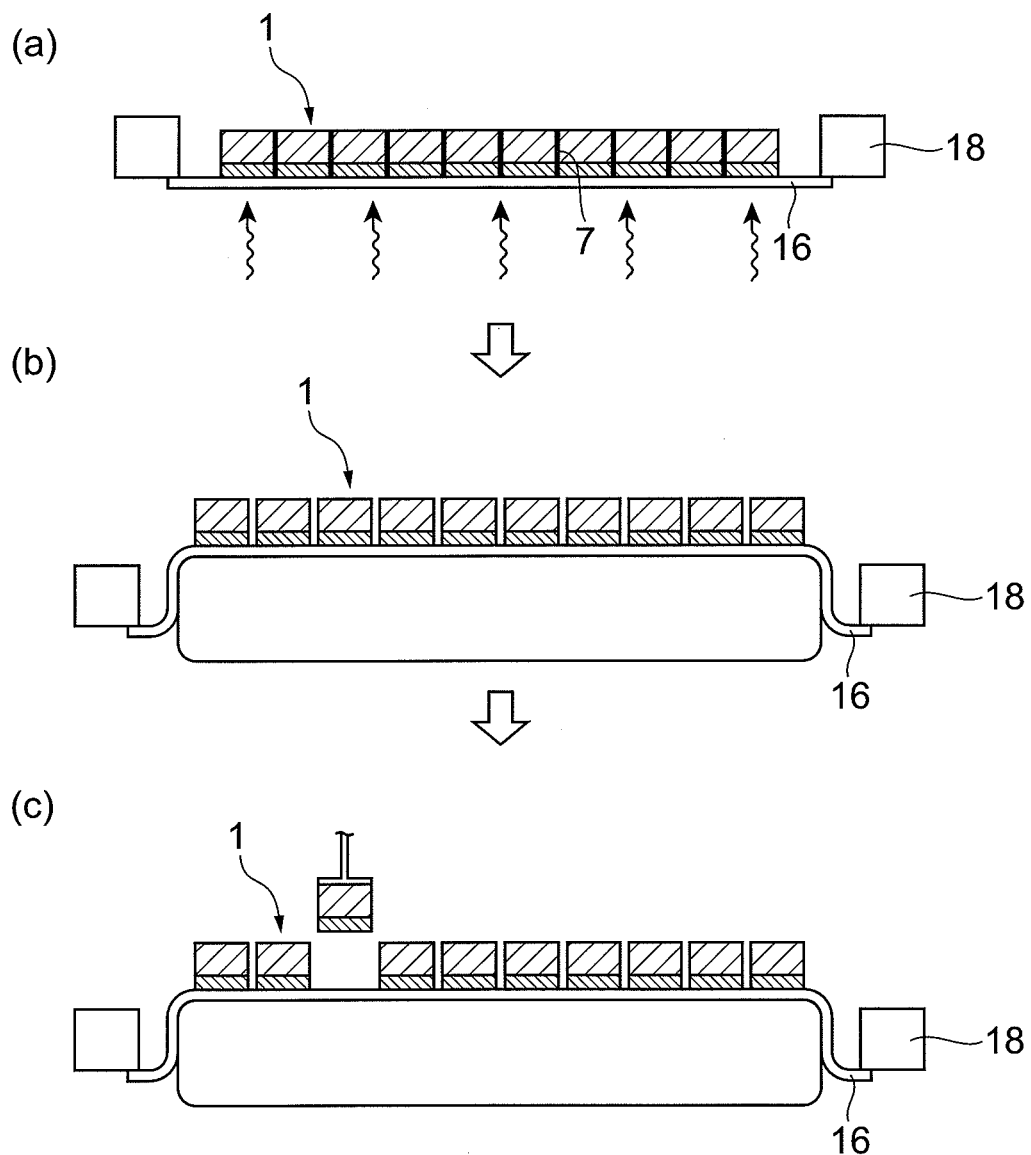
FIG. 12 is a diagram illustrating a sequel to FIG. 11.
Figure 13:
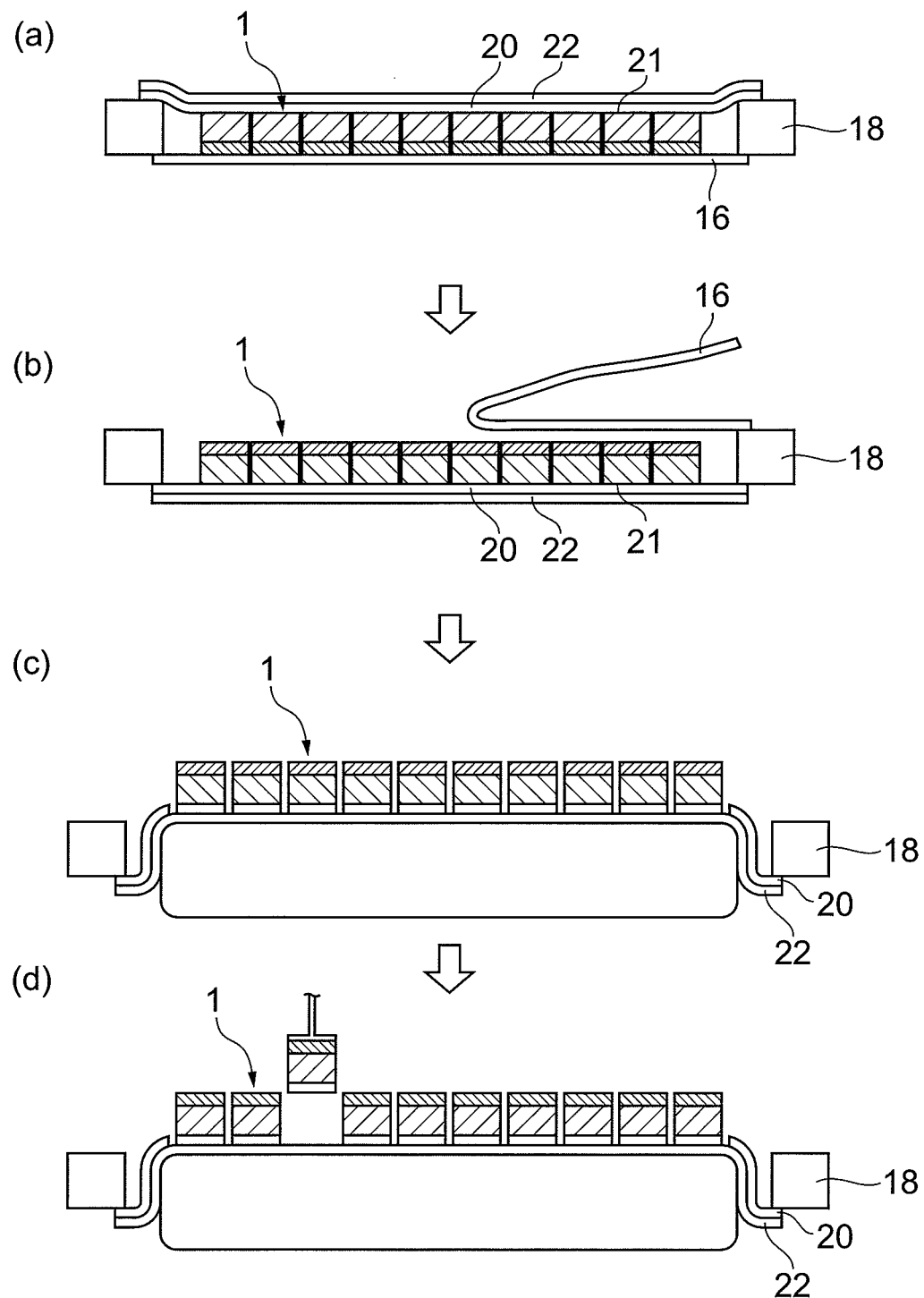
FIG. 13 is a diagram illustrating another example of the etching process in FIG. 11.
Figure 15:
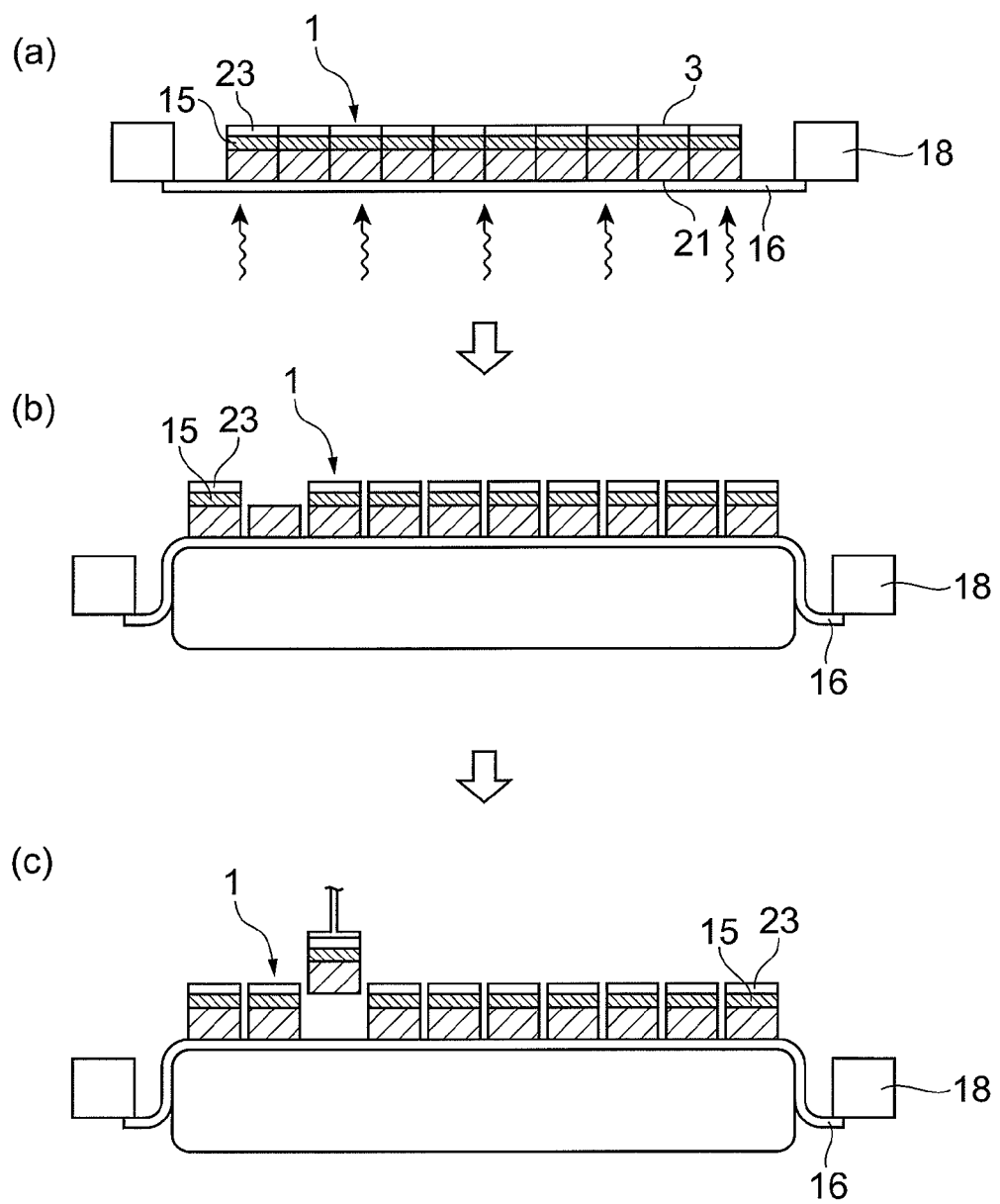
FIG. 15 is a diagram illustrating a sequel to FIG. 14.

FIG. 9 is a graph illustrating results of experiments concerning relationships between the field intensity and crack size. The abscissa indicates the peak power density. Since the laser light L is pulsed laser light, the field intensity is represented by the peak power density. The ordinate indicates the size of a crack part (crack spot) formed within the object by one pulse of laser light L. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ $(W/cm^2)$ and become greater as the peak power density increases.

(3) Case where the Modified Region Includes a Refractive Index Changed Region

An object to be processed (e.g., glass) is irradiated with the laser light L while locating a converging point within the object under a condition with a field intensity of at least $1\times10^8$ $(W/cm^2)$ at the converging point and a pulse width of 1 ns or less. When the laser light L is thus absorbed within the object while having a very short pulse width, its energy is not converted into thermal energy, whereby an eternal structure change such as ion valence change, crystallization, or orientation polarization is induced within the object, thus forming a refractive index changed region.

The modified region, which encompasses the molten processed regions, dielectric breakdown regions, refractive index changed regions, and their mixed regions, may be an area where the density of the modified region has changed from that of an unmodified region in the material or an area formed with a lattice defect. They can collectively be referred to as a high-density transitional region.

The molten processed regions, refractive index changed regions, areas where the modified region has a density different from that of the unmodified region, or areas formed with a lattice defect may further incorporate a fracture (cut or microcrack) therewithin or at an interface between the modified and unmodified regions. The incorporated fracture may be formed over the whole surface of the modified region or in only a part or a plurality of parts thereof. When the fractures are thus incorporated, an etchant may infiltrate through the fractures to the whole surface or inside of the modified region, so that etching is performed not only in the thickness direction of the modified region but also in lateral directions throughout the thickness, whereby the etching reaction area can be made larger than that in the case where etching progresses from the upper side to lower side in the thickness direction as in typically known etchings, which provides the present invention with advantageous effects of making the etching speed higher.

The object can be cut with a favorable precision if the modified region is formed as follows while taking account of the crystal structure of the object, its cleavage characteristic, and the like.

That is, in the case of a substrate made of a monocrystal semiconductor having a diamond structure such as silicon, it will be preferred if the modified region is formed in a direction extending along a (111) plane (first cleavage plane) or a (110) plane (second cleavage plane). In the case of a substrate made of a group III-V compound semiconductor of sphalerite structure such as GaAs, it will be preferred if the modified region is formed in a direction extending along a (110) plane. In the case of a substrate having a crystal structure of hexagonal system such as sapphire (Al$_2$O$_3$), it will be preferred if the modified region is formed in a direction extending along a (1120) plane (A plane) or a (1100) plane (M plane) while using a (0001) plane (C plane) as a principal plane.

When the substrate is formed with an orientation flat in a direction to be formed with the above-mentioned modified region (e.g., a direction extending along a (111) plane in a monocrystal silicon substrate) or a direction orthogonal to the direction to be formed therewith, the modified region can be formed easily and accurately in the substrate with reference to the orientation flat.

[Etching Process]

The etching process in the working methods for cutting in accordance with the embodiments will now be explained with reference to FIGS. 10 to 21.

By utilizing a characteristic feature that a modified region exhibits a higher etching rate, the etching process in the embodiments selectively etches away the modified region formed in the object along the line to cut. In the case where the object is a silicon wafer, for example, the modified region exhibits an etching rate of 300 μm/min or greater (about 10 times that of a monocrystal Si region), whereby an etching process for dividing a silicon wafer having a thickness of 100 μm or less into chips is completed in several to several ten seconds.

The etching process encompasses a case where the object is immersed in an etching liquid (dipping scheme) and a case where the object is coated with the etching liquid while being rotated (spin-etching scheme).

In the dipping scheme, as illustrated in FIG. 10(a), the object 1 formed with modified regions 7 is initially arranged within a liquid tank 17 while being attached to a holder (holding member) 16 which is a tape material such as a holding tape. Subsequently, as illustrated in FIG. 10(b), an etching liquid (e.g., KOH solution) E is caused to flow into the liquid tank 17, so that the object 1 is immersed in the etching liquid, whereby the modified regions 7 formed in the object 1 are selectively etched, by which the object is divided into a plurality of chips. As illustrated in FIG. 10(c), the etching liquid E is removed from within the liquid tank 17, and the object 1 is washed and dried thereafter. Then, as illustrated in FIG. 10(d), the holder 16 is expanded, so as to increase the gap between adjacent chips.

Since the dipping scheme reserves the etching liquid E within the liquid tank 17 and etches the object 1 with the etching liquid E, it is advantageous in that the temperature of the etching liquid E can be controlled easily while the etching process is hard to become uneven. Further, the structure of the liquid tank 17 becomes relatively simple, which makes it relatively easy to design the liquid tank 17. Since the etching can be carried out with a typical KOH solution, it is hard to incur the problem of liquid waste disposal.

While an expandable tape member is suitable as the holder 16 that is to be expanded as mentioned above, members having no expandability may be used when there is no need for expansion, for example. The expanded chip gap may be held with a jig or the like, or a supporter (supporting member) for supporting the object 1 may be used. Though the above-mentioned etching process forms a plurality of chips by etching the modified regions 7, the holder 16 may be expanded, so that a plurality of chips are finally obtained. The holder 16 is preferably made of a material which is excellent in resistance to heat and chemicals. Here, polyolefin is used (as will be explained later in detail). Preferably, a dicing frame 18 is also made of a material which is excellent in resistance to chemicals; a resin made of silicon or the like is used here. These are the same in explanations of etching processes which will follow.

On the other hand, the spin-etching scheme encompasses a case (i) where the etching liquid is supplied from the upper side to the object attached to the holder such that a surface (device surface) formed with a device is on the holder side and a case (ii) where the etching liquid is supplied from the upper side to the object attached to the holder such that the device surface is on the upper side.

(i) Where the Device Surface is on the Holder Side

First, as illustrated in FIG. 11(a), the object 1 formed with the modified regions 7 is mounted on the holder 16, which is a tape material or the like, such that a device surface 3 formed with a device 15 faces the holder 16 (the rear face 21 of the object 1 is on the upper side). Subsequently, as illustrated in FIG. 11(b), the object is rotated at a predetermined speed while the etching liquid E is applied thereto from the upper side, whereby the whole rear face 21 is coated with the etching liquid E.

Then, while the etching liquid E infiltrates into the modified regions 7, the latter are selectively etched, whereby the object 1 is divided into a plurality of chips as illustrated in FIG. 11(c). After being washed and dried, the object 1 is irradiated with UV rays as illustrated in FIG. 12(a), so as to enhance the releasability of the object 1 and the holder 16 from each other (reduce their bonding strength). After the holder 16 is expanded as illustrated in FIG. 12(b), so as to increase the gap between adjacent chips, the chips are picked up as illustrated in FIG. 12(c).

When forming the object 1 with a DAF (Die Attach Film) here, a DAF tape 20 and a holder 22 are attached (transferred) to the rear face 21 of the object 1 in this order as illustrated in FIG. 13(a) after the UV irradiation of the object 1. Subsequently, the object 1 is turned upside down, and the holder 16 is peeled off therefrom. Then, the holder 22 is expanded as illustrated in FIG. 13(c), so as to increase the gap between adjacent chips and divide the DAF tape 20 into the individual chips. Thereafter, as illustrated in FIG. 13(d), the chips are picked up.

(ii) Where the Device Surface is on the Upper Side

First, as illustrated in FIG. 14(a), the object 1 formed with the modified regions 7 is mounted on the holder 16 such that the device surface 3 is on the upper side (the rear face 21 of the object 1 faces the holder 16). Here, the device 15 is formed with a protective film (e.g., SiN) 23 for protecting it against the etching liquid E.

Subsequently, as illustrated in FIG. 14(b), the object 1 is rotated at a predetermined speed while the etching liquid E is applied thereto from the upper side, whereby the whole device surface 3 is coated with the etching liquid E. While the applied etching liquid E infiltrates into the modified regions 7, the latter are selectively etched, whereby the object 1 is divided into a plurality of chips as illustrated in FIG. 14(c). After being washed and dried, the object 1 is irradiated with UV rays as illustrated in FIG. 15(a), so as to enhance the releasability of the object 1 and the holder 16 from each other. After the holder 16 is expanded as illustrated in FIG. 15(b), so as to increase the gap between adjacent chips, the chips are picked up as illustrated in FIG. 15(c).

When forming the object 1 with a DAF here, the object 1 is mounted on the holder 16 with the DAF tape 20 interposed between the rear face 21 of the object 1 and the holder 16 as illustrated in FIG. 16(a). Subsequently, as illustrated in FIG. 16(b), the object 1 is rotated at a predetermined speed while the etching liquid E is applied thereto from the upper side, whereby the whole rear face 21 is coated with the etching liquid E. The applied etching liquid E infiltrates into and selectively etches the modified regions 7, whereby the object 1 is divided into a plurality of chips as illustrated in FIG. 16(c). Then, the holder 16 is expanded as illustrated in FIG. 17(a), so as to increase the gap between adjacent chips and divide the DAF tape 20 into the individual chips. Thereafter, the chips are picked up as illustrated in FIG. 17(b).

These spin-etching schemes enable a selective etching process in a short time by applying the etching liquid E to the object 1. Since the etching process is carried out with the etching liquid E that is always clean, the object 1 can be inhibited from being secondarily contaminated. An etching mechanism also serving for a washing step can easily be employed. Since the etching can be carried out with a typical KOH solution, the problem of liquid waste disposal is hard to occur.

When the modified regions 7 include a fracture, the etching liquid infiltrates into a fracture region of the object 1 because of a capillary action, so that the etching of the modified regions with a higher etching rate progresses along a fracture surface, thereby further raising the etching speed. When the modified regions 7 include no fracture, on the other hand, the etching liquid E may be harder to infiltrate therein, thereby lowering the etching speed.

The holder suitable for the etching process in this embodiment is desired to have the following three features. That is, it is desirable for the holder 1) to minimize the decrease in chip holding capability against the etching liquid; 2) to have expandability after the etching; and 3) to lower the peeling strength between the chip and the holder when an external stimulus other than temperature is applied thereto, whereby the chips can be peeled off from the holder more easily.

Examples of the holder that is resistant (in terms of chemical and temperature resistance) to alkaline etching liquids (e.g., KOH) include those made of vinyl chloride, polyolefin, and PET. As listed in the following resistance limits, however, the resistance of these etching liquids depends on the temperature of the etching liquids and the time dipped therein (dipping time).

Resistance Limits:
PET: Temp.=117° C. (KOH b.p.); Dipping time=60 min
Polyolefin: Temp.=50° C.; Dipping time=60 min
Vinyl chloride: Temp.=40° C.; Dipping time=60 min FIG. 18 is a chart illustrating whether materials of the holder are adequate or not when the object is subjected to the etching process such that the device surface is on the holder side, while FIG. 19 is a chart illustrating whether the materials of the holder are adequate or not when the object is subjected to the etching process such that the device surface is on the upper side. In the charts, whether the materials are adequate or not are determined according to whether or not they have the above-mentioned three features and denoted with cross, triangle, circle, and double circle signs which increase the adequacy for the holder in ascending order.

When the object is subjected to the etching process such that the device surface is on the holder side, vinyl chloride has a low heat resistance and thus is unfavorable for the dipping scheme as illustrated in FIG. 18 (the cross sign in the chart). Polyolefin has a heat resistance lower than that of PET and thus remains favorable (the circle sign in the chart) for the spin-etching scheme. On the other hand, though PET has no expandability, it will be sufficient if the etched object is transferred to an expandable holder and then the latter is expanded; because of excellent resistance to the etching liquid, employing PET in the spin-etching scheme is very favorable (the double circle sign in the chart).

When vinyl chloride is employed in the spin-etching scheme as illustrated in FIG. 19 at the time of subjecting the object to the etching process such that the device surface is on the upper side, the holder can be expanded without transfer after the etching process; however, the heat resistance is lower than in the other two, so that this case is only slightly favorable (the triangle sign in the chart). Employing polyolefin in the spin-etching scheme is very favorable (the double circle sign in the chart), since the holder can be expanded as it is without need of transfer. Employing PET in the spin-etching scheme is unfavorable (the cross sign in the chart), since the holder cannot be expanded as it is.

In the dipping scheme, as illustrated in FIGS. 18 and 19, the thermal influence on the holder is so strong that there are only a small number of materials suitable for the holder. In the spin-etching scheme, by contrast, the thermal influence on the holder is weaker, whereby any material is seen to be more likely to suit the holder than in the dipping scheme. In view of the foregoing, the spin-etching scheme is favorable as the etching liquid coating method, while polyolefin is favorable as the holder.

FIG. 20 is a chart illustrating examples of the etching liquid in use for different materials of the substrate. The etching liquid is used at a temperature ranging from normal temperature to about 100° C. and set to an appropriate temperature according to a required etching rate and the like. When Si (anisotropic) is subjected to the etching process with KOH, for example, the latter is preferably set to about 60° C.

FIG. 21 is a chart illustrating whether etching effects are superior or inferior for different materials. In the chart, the cross, triangle, circle, and double circle signs denote those having better effects in ascending order, in which the double circle sign indicates the case where the etching process finally cuts the object to the end, whereas the cross sign indicates the case where the object is finally cut by application of an external stress (for breaking) after the etching process. RIE (Reactive Ion Etching), which is one of fine processing techniques classified as dry etching, allows etching at a high precision suitable for fine processing and, unlike conventional dry etching, enables anisotropic etching.

Under the conditions denoted with a black triangle sign, fractures are likely to form radially when made aggressively, whereby cut sections are easier to incur irregularities. When employing the RIE, the condition under which the object is finally cut by the etching process (within the broad frame in the chart) is favorable, since the etching progresses depending on a mask pattern for etching. From the viewpoint of takt time, as illustrated in FIG. 21, wet etching is preferred as the etching process, since it enables batch processing of a plurality of sheets and thus can reduce takt time as compared with dry etching which can process only one sheet at a time.

The isotropic etching is applicable to relatively thin objects to be processed (having a thickness of 10 to 100 μm, for example) and allows the etching to progress isotropically. When a fracture is exposed at a surface in this case, the etching liquid infiltrates into the inside through the fracture, so that the whole surface of a modified region in the thickness direction serves as a base point for the modified region, whereby a chip which is etched such as to have a semicircularly recessed cross section can be taken out. On the other hand, the anisotropic etching is applicable not only to relatively thin objects to be processed, but also to thick ones (having a thickness of 800 to 100 μm, for example). This also allows the etching to progress along a modified region in the case where a surface forming the modified region is different from the plane orientation. Hence, it enables the etching independent of the crystal orientation in addition to the etching of the surface orientation conforming to the crystal direction.

First Embodiment

The working method for cutting in accordance with the first embodiment of the present invention will now be explained.

Figure 22:
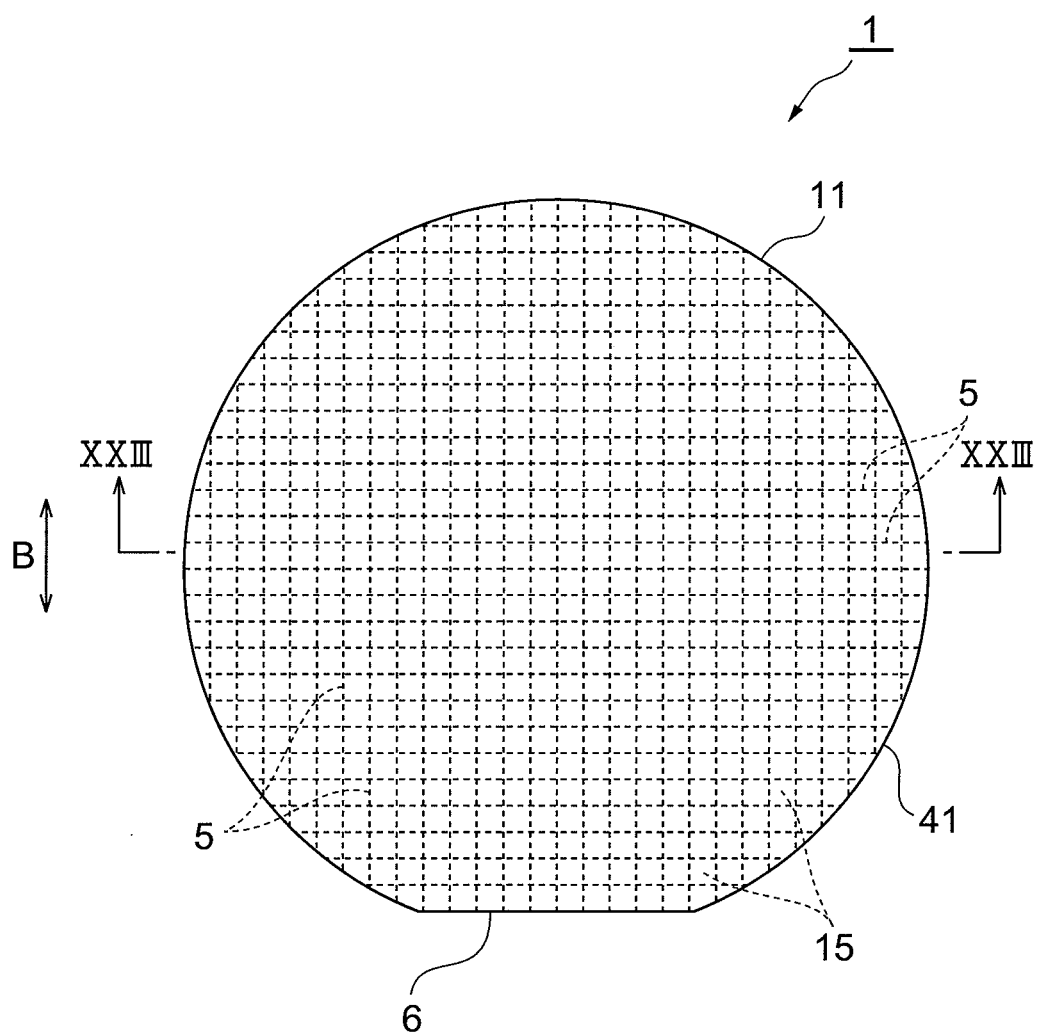
FIG. 22 is a front view illustrating an object to be processed.
Figure 23:
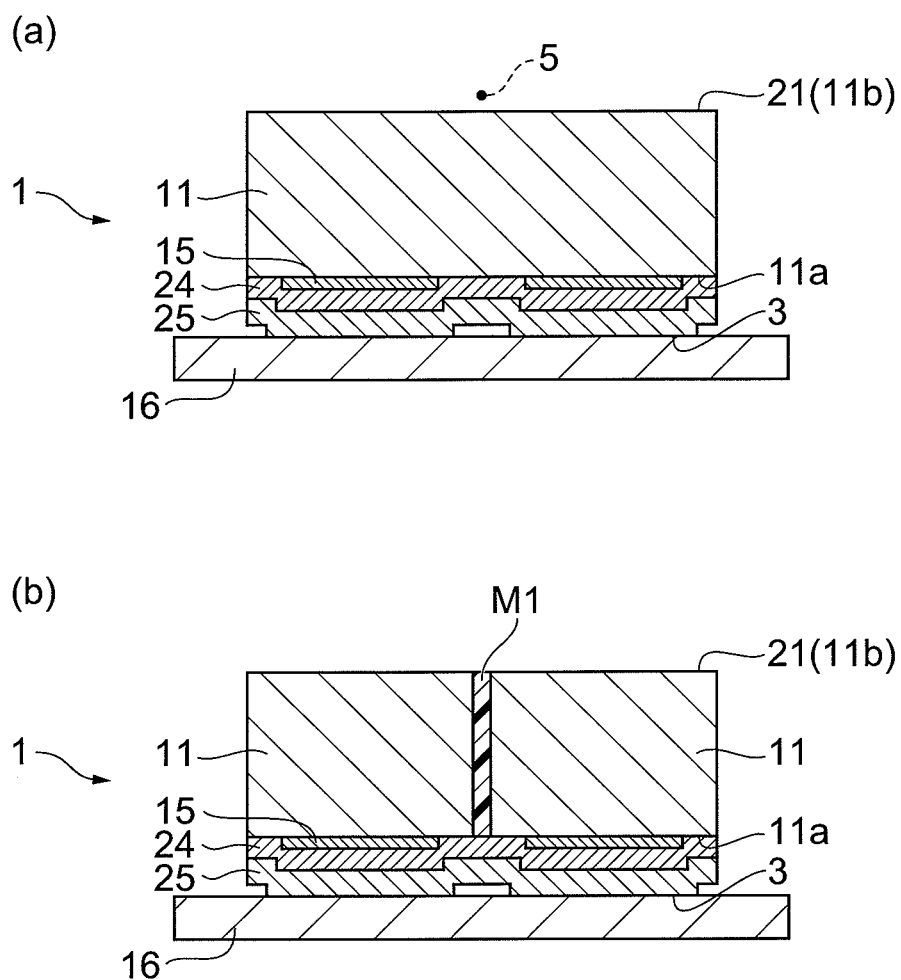
FIG. 23 is a schematic sectional view, taken along the line XXIII-XXIII of FIG. 22, for explaining the working method for cutting in accordance with a first embodiment.

As illustrated in FIGS. 22 and 23(*a*), the object to be processed 1 comprises a silicon wafer (substrate) 11 having a thickness of 300 μm and a diameter of 8 inches, a plurality of functional devices 15 (devices) formed on a front face 11*a* of the silicon wafer 11, a protective film 24 formed by $SiO_2$, for example, so as to cover the functional devices 15, and a protective film 25 formed by Sin, for example, which is resistant to the etching liquid, so as to cover the protective film 24.

The crystal plane of the front face (principal plane) 11a of the silicon wafer 11 is a (111) plane. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11. Such object 1 is cut along lines to cut 5 which are set like grids passing between the adjacent functional devices, so as to yield chips each having a chip size of 0.5 mm×0.5 mm, for example.

First, when processing the object 1, a dicing tape (holding member) 16 is attached to the front face 3 of the object 1, and the object 1 is mounted on the mount table such that the rear face 21 (the rear face 11b of the silicon wafer 11) is on the upper side as illustrated in FIG. 23(a). Subsequently, the object 1 is irradiated with laser light from the rear face 21 side thereof while locating a converging point at the object 1, whereby a modified region M1 rapidly increasing the etching rate is formed along the line to cut 5 (extending in the vertical direction of the paper sheet) as illustrated in FIG. 23(b). Specifically, the object 1 is formed with the modified region M1 extending from the front face 11a of the silicon wafer 11 to the rear face 11b (so as to be exposed at the front face 11a and rear face 11b) but failing to reach the protective film 24. Here, a fracture occurring from the modified region M1 is formed as being incorporated in the modified region M1. The incorporation of the fracture is the same in modified regions of the following embodiments which will follow.

Figure 24:
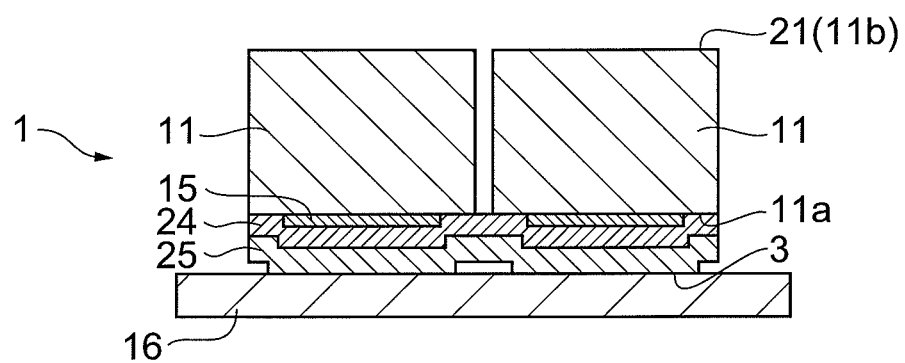
FIG. 24 is a view illustrating a sequel to FIG. 23.

Subsequently, as illustrated in FIG. 24, an etching liquid is applied from the rear face 21 side, so that the etching progresses along the modified region M1, whereby the modified region M1 is selectively etched. Then, a dicing tape 22 is transferred to the rear face 21 as illustrated in FIG. 25(a), the resulting product is turned upside down as illustrated in FIG. 25(b), and the dicing tape 16 is peeled off.

Next, as illustrated in FIG. 26(a), the dicing tape 22 is expanded (i.e., an external stress is applied along the line to cut 5), so as to divide (cut) the object 1 into chips 26, 26 and separate the chips 26, 26 from each other (secure chip intervals). Subsequently, as illustrated in FIG. 26(b), the chip 26 is taken out and then is mounted, for example, by flip-chip bonding.

As in the foregoing, the working method for cutting in accordance with this embodiment forms the modified region M1 in the object 1 along the line to cut 5 and then subjects the object 1 to the etching process, so as to allow the etching to progress along the modified region M1, whereby the object 1 can be etched selectively and rapidly along the line to cut 5 by utilizing a high etching rate (300 μmt/min here) in the modified region M1.

Conventionally known as a working method for cutting is one in which an external stress is applied to the object 1 formed with the modified region M1 along the line to cut 5, so that the object 1 is cut along the line to cut 5 from the modified region M1 acting as a start point. In this case, however, the force acting on each chip 26 becomes smaller as the size of the chip 26 is smaller (e.g., 0.5 mm×0.5 mm or less), whereby there is a possibility of undivided chips occurring as the case may be even when a tensile stress is applied to the object 1 (in the tape expanding scheme) or a bending stress is applied thereto (in the breaking scheme).

Though the object 1 may be cut by the plasma etching method, on the other hand, it is necessary to form a mask pattern for etching in this case. While there is a processing method such as the one described in Japanese Patent Application Laid-Open No. 2005-74663, for example, it is also necessary to form a mask pattern before the etching process in this case. Therefore, these cases increase the processing manhour, takt time, and cost and thus are not practical.

While the etching time has a physical limit depending on the etching rate, the etching process takes a long time when the object 1 is thick in the plasma etching method, whereby the etching may end incompletely without reliably cutting the object 1.

In the working method for cutting in accordance with this embodiment, by contrast, the etching progresses along the modified region M1, which is formed along the line to cut 5 and rapidly increases the etching rate, whereby the object 1 can be etched selectively and rapidly along the line to cut by utilizing the high etching rate in the modified region M1. Therefore, the object can be cut reliably along the line to cut even when the chip 26 has a small size, while even the thick object 1 can be etched reliably along the line to cut 5.

That is, the working method for cutting in accordance with this embodiment can easily cut ultrasmall chips which are hard to cut by applying a stress thereto in laser processing techniques. Since rapid etching is possible, the dependence of the object 1 on thickness, which has been problematic in the plasma etching method, can be overcome. Since there is no need for forming a mask pattern separately, the cost, manhour, and takt time can be reduced.

Since the modified region M1 at the cut section is substantially removed by etching, the working method for cutting in accordance with this embodiment yields a very clean cut section, thereby making it possible to reduce chipping in subsequent steps (die-bonding and packaging steps, etc.) and further improve the bending strength of the chip 26.

The object 1 is attached to the dicing tapes 16, 22 as mentioned above and thus can be prevented, from scattering after being cut. Since the chips 26, 26 are separated from each other by expanding the dicing tape 22 as mentioned above, it becomes easier to take out the chip 26 in the later steps. This effect becomes more remarkable as the chip size is smaller.

In general, there is a method of irradiating glass with laser light, so as to form a modified part, and then etching the modified part, so as to form the glass with a hole or groove. No fracture is supposed to occur from the modified part in this case. In this embodiment, by contrast, the modified region M1 is formed in the object 1 such as to generate (incorporate) a fracture as mentioned above. Therefore, the etching liquid not only infiltrates through the fracture, so that the etching progresses in the thickness direction of the object 1 (hereinafter simply referred to as "thickness direction"), but also seeps from the modified region M1 into the depicted left and right directions (directions intersecting both the thickness direction and the direction of the line to cut), thereby advancing the etching. That is, the progress of etching can be promoted from the whole area of the modified region M1 as a start point, so as to increase the etching speed. Known as examples of etching techniques for glass are Japanese Patent Application Laid-Open Nos. 2006-290630 and 2004-351494.

As mentioned above, the modified region M1 is formed in the object 1 such as to be exposed at the rear face 21 (outer surface) thereof. That is, an etching start point is exposed. Therefore, the etching liquid aggressively infiltrates into the object from the exposed modified region M1. This can inhibit the rear face 21 of the object 1 from being etched, suppress damages to the rear face 21 of the object 1, which is an etching start surface, and increase the etching speed.

Since the modified region M1 is formed such as to extend from the front face 11a of the silicon wafer 11 to the rear face 11b thereof as mentioned above, the high etching rate of the modified region M1 can be utilized over the whole surface of the object 1 in the thickness direction, whereby processing with a high cutting surface precision is possible.

When the crystal plane of the front face 11a of the silicon wafer 11 is a (111) plane, the silicon wafer 11 has a cleavage plane in a direction inclining to its thickness direction, whereby the cut section tends to tilt with respect to the thickness direction in general. By contrast, the working method for cutting in accordance with this embodiment selectively etches the object 1 along the line to cut 5, and thus can cut the object 1 such that the cut section is parallel to the thickness direction (straight in the thickness direction) even when the crystal plane of the front face 11a of the silicon wafer 11 is the (111) plane.

Though the above-mentioned explanation exemplifies a case where the object is cut into two chips 26, 26, cases where the object is cut into more chips are similar thereto (the same holds in the following embodiments).

Second Embodiment

The working method for cutting in accordance with the second embodiment of the present invention will now be explained. While omitting the same descriptions as those of the above-mentioned first embodiment, their differences will mainly be explained.

In the working method for cutting in accordance with this embodiment, after the modified region M1 is etched by the etching process (see FIG. 24), the dicing tape 16 is expanded as illustrated in FIG. 27(a), so as to divide the object 1 into the chips 26, 26 and separate the chips 26, 26 from each other. Subsequently, the dicing tape 22 is transferred to the rear face 21 of the object 1 as illustrated in FIG. 27(b), and the resulting product is turned upside down as illustrated in FIG. 27(c). Then, the dicing tape 16 is peeled off, the dicing tape 22 is expanded as illustrated in FIG. 28(a), and the chip 26 is taken out as illustrated in FIG. 28(b).

The working method for cutting in accordance with this embodiment also yields advantageous effects similar to those of the above-mentioned first embodiment. Since the dicing tape 22 is expanded after the object 1 is divided into the chips 26, 26 by expanding the dicing tape 16, the object 1 can reliably be divided into the chips 26, 26 in this embodiment.

Third Embodiment

The working method for cutting in accordance with the third embodiment of the present invention will now be explained. While omitting the same descriptions as those of the above-mentioned first embodiment, their differences will mainly be explained.

Figure 29:
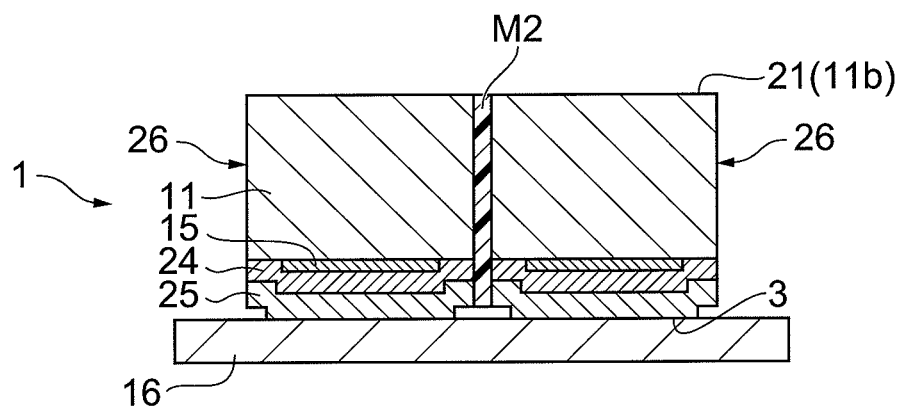
FIG. 29 is a schematic sectional view, taken along the line XXIII-XXIII of FIG. 22, for explaining the working method for cutting in accordance with a third embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M2 in the object 1 along the line to cut 5 as illustrated in FIG. 29. Specifically, the modified region M2 extending from the front face 3 of the object 1 to the rear face 21 thereof (so as to be exposed at the front face 3 and rear face 21) is formed in the object 1.

Figure 30:
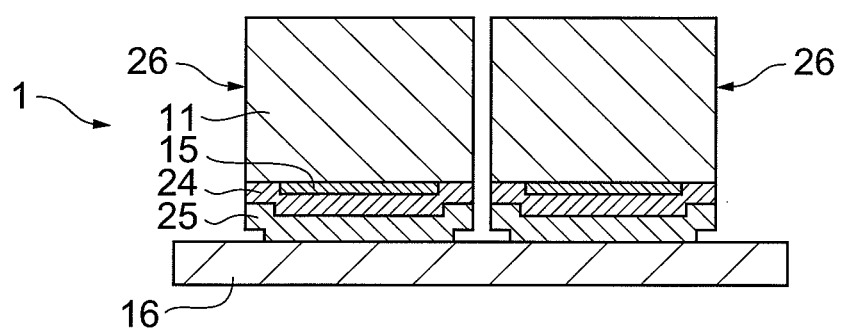
FIG. 30 is a view illustrating a sequel to FIG. 29.
Figure 32:
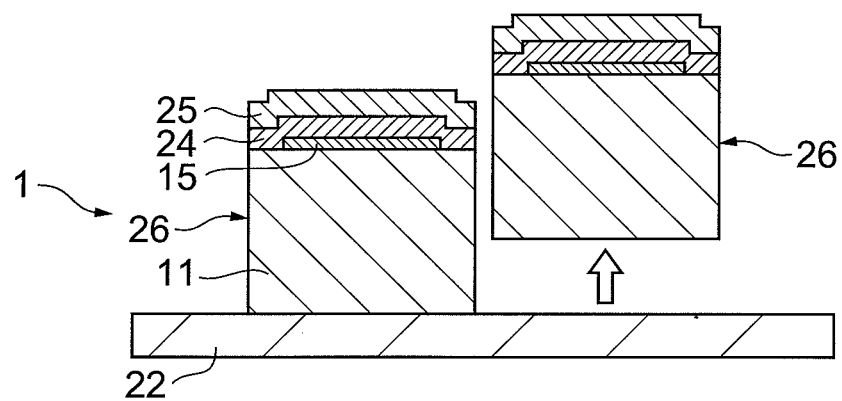
FIG. 32 is a view illustrating a sequel to FIG. 31.

Subsequently, as illustrated in FIG. 30, the etching liquid is applied from the rear face 21 side, so that the etching progresses along the modified region M2, by which the modified region M2 is etched selectively, whereby the object 1 is divided into the chips 26, 26. Then, the dicing tape 22 is transferred to the rear face 21 of the object 1 as illustrated in FIG. 31(a), and the resulting product is turned upside down as illustrated in FIG. 31(b). Thereafter, the dicing tape 16 is peeled off as illustrated in FIG. 31(c), and the chip 26 is taken out as illustrated in FIG. 32.

The working method for cutting in accordance with this embodiment also yields advantageous effects similar to those of the above-mentioned first embodiment. Since the chip 26 is taken out without expanding the dicing tape 16 as mentioned above, this embodiment can reduce takt time and process ultrasmall chips to which no external stress is applicable.

Fourth Embodiment

The working method for cutting in accordance with the fourth embodiment of the present invention will now be explained. While omitting the same descriptions as those of the above-mentioned third embodiment, their differences will mainly be explained.

In the working method for cutting in accordance with this embodiment, after peeling off the dicing tape 16 (see FIG. 31(c)), the dicing tape 22 is expanded, and the chip 26 is taken out.

The working method for cutting in accordance with this embodiment also yields advantageous effects similar to those of the above-mentioned third embodiment. Since the dicing tape 22 is expanded after the object 1 subjected to the etching process is divided into the chips 26, 26 by expanding the dicing tape 16 as mentioned above, the object 1 can reliably be divided into the chips 26, 26 in this embodiment.

Fifth Embodiment

The working method for cutting in accordance with the fifth embodiment of the present invention will now be explained. While omitting the same descriptions as those of the above-mentioned third embodiment, their differences will mainly be explained.

In the working method for cutting in accordance with this embodiment, after etching the modified region M2 (see FIG. 29), the dicing tape 16 is expanded as illustrated in FIG. 33(a), so as to divide the object 1 into the chips 26, 26 and separate the chips 26, 26 from each other. Subsequently, the dicing tape 22 is transferred to the rear face 21 of the object 1 as illustrated in FIG. 33(b), and the resulting product is turned upside down as illustrated in FIG. 33(c). Then, the dicing tape 16 is peeled off, the dicing tape 22 is expanded, and the chip 26 is taken out.

The working method for cutting in accordance with this embodiment also yields advantageous effects similar to those of the above-mentioned third embodiment. Since the dicing tape 16 is expanded after the etching process and then the dicing tape 22 is expanded as mentioned above, the object 1 can be divided into the chips 26, 26 more reliably in this embodiment.

Sixth Embodiment

The working method for cutting in accordance with the sixth embodiment of the present invention will now be explained. While omitting the same descriptions as those of the above-mentioned third embodiment, their differences will mainly be explained.

Figure 34:
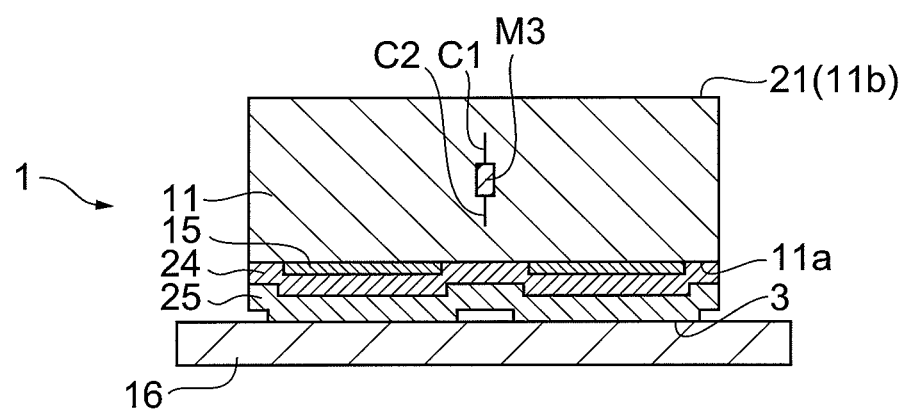
FIG. 34 is a schematic sectional view, taken along the line XXIII-XXIII of FIG. 22, for explaining the working method for cutting in accordance with a sixth embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M3 in the object 1 along the line to cut 5 as illustrated in FIG. 34. Specifically, the modified region M3 is formed within the silicon wafer 11 (at substantially the center thereof in the thickness direction), while fractures C1, C2 extending in the thickness direction are generated from the modified region M3. Here, the fractures C1, C2 fall short of reaching the rear face 21 of the object 1 and the front face 11a of the silicon wafer 11, respectively.

Figure 35:
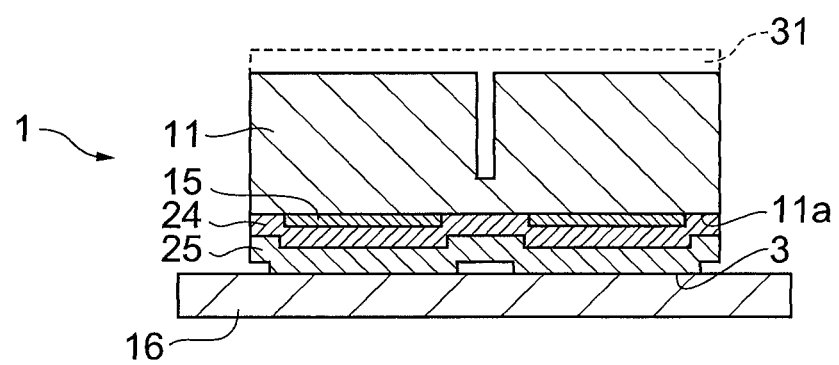
FIG. 35 is a view illustrating a sequel to FIG. 34.

Subsequently, the etching liquid is applied from the rear face 21 side, so that a region 31 on the rear face 21 side of the object 1 is etched away as illustrated in FIG. 35. Then, the etching progresses in the fracture C1, modified region M3, and fracture C2 in this order, whereby the fractures C1, C2 and modified region M3 are selectively etched. Thereafter, the dicing tape 22 is transferred to the etched rear face 21 as illustrated in FIG. 36(a), the resulting product is turned upside down as illustrated in FIG. 36(b), and the dicing tape 16 is peeled off as illustrated in FIG. 36(c). Subsequently, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned first embodiment. In this embodiment, since the fractures C1, C2 vertically extending in the thickness direction are formed as mentioned above, the object can be cut while causing the etching liquid to infiltrate through the fractures C1, C2, whereby the cutting speed can be increased. Since there is no full cut (i.e., none of the modified region and fractures is exposed at the front face 3 and rear face 21 of the object), the dicing tapes 16, 22 can easily be reattached.

In this embodiment, since none of the modified region M3 and fractures C1, C2 is exposed at the rear face 21 of the object 1 as mentioned above, Si, device surface materials, and the like can be inhibited from dispersing over the surroundings, whereby ambient contamination can be suppressed. Also, since the modified region M3 and fractures C1, C2 are thus kept from being exposed at the rear face 21, the object 1 formed with the modified region M3 is relatively hard to break and excellent in transportability.

By controlling the length in the thickness direction of the modified region M3 to be formed, this embodiment can regulate the amount of etching in regions (e.g., region 31), other than the modified region, in lateral directions and the like.

Seventh Embodiment

The working method for cutting in accordance with the seventh embodiment of the present invention will now be explained. While omitting the same descriptions as those of the above-mentioned sixth embodiment, their differences will mainly be explained.

Figure 37:
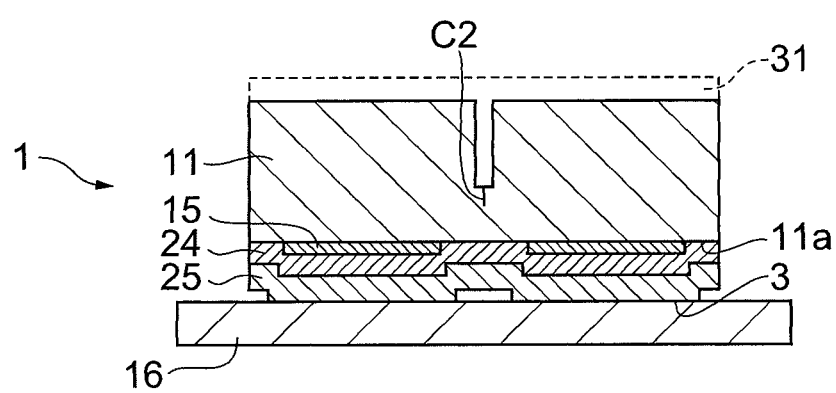
FIG. 37 is a schematic sectional view, taken along the line XXIII-XXIII of FIG. 22, for explaining the working method for cutting in accordance with a seventh embodiment.

In the working method for cutting in accordance with this embodiment, after the modified region M3 having the fractures C1, C2 is formed in the object 1 (see FIG. 36), the etching liquid is applied from the rear face 21 side, and the region 31 on the rear face 21 side of the object 1 is etched away as illustrated in FIG. 37. Then, the etching progresses in the fracture C1 and modified region M3 in this order, whereby the fracture C1 and modified region M3 are selectively etched.

Here, the object 1 is arranged in such an orientation that the front face 3 of the object 1 is positioned higher than the rear face 21 (the dicing tape 16 is on the upper side), and the etching liquid is applied thereto such as to spout up from the lower side, whereby the fracture C2 remains without being etched. Such an etching liquid coating method is similarly carried out when leaving a fracture in the following embodiments.

Subsequently, the dicing tape 22 is transferred to the etched rear face 21 as illustrated in FIG. 38(a), the resulting product is turned upside down as illustrated in FIG. 38(b), and the dicing tape 16 is peeled off as illustrated in FIG. 38(c). Then, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned sixth embodiment.

Eighth Embodiment

The working method for cutting in accordance with the eighth embodiment of the present invention will now be explained. While omitting the same descriptions as those of the above-mentioned sixth embodiment, their differences will mainly be explained.

Figure 39:
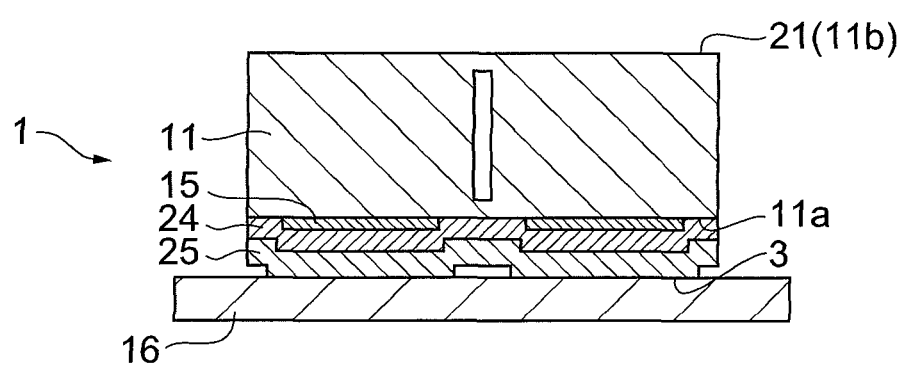
FIG. 39 is a schematic sectional view, taken along the line XXIII-XXIII of FIG. 22, for explaining the working method for cutting in accordance with an eighth embodiment.

In the working method for cutting in accordance with this embodiment, after the modified region M3 having the fractures C1, C2 is formed in the object 1 (see FIG. 36), the etching liquid is applied from the outer peripheral face 41 side of the object 1 (see FIG. 22), so that the fractures C1, C2 and modified region M3 are selectively etched as illustrated in FIG. 39. The modified region formed along the line to cut 5 is exposed at the outer peripheral face 41 of the object 1, i.e., an end of the line to cut 5, and the etching is carried out by utilizing thus exposed modified region.

Subsequently, the dicing tape 22 is transferred to the etched rear face 21 as illustrated in FIG. 40(a), the resulting product is turned upside down as illustrated in FIG. 40(b), and the dicing tape 16 is peeled off as illustrated in FIG. 40(c). Then, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned sixth embodiment. In this embodiment, the etching process is carried out from the outer peripheral face 41 side of the object 1 as mentioned above. That is, a start point for the etching process is regulated, so that the etching liquid aggressively infiltrates into the object. This can inhibit the rear face 21 side of the object 1 from being etched, suppress damages to the rear face 21 side of the object 1, and increase the etching speed.

Ninth Embodiment

The working method for cutting in accordance with the ninth embodiment of the present invention will now be explained. While omitting the same descriptions as those of the above-mentioned sixth embodiment, their differences will mainly be explained.

Figure 41:
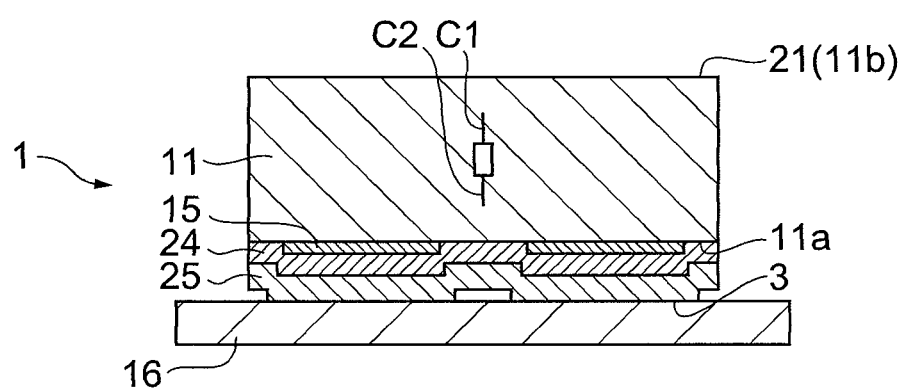
FIG. 41 is a schematic sectional view, taken along the line XXIII-XXIII of FIG. 22, for explaining the working method for cutting in accordance with a ninth embodiment.

In the working method for cutting in accordance with this embodiment, after the modified region M3 having the fractures C1, C2 is formed in the object 1 (see FIG. 36), the etching liquid is applied from the outer peripheral face 41 side of the object 1, so that the modified region M3 is selectively etched as illustrated in FIG. 41. Here, the fractures C1, C2 remain without being etched.

Subsequently, the dicing tape 22 is transferred to the etched rear face 21 as illustrated in FIG. 42(a), the resulting product is turned upside down as illustrated in FIG. 42(b), and the dicing tape 16 is peeled off as illustrated in FIG. 42(c). Then, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned sixth embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Tenth Embodiment

The working method for cutting in accordance with the tenth embodiment of the present invention will now be explained. While omitting the same descriptions as those of the above-mentioned first embodiment, their differences will mainly be explained.

Figure 43:
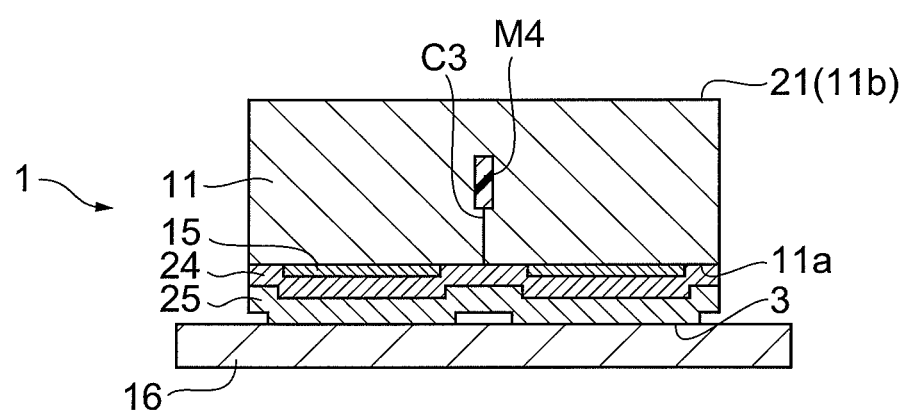
FIG. 43 is a schematic sectional view, taken along the line XXIII-XXIII of FIG. 22, for explaining the working method for cutting in accordance with a tenth embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M4 in the object 1 along the line to cut 5 as illustrated in FIG. 43. Specifically, the modified region M4 is formed within the silicon wafer 11 (at substantially the center thereof in the thickness direction), while a fracture C3 extending in the thickness direction and being exposed at the front face 11a of the silicon wafer 11 is generated from the modified region M4.

Figure 44:
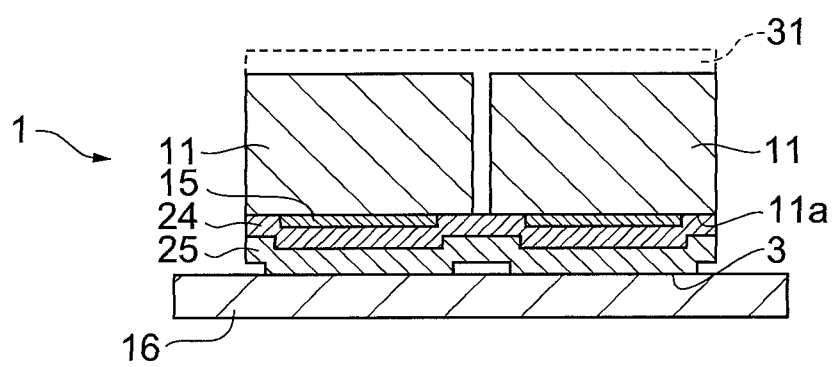
FIG. 44 is a view illustrating a sequel to FIG. 43.

Subsequently, the etching liquid is applied from the rear face 21 side of the object 1, so that the region 31 on the rear face 21 side of the object 1 is etched away as illustrated in FIG. 44. Then, the etching progresses in the modified region M4 and fracture C3 in this order, whereby the modified region M4 and fracture C3 are selectively etched. Thereafter, the dicing tape 22 is transferred to the etched rear face 21 as illustrated in FIG. 45(a), the resulting product is turned upside down as illustrated in FIG. 45(b), the dicing tape 16 is peeled off as illustrated in FIG. 45(c), and the chip 26 is taken out.

The working method for cutting in accordance with this embodiment also yields advantageous effects similar to those of the above-mentioned first embodiment. In this embodiment, since the fracture C3 exposed at the front face 11a of the silicon wafer 11 is formed as mentioned above, the object can be cut while causing the etching liquid to infiltrate through the fracture C3, whereby the cutting speed can be increased.

In this embodiment, since the modified region M4 and fracture C3 are not exposed at the rear face 21 of the object 1 as mentioned above, Si, device surface materials, and the like can be inhibited from dispersing over the surroundings, whereby ambient contamination can be suppressed. Also, since the modified region M4 and fracture C3 are thus kept from being exposed at the rear face 21, the object 1 formed with the modified region M4 is relatively hard to break and excellent in transportability.

By controlling the length in the thickness direction of the modified region M4 to be formed, this embodiment can regulate the amount of etching in regions, other than the modified region, in lateral directions and the like.

Also, since the chip 26 is taken out without expanding the dicing tape 16 as mentioned above, this embodiment can reduce takt time and process ultrasmall chips to which no external stress is applicable.

Eleventh Embodiment

The working method for cutting in accordance with the eleventh embodiment of the present invention will now be explained. While omitting the same descriptions as those of the above-mentioned tenth embodiment, their differences will mainly be explained.

In the working method for cutting in accordance with this embodiment, after peeling off the dicing tape 16 from the rear face 21 of the object 1 (see FIG. 45(c)), the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned tenth embodiment. Since this embodiment divides the object 1 into the chips 26, 26 not only by the etching process but also by expanding the dicing tape 22 as mentioned above, the object 1 can reliably be divided into the chips 26, 26.

Twelfth Embodiment

The working method for cutting in accordance with the twelfth embodiment of the present invention will now be explained. While omitting the same descriptions as those of the above-mentioned tenth embodiment, their differences will mainly be explained.

Figure 46:
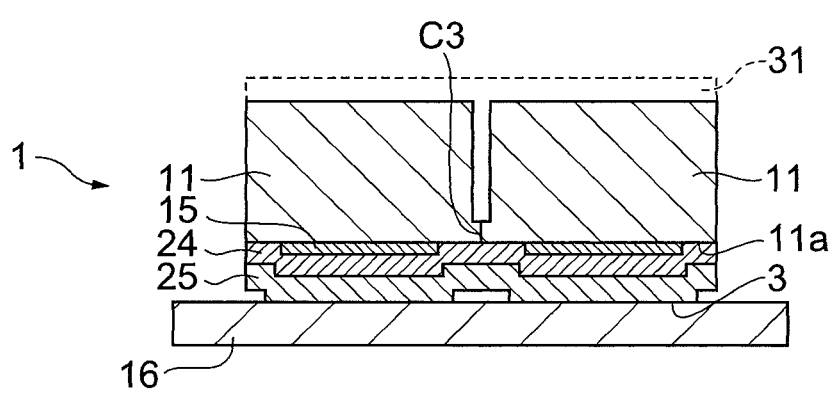
FIG. 46 is a schematic sectional view, taken along the line XXIII-XXIII of FIG. 22, for explaining the working method for cutting in accordance with a twelfth embodiment.

In the working method for cutting in accordance with this embodiment, after the modified region M4 having the fracture C3 is formed in the object 1 (see FIG. 43), the etching liquid is applied from the rear face 21 side, so that the region 31 on the rear face 21 side of the object 1 is etched away as illustrated in FIG. 46. Then, the etching progresses along the modified region M4, whereby the modified region M4 is selectively etched. Here, the fracture C3 remains without being etched.

Thereafter, the dicing tape 22 is transferred to the etched rear face 21 as illustrated in FIG. 47(a), the resulting product is turned upside down as illustrated in FIG. 47(b), and the dicing tape 16 is peeled off as illustrated in FIG. 47(c). Subsequently, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned tenth embodiment. Since this embodiment divides the object 1 into the chips 26, 26 not only by the etching process but also by expanding the dicing tape 22 as mentioned above, the object 1 can reliably be divided into the chips 26, 26.

Thirteenth Embodiment

The working method for cutting in accordance with the thirteenth embodiment of the present invention will now be explained. While omitting the same descriptions as those of the above-mentioned tenth embodiment, their differences will mainly be explained.

Figure 48:
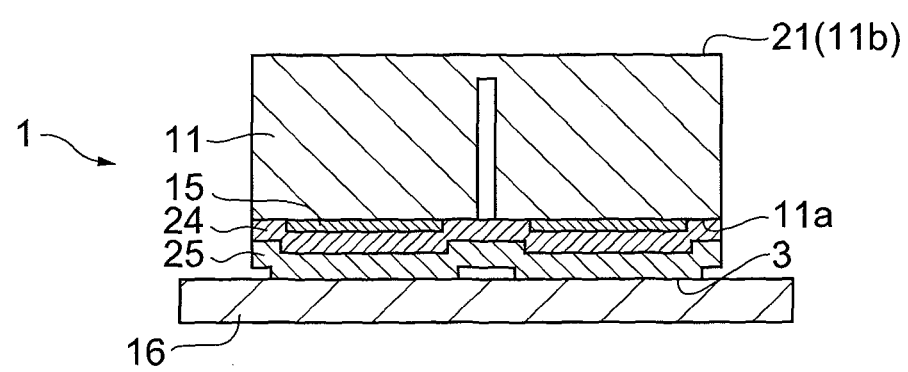
FIG. 48 is a schematic sectional view, taken along the line XXIII-XXIII of FIG. 22, for explaining the working method for cutting in accordance with a thirteenth embodiment.

In the working method for cutting in accordance with this embodiment, after the modified region M4 having the fracture C3 is formed in the object 1 (see FIG. 43), the etching liquid is applied from the outer peripheral face 41 side, so that the modified region M4 and fracture C3 are selectively etched as illustrated in FIG. 48. Subsequently, the dicing tape 22 is transferred to the etched rear face 21 as illustrated in FIG. 49(a), the resulting product is turned upside down as illustrated in FIG. 49(b), and the dicing tape 16 is peeled off as illustrated in FIG. 49(c). Then, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned tenth embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Since this embodiment divides the object 1 into the chips 26, 26 not only by the etching process but also by expanding the dicing tape 22 as mentioned above, the object 1 can reliably be divided into the chips 26, 26.

Fourteenth Embodiment

The working method for cutting in accordance with the fourteenth embodiment of the present invention will now be explained. While omitting the same descriptions as those of the above-mentioned thirteenth embodiment, their differences will mainly be explained.

In the working method for cutting in accordance with this embodiment, after peeling off the dicing tape 16 from the rear face 21 of the object 1 (see FIG. 49(c)), a breaking device 32 such as a knife edge is pressed against the object 1 along the line to cut 5 from under the dicing tape 22 while the dicing tape 22 is expanded as illustrated in FIG. 50(a). This divides the object 1 into the chips 26, 26 and separates the chips 26, 26 from each other. Then, as illustrated in FIG. 50(b), the chip 26 is taken out.

The working method for cutting in accordance with this embodiment also yields advantageous effects similar to those of the above-mentioned tenth embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Since this embodiment divides the object 1 into the chips 26, 26 by pressing the breaking device 32 thereto as mentioned above, the object 1 can be divided into the chips 26, 26 more reliably.

Fifteenth Embodiment

The working method for cutting in accordance with the fifteenth embodiment of the present invention will now be explained. While omitting the same descriptions as those of the above-mentioned tenth embodiment, their differences will mainly be explained.

Figure 51:
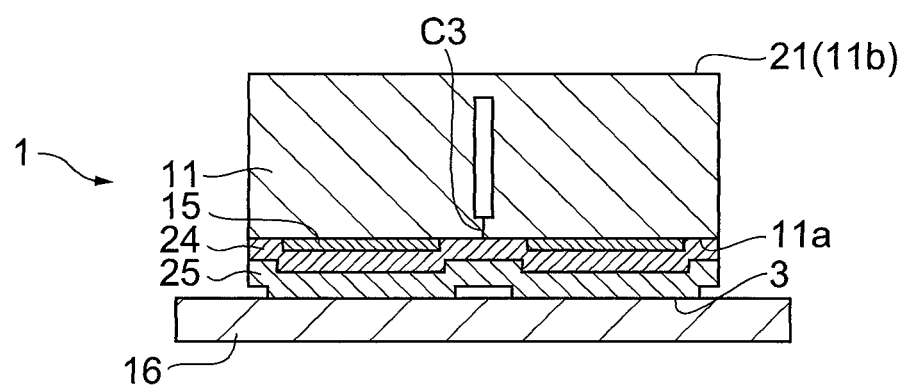
FIG. 51 is a schematic sectional view, taken along the line XXIII-XXIII of FIG. 22, for explaining the working method for cutting in accordance with a fifteenth embodiment.

In the working method for cutting in accordance with this embodiment, after the modified region M4 having the fracture C3 is formed in the object 1 (see FIG. 43), the etching liquid is applied from the outer peripheral face 41 side, so that the modified region M4 is selectively etched as illustrated in FIG. 51. Here, the fracture C3 remains without being etched. Subsequently, the dicing tape 22 is transferred to the etched rear face 21 as illustrated in FIG. 52(a), the resulting product is turned upside down as illustrated in FIG. 52(b), and the dicing tape 16 is peeled off as illustrated in FIG. 52(c). Then, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned tenth embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Since this embodiment divides the object 1 into the chips 26, 26 not only by the etching process but also by expanding the dicing tape 22 as mentioned above, the object 1 can reliably be divided into the chips 26, 26.

Sixteenth Embodiment

The working method for cutting in accordance with the sixteenth embodiment of the present invention will now be explained. While omitting the same descriptions as those of the above-mentioned fifteenth embodiment, their differences will mainly be explained.

In the working method for cutting in accordance with this embodiment, after peeling off the dicing tape 16 from the rear face 21 of the object 1 (see FIG. 52(c)), the breaking device 32 such as a knife edge is pressed against the object 1 along the line to cut 5 from under the dicing tape 22 while the dicing tape 22 is expanded. This divides the object 1 into the chips 26, 26 and separates the chips 26, 26 from each other. Then, the chip 26 is taken out.

The working method for cutting in accordance with this embodiment also yields advantageous effects similar to those of the above-mentioned tenth embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Since this embodiment divides the object 1 into the chips 26, 26 by pressing the breaking device 32 thereto as mentioned above, the object 1 can be divided into the chips 26, 26 more reliably.

Seventeenth Embodiment

The working method for cutting in accordance with the seventeenth embodiment of the present invention will now be explained. While omitting the same descriptions as those of the above-mentioned first embodiment, their differences will mainly be explained.

Figure 53:
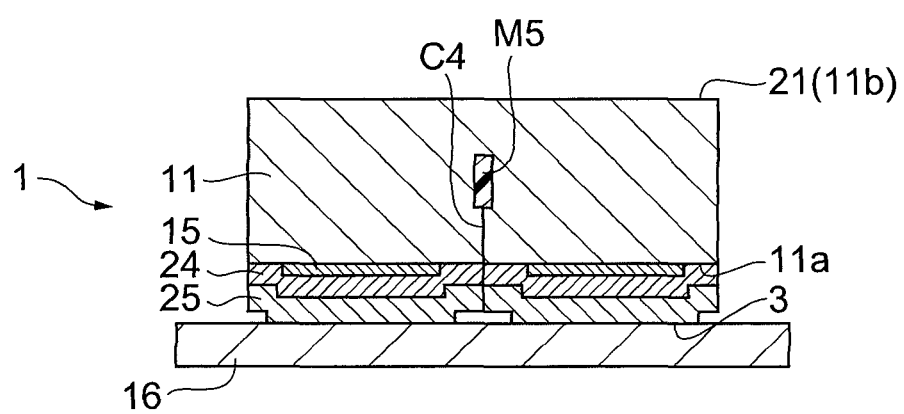
FIG. 53 is a schematic sectional view, taken along the line XXIII-XXIII of FIG. 22, for explaining the working method for cutting in accordance with a seventeenth embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M5 in the object 1 along the line to cut 5 as illustrated in FIG. 53. Specifically, the modified region M5 is formed within the silicon wafer 11 (at substantially the center thereof in the thickness direction), while a fracture C4 extending in the thickness direction and being exposed at the front face 3 of the object 1 is generated from the modified region M5.

Figure 54:
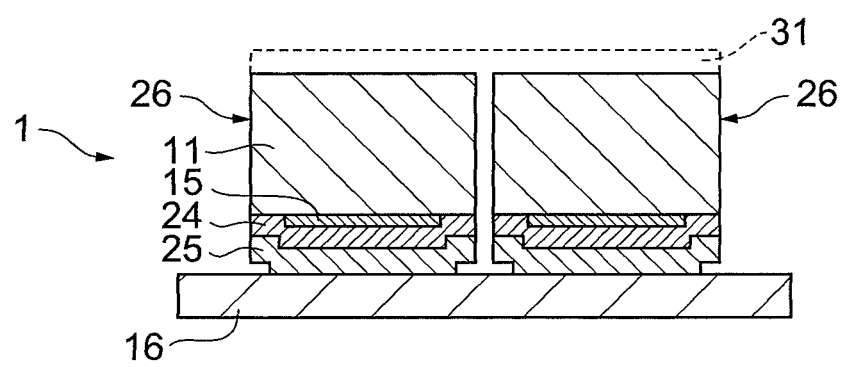
FIG. 54 is a view illustrating a sequel to FIG. 53.

Subsequently, the etching liquid is applied from the rear face 21 side of the object 1, so that the region 31 on the rear face 21 side of the object 1 is etched away as illustrated in FIG. 54. Then, the etching progresses in the modified region M5 and fracture C4 in this order, whereby the modified region M5 and fracture C4 are selectively etched. Thereafter, the dicing tape 22 is transferred to the etched rear face 21 as illustrated in FIG. 55(a), the resulting product is turned upside down as illustrated in FIG. 55(b), the dicing tape 16 is peeled off as illustrated in FIG. 55(c), and the chip 26 is taken out.

The working method for cutting in accordance with this embodiment also yields advantageous effects similar to those of the above-mentioned first embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

In this embodiment, since the fracture C4 is formed as mentioned above, the object can be cut while causing the etching liquid to infiltrate through the fracture C4, whereby the cutting speed can be increased.

In this embodiment, since the modified region M5 and fracture C4 are not exposed at the rear face 21 of the object 1 as mentioned above, Si, device surface materials, and the like can be inhibited from dispersing over the surroundings, whereby ambient contamination can be suppressed. Also, since the modified region M5 and fracture C4 are thus kept from being exposed at the rear face 21, the object 1 formed with the modified region M5 is relatively hard to break and excellent in transportability.

By controlling the length in the thickness direction of the modified region M5 to be formed, this embodiment can regulate the amount of etching in regions, other than the modified region, in lateral directions and the like.

Also, since the chip 26 is taken out without expanding the dicing tape 16 as mentioned above, this embodiment can reduce takt time.

Eighteenth Embodiment

The working method for cutting in accordance with the eighteenth embodiment of the present invention will now be explained. While omitting the same descriptions as those of the above-mentioned seventeenth embodiment, their differences will mainly be explained.

In the working method for cutting in accordance with this embodiment, after peeling off the dicing tape 16 from the rear face 21 of the object 1 (see FIG. 55(c)), the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned seventeenth embodiment. Since this embodiment divides the object 1 into the chips 26, 26 not only by the etching process but also by expanding the dicing tape 22 as mentioned above, the object 1 can reliably be divided into the chips 26, 26.

Nineteenth Embodiment

The working method for cutting in accordance with the nineteenth embodiment of the present invention will now be explained. While omitting the same descriptions as those of the above-mentioned seventeenth embodiment, their differences will mainly be explained.

Figure 56:
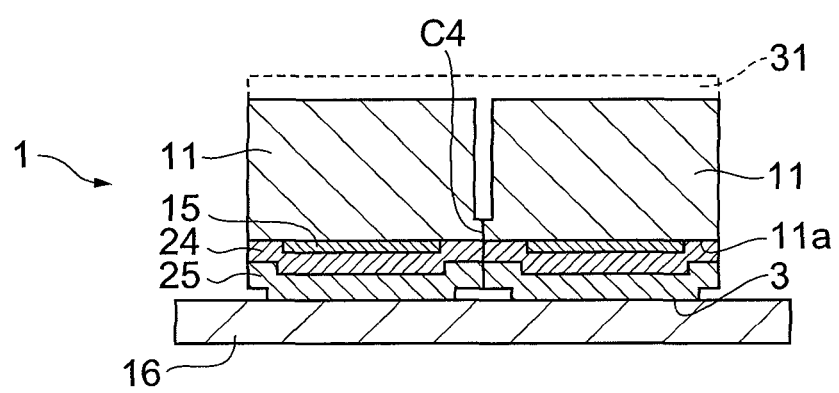
FIG. 56 is a schematic sectional view, taken along the line XXIII-XXIII of FIG. 22, for explaining the working method for cutting in accordance with a nineteenth embodiment.

In the working method for cutting in accordance with this embodiment, after the modified region M5 having the fracture C4 is formed in the object 1 (see FIG. 53), the etching liquid is applied from the rear face 21 side, so that the region 31 on the rear face 21 side of the object 1 is etched away as illustrated in FIG. 56. Then, the etching progresses along the modified region M5, whereby the modified region M5 is selectively etched. Here, the fracture C4 remains without being etched.

Thereafter, the dicing tape 22 is transferred to the etched rear face 21 as illustrated in FIG. 57(a), the resulting product is turned upside down as illustrated in FIG. 57(b), and the dicing tape 16 is peeled off as illustrated in FIG. 57(c). Subsequently, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned seventeenth embodiment. Since this embodiment divides the object 1 into the chips 26, 26 by expanding the dicing tape 22 as mentioned above, the object 1 can reliably be divided into the chips 26, 26.

Twentieth Embodiment

The working method for cutting in accordance with the twentieth embodiment of the present invention will now be explained. While omitting the same descriptions as those of the above-mentioned seventeenth embodiment, their differences will mainly be explained.

Figure 58:
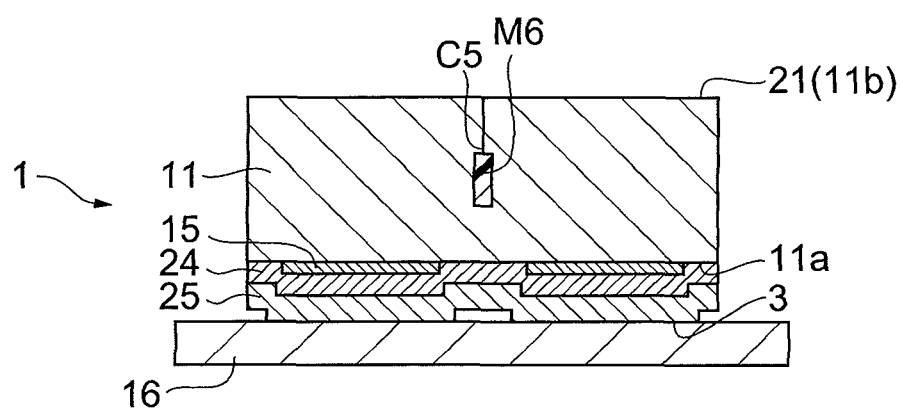
FIG. 58 is a schematic sectional view, taken along the line XXIII-XXIII of FIG. 22, for explaining the working method for cutting in accordance with a twentieth embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M6 in the object 1 along the line to cut 5 as illustrated in FIG. 58. Specifically, the modified region M6 is formed within the silicon wafer 11 (at substantially the center thereof in the thickness direction), while a fracture (half cut) C5 extending in the thickness direction and being exposed at the rear face 21 of the object 1 is generated from the modified region M6.

Figure 59:
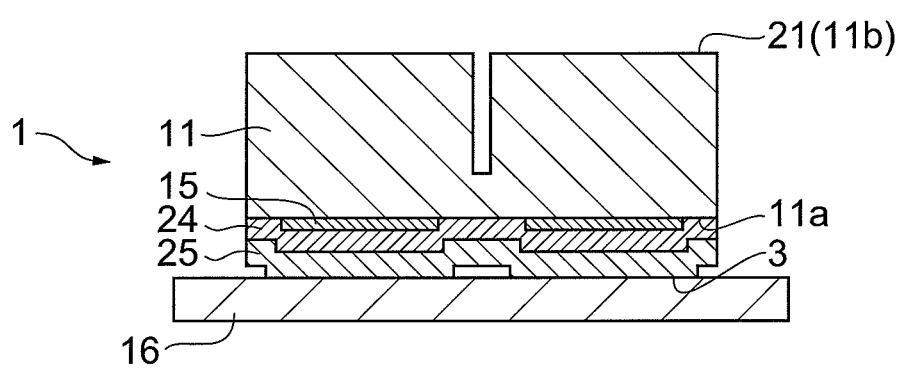
FIG. 59 is a view illustrating a sequel to FIG. 58.

Subsequently, as illustrated in FIG. 59, the etching liquid is applied from the rear face 21 side, so that etching with the etching liquid progresses in the fracture C5 and modified region M6 in this order, whereby the fracture C5 and modified region M6 are selectively etched. Then, the dicing tape 22 is transferred to the etched rear face 21 as illustrated in FIG. 60(a), the resulting product is turned upside down as illustrated in FIG. 60(b), and the dicing tape 16 is peeled off as illustrated in FIG. 60(c). Thereafter, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned first embodiment. In this embodiment, since the fracture C5 is formed as mentioned above, the object can be cut while causing the etching liquid to infiltrate through the fracture C5, whereby the cutting speed can be increased.

As mentioned above, the fracture C5 is exposed at the rear face 21 of the object 1, i.e., an etching start point is exposed. Therefore, the etching liquid aggressively infiltrates into the object 1 through the exposed fracture C5. This can inhibit the rear face 21 of the object 1 from being etched, suppress damages to the rear face 21 of the object 1, and increase the etching speed.

By controlling the length in the thickness direction of the modified region M6 to be formed, this embodiment can regulate the amount of etching in regions, other than the modified region, in the depicted lateral directions and the like.

Twenty-First Embodiment

The working method for cutting in accordance with the twenty-first embodiment of the present invention will now be explained. While omitting the same descriptions as those of the above-mentioned twentieth embodiment, their differences will mainly be explained.

In the working method for cutting in accordance with this embodiment, after the fracture C5 and modified region M6 are etched by the etching process (see FIG. 59), the dicing tape 16 is expanded as illustrated in FIG. 61(a), so as to divide the object 1 into the chips 26, 26 and separate the chips 26, 26 from each other. Subsequently, the dicing tape 22 is transferred to the rear face 21 of the object 1 as illustrated in FIG. 61(b), and the resulting product is turned upside down as illustrated in FIG. 61(c). Then, the dicing tape 16 is peeled off, the dicing tape 22 is expanded, and the chip 26 is taken out.

The working method for cutting in accordance with this embodiment also yields advantageous effects similar to those of the above-mentioned twentieth embodiment. Since the dicing tape 22 is expanded after the object 1 is divided into the chips 26, 26 by expanding the dicing tape 16, the object 1 can reliably be divided into the chips 26, 26 in this embodiment.

Twenty-Second Embodiment

The working method for cutting in accordance with the twenty-second embodiment of the present invention will now be explained. While omitting the same descriptions as those of the above-mentioned twentieth embodiment, their differences will mainly be explained.

In the working method for cutting in accordance with this embodiment, after etching the fracture C5 and modified region M6 by the etching process (see FIG. 59), the breaking device 32 such as a knife edge is pressed against the object 1 along the line to cut 5 from under the dicing tape 16 while the dicing tape 16 is expanded as illustrated in FIG. 62(a). This divides the object 1 into the chips 26, 26 and separates the chips 26, 26 from each other. Subsequently, the dicing tape 22 is transferred to the rear face 21 of the object 1 as illustrated in FIG. 62(b), and the resulting product is turned upside down as illustrated in FIG. 62(c). Then, the dicing tape 16 is peeled off, the dicing tape 22 is expanded, and the chip 26 is taken out.

The working method for cutting in accordance with this embodiment also yields advantageous effects similar to those of the above-mentioned twentieth embodiment. Since the dicing tape 22 is expanded after the object 1 is divided into the chips 26, 26 by the dicing tape 16 and breaking device 32, the object 1 can reliably be divided into the chips 26, 26 in this embodiment. Since this embodiment divides the object 1 into the chips 26, 26 by pressing the breaking device 32 thereto as mentioned above, the object 1 can be divided into the chips 26, 26 more reliably.

Twenty-Third Embodiment

The working method for cutting in accordance with the twenty-third embodiment of the present invention will now be explained. While omitting the same descriptions as those of the above-mentioned first embodiment, their differences will mainly be explained.

Figure 63:
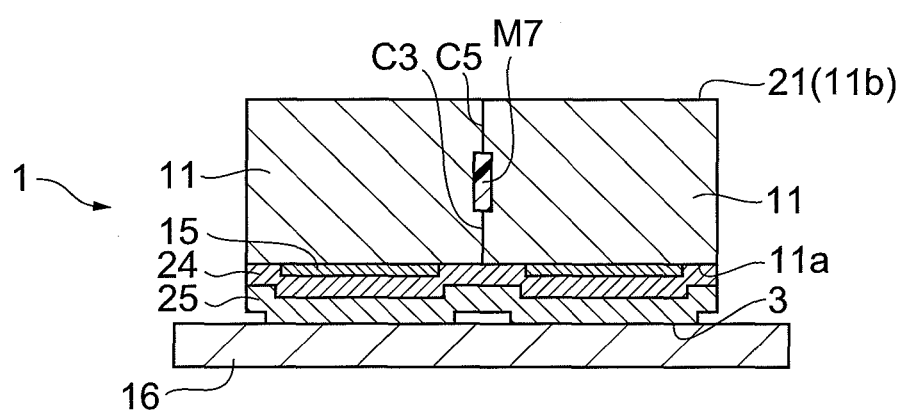
FIG. 63 is a schematic sectional view, taken along the line XXIII-XXIII of FIG. 22, for explaining the working method for cutting in accordance with a twenty-third embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M7 in the object 1 along the line to cut 5 as illustrated in FIG. 63. Specifically, the modified region M7 is formed within the silicon wafer 11 (at substantially the center thereof in the thickness direction). Also, a fracture C5 extending in the thickness direction and being exposed at the rear face 21 of the object 1 and a fracture C3 extending in the thickness direction and being exposed at the front face 11a of the silicon wafer 11 are generated from the modified region M7.

Figure 64:
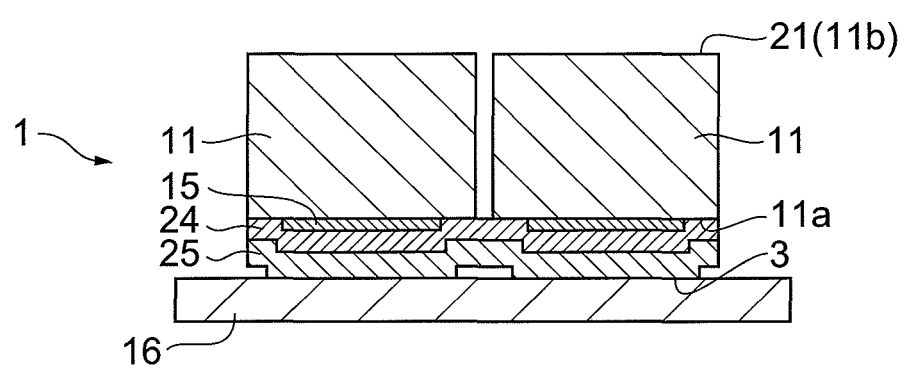
FIG. 64 is a view illustrating a sequel to FIG. 63.

Subsequently, as illustrated in FIG. 64, the etching liquid is applied from the rear face 21 side, so that the etching progresses in the fracture C5, modified region M7, and fracture C3 in this order, whereby the fractures C5, C3 and modified region M7 are selectively etched. Then, the dicing tape 22 is transferred to the rear face 21 of the object 1 as illustrated in FIG. 65(a), the resulting product is turned upside down as illustrated in FIG. 65(b), and the dicing tape 16 is peeled off as illustrated in FIG. 65(c). Thereafter, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned first embodiment. In this embodiment, since the fractures C5, C3 are formed as mentioned above, the object can be cut while causing the etching liquid to infiltrate through the fractures C5, C3, whereby the cutting speed can be increased.

As mentioned above, the fracture C5 is exposed at the rear face 21 of the object 1, i.e., an etching start point is exposed. Therefore, the etching liquid aggressively infiltrates into the object 1 through the exposed fracture C5. This can inhibit the rear face 21 of the object 1 from being etched, suppress damages to the rear face 21 of the object 1, and increase the etching speed.

By controlling the length in the thickness direction of the modified region M7 to be formed, this embodiment can regulate the amount of etching in regions, other than the modified region, in the depicted lateral directions and the like.

Twenty-Fourth Embodiment

The working method for cutting in accordance with the twenty-third embodiment of the present invention will now be explained. While omitting the same descriptions as those of the above-mentioned twenty-third embodiment, their differences will mainly be explained.

In the working method for cutting in accordance with this embodiment, after the fracture C5 and modified region M7 are etched by the etching process (see FIG. 64), the dicing tape 16 is expanded as illustrated in FIG. 66(a), so as to divide the object 1 into the chips 26, 26 and separate the chips 26, 26 from each other. Subsequently, the dicing tape 22 is transferred to the rear face 21 of the object 1 as illustrated in FIG. 66(b), and the resulting product is turned upside down as illustrated in FIG. 66(c). Then, the dicing tape 16 is peeled off, the dicing tape 22 is expanded, and the chip 26 is taken out.

The working method for cutting in accordance with this embodiment also yields advantageous effects similar to those of the above-mentioned twenty-third embodiment. Since the dicing tape 22 is expanded after the object 1 is divided into the chips 26, 26 by expanding the dicing tape 16, the object 1 can reliably be divided into the chips 26, 26 in this embodiment.

Twenty-Fifth Embodiment

The working method for cutting in accordance with the twenty-fifth embodiment of the present invention will now be explained. While omitting the same descriptions as those of the above-mentioned first embodiment, their differences will mainly be explained.

Figure 67:
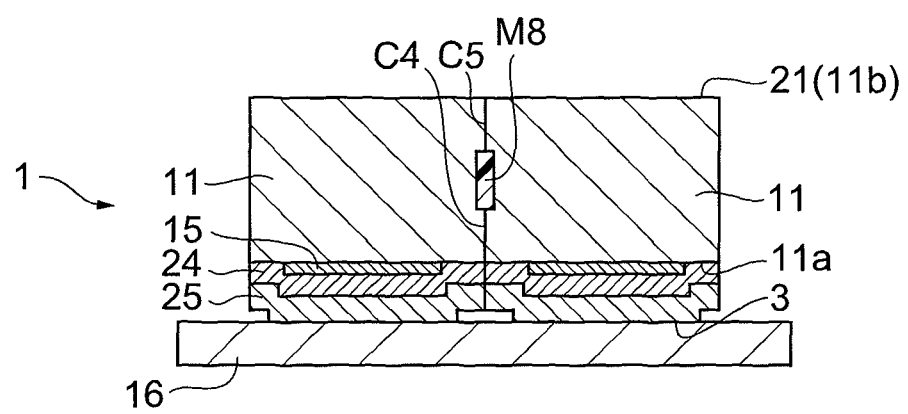
FIG. 67 is a schematic sectional view, taken along the line XXIII-XXIII of FIG. 22, for explaining the working method for cutting in accordance with a twenty-fifth embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M8 in the object 1 along the line to cut 5 as illustrated in FIG. 67. Specifically, the modified region M8 is formed within the silicon wafer 11 (at substantially the center thereof in the thickness direction). Also, a fracture C5 extending in the thickness direction and being exposed at the rear face 21 of the object 1 and a fracture C4 extending in the thickness direction and being exposed at the front face 3 of the object 1 are generated from the modified region M8.

Figure 68:
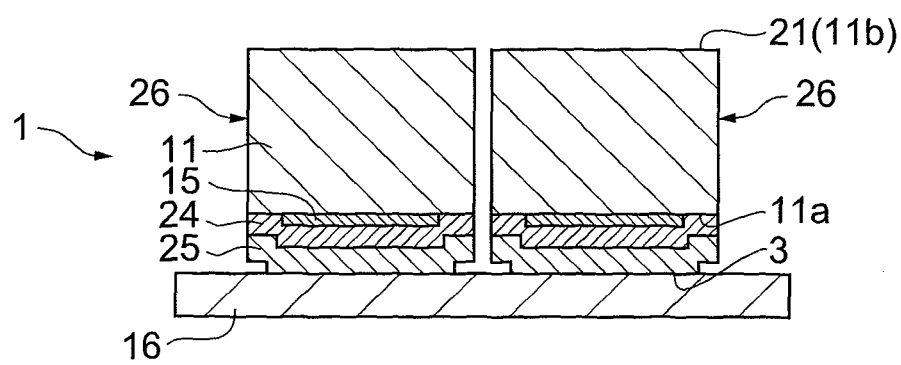
FIG. 68 is a view illustrating a sequel to FIG. 67.

Subsequently, the etching liquid is applied from the rear face 21 side, so that the etching progresses in the fracture C5, modified region M8, and fracture C4 in this order as illustrated in FIG. 68, whereby the modified region M8 and fractures C4, C5 are selectively etched. Then, the dicing tape 22 is transferred to the rear face 21 of the object 1 as illustrated in FIG. 69(a), and the resulting product is turned upside down as illustrated in FIG. 69(b). Thereafter, the dicing tape 16 is peeled off as illustrated in FIG. 69(c), and the chip 26 is taken out.

The working method for cutting in accordance with this embodiment also yields advantageous effects similar to those of the above-mentioned first embodiment. In this embodiment, since the fractures C4, C5 are formed as mentioned above, the object can be cut while causing the etching liquid to infiltrate through the fractures C4, C5, whereby the cutting speed can be increased.

As mentioned above, the fracture C5 is exposed at the rear face 21 of the object 1, i.e., an etching start point is exposed. Therefore, the etching liquid aggressively infiltrates into the object 1 through the exposed fracture C5. This can inhibit the rear face 21 of the object 1 from being etched, suppress damages to the rear face 21 of the object 1, and increase the etching speed.

By controlling the length in the thickness direction of the modified region M8 to be formed, this embodiment can regulate the amount of etching in regions, other than the modified region, in the depicted lateral directions and the like.

As mentioned above, this embodiment can finally divide the object 1 into the chips 26, 26 by the etching process. Therefore, the chip 26 can be taken out without expanding the dicing tape 16, thus making it possible to reduce takt time and process ultrasmall chips to which no external stress is applicable.

Twenty-Sixth Embodiment

The working method for cutting in accordance with the twenty-sixth embodiment of the present invention will now be explained. While omitting the same descriptions as those of the above-mentioned twenty-fifth embodiment, their differences will mainly be explained.

In the working method for cutting in accordance with this embodiment, after peeling off the dicing tape 16 from the rear face 21 of the object 1 (see FIG. 69(c)), the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned twenty-fifth embodiment. Since this embodiment divides the object 1 into the chips 26, 26 not only by the etching process but also by expanding the dicing tape 22 as mentioned above, the object 1 can reliably be divided into the chips 26, 26.

Twenty-Seventh Embodiment

The working method for cutting in accordance with the twenty-seventh embodiment of the present invention will now be explained. While omitting the same descriptions as those of the above-mentioned twenty-fifth embodiment, their differences will mainly be explained.

In the working method for cutting in accordance with this embodiment, after the fractures C5, C4 and modified region M8 are etched by the etching process (see FIG. 68), the dicing tape 16 is expanded as illustrated in FIG. 70(a), so as to divide the object 1 into the chips 26, 26 and separate the chips 26, 26 from each other. Subsequently, the dicing tape 22 is transferred to the rear face 21 of the object 1 as illustrated in FIG. 70(b), and the resulting product is turned upside down as illustrated in FIG. 70(c). Then, the dicing tape 16 is peeled off, the dicing tape 22 is expanded, and the chip 26 is taken out.

The working method for cutting in accordance with this embodiment also yields advantageous effects similar to those of the above-mentioned twenty-fifth embodiment. Since the dicing tape 22 is expanded after the object 1 is divided into the chips 26, 26 by expanding the dicing tape 16, the object 1 can reliably be divided into the chips 26, 26 in this embodiment.

Twenty-Eighth Embodiment

The working method for cutting in accordance with the twenty-eighth embodiment of the present invention will now be explained. While omitting the same descriptions as those of the above-mentioned twenty-fifth embodiment, their differences will mainly be explained.

Figure 71:
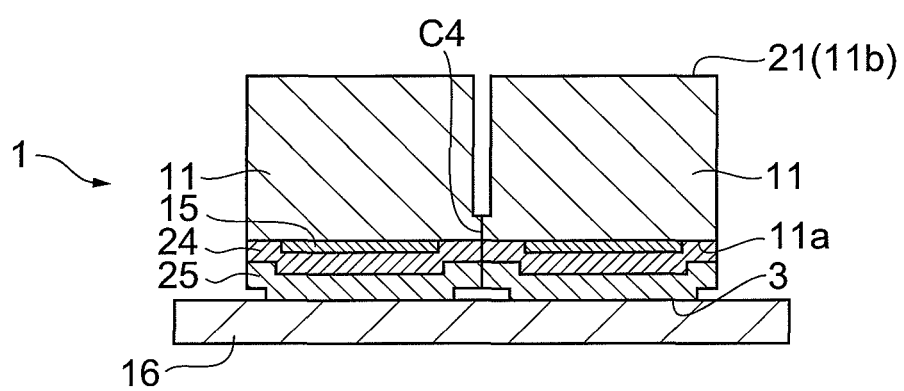
FIG. 71 is a schematic sectional view, taken along the line XXIII-XXIII of FIG. 22, for explaining the working method for cutting in accordance with a twenty-eighth embodiment.

In the working method for cutting in accordance with this embodiment, after the modified region M8 having the fractures C4, C5 is formed in the object 1 (see FIG. 67), the etching liquid is applied from the rear face 21 side, so that the etching progresses in the fracture C5 and modified region M8 in this order as illustrated in FIG. 71, whereby they are selectively etched. Here, the fracture C4 remains without being etched. Subsequently, the dicing tape 22 is transferred to the rear face 21 of the object 1 as illustrated in FIG. 72(a), and the resulting product is turned upside down as illustrated in FIG.

72(b). Then, the dicing tape 16 is peeled off as illustrated in FIG. 72(c), and the chip 26 is taken out.

The working method for cutting in accordance with this embodiment also yields advantageous effects similar to those of the above-mentioned twenty-fifth embodiment.

Twenty-Ninth Embodiment

The working method for cutting in accordance with the twenty-ninth embodiment of the present invention will now be explained. While omitting the same descriptions as those of the above-mentioned twenty-eighth embodiment, their differences will mainly be explained.

In the working method for cutting in accordance with this embodiment, after peeling off the dicing tape 16 from the rear face 21 of the object 1 (see FIG. 72(c)), the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned twenty-fifth embodiment. Since this embodiment divides the object 1 into the chips 26, 26 not only by the etching process but also by expanding the dicing tape 22 as mentioned above, the object 1 can reliably be divided into the chips 26, 26.

Thirtieth Embodiment

The working method for cutting in accordance with the thirtieth embodiment of the present invention will now be explained. While omitting the same descriptions as those of the above-mentioned twenty-eighth embodiment, their differences will mainly be explained.

In the working method for cutting in accordance with this embodiment, after the fracture C5 and modified region M8 are etched by the etching process (see FIG. 71), the dicing tape 16 is expanded as illustrated in FIG. 73(a), so as to divide the object 1 into the chips 26, 26 and separate the chips 26, 26 from each other. Subsequently, the dicing tape 22 is transferred to the rear face 21 of the object 1 as illustrated in FIG. 73(b), and the resulting product is turned upside down as illustrated in FIG. 73(c). Then, the dicing tape 16 is peeled off, the dicing tape 22 is expanded, and the chip 26 is taken out.

The working method for cutting in accordance with this embodiment also yields advantageous effects similar to those of the above-mentioned twenty-fifth embodiment. Since the dicing tape 22 is expanded after the object 1 is divided into the chips 26, 26 by expanding the dicing tape 16, the object 1 can reliably be divided into the chips 26, 26 in this embodiment.

Thirty-First Embodiment

The working method for cutting in accordance with the thirty-first embodiment of the present invention will now be explained. While omitting the same descriptions as those of the above-mentioned first embodiment, their differences will mainly be explained.

Figure 74:
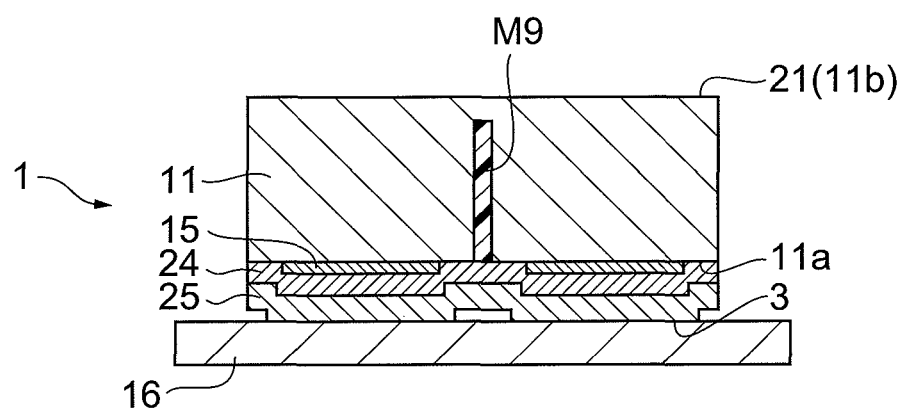
FIG. 74 is a schematic sectional view, taken along the line XXIII-XXIII of FIG. 22, for explaining the working method for cutting in accordance with a thirty-first embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M9 in the object 1 along the line to cut 5 as illustrated in FIG. 74. Specifically, the modified region M9 extending from within the silicon wafer 11 (near the rear face 21) to the front face 11a (so as to be exposed at the front face 11a) is formed in the object 1.

Figure 75:
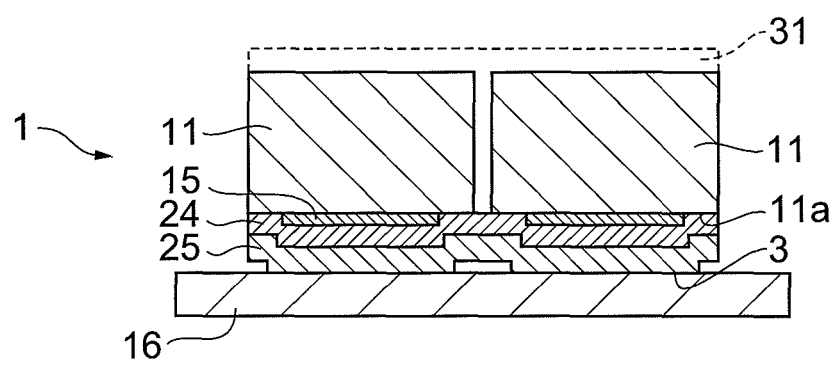
FIG. 75 is a view illustrating a sequel to FIG. 74.

Subsequently, the etching liquid is applied from the rear face 21 side of the object 1, so that the region 31 on the rear face 21 side of the object 1 is etched away as illustrated in FIG. 75. Then, the etching progresses along the modified region M9, whereby the modified region M9 is selectively etched. Thereafter, the dicing tape 22 is transferred to the etched rear face 21 as illustrated in FIG. 76(a), the resulting product is turned upside down as illustrated in FIG. 76(b), the dicing tape 16 is peeled off as illustrated in FIG. 76(c), and the chip 26 is taken out.

The working method for cutting in accordance with this embodiment also yields advantageous effects similar to those of the above-mentioned first embodiment. In this embodiment, since the modified region M9 is not exposed at the rear face 21 of the object 1 as mentioned above, Si, device surface materials, and the like can be inhibited from dispersing over the surroundings, whereby ambient contamination can be suppressed. Also, since the modified region M9 is thus kept from being exposed at the rear face 21, the object 1 formed with the modified region M9 is relatively hard to break and excellent in transportability.

By controlling the length of the modified region M9 to be formed in the thickness direction of the object 1, this embodiment can reduce the amount of etching in regions, other than the modified region, in the depicted lateral directions and the like.

Since the chip 26 is taken out without expanding the dicing tape 16 as mentioned above, this embodiment can reduce takt time and process ultrasmall chips to which no external stress is applicable. Since there is no full cut, the dicing tapes 16, 22 can easily be reattached.

This embodiment is effective in particular for the silicon wafer 11 or the like, whose front face 11a is a (111) plane or the like, having a cleavage plane in a direction inclining to its thickness direction.

Thirty-Second Embodiment

The working method for cutting in accordance with the thirty-second embodiment of the present invention will now be explained. While omitting the same descriptions as those of the above-mentioned thirty-first embodiment, their differences will mainly be explained.

In the working method for cutting in accordance with this embodiment, after peeling off the dicing tape 16 from the rear face 21 of the object 1 (see FIG. 76(c)), the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned thirty-first embodiment. Since this embodiment divides the object 1 into the chips 26, 26 not only by the etching process but also by expanding the dicing tape 22 as mentioned above, the object can reliably be divided into the chips 26, 26.

Thirty-Third Embodiment

The working method for cutting in accordance with the thirty-third embodiment of the present invention will now be explained. While omitting the same descriptions as those of the above-mentioned thirty-first embodiment, their differences will mainly be explained.

Figure 77:
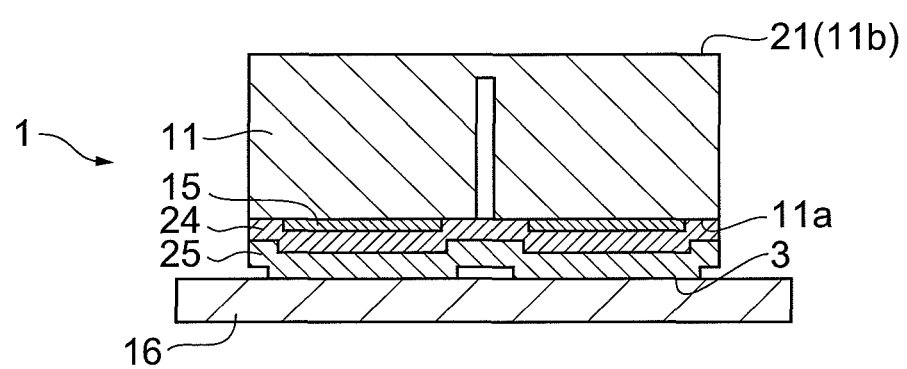
FIG. 77 is a schematic sectional view, taken along the line XXIII-XXIII of FIG. 22, for explaining the working method for cutting in accordance with a thirty-third embodiment.

In the working method for cutting in accordance with this embodiment, after the modified region M9 is formed in the object 1 (see FIG. 74), the etching liquid is applied from the outer peripheral face 41 side of the object 1, so that the modified region M9 is selectively etched as illustrated in FIG. 77. Subsequently, the dicing tape 22 is transferred to the rear face 21 as illustrated in FIG. 78(*a*), the resulting product is turned upside down as illustrated in FIG. 78(*b*), and the dicing tape 16 is peeled off as illustrated in FIG. 78(*c*). Then, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned thirty-first embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Since this embodiment divides the object 1 into the chips 26, 26 not only by the etching process but also by expanding the dicing tape 22 as mentioned above, the object 1 can reliably be divided into the chips 26, 26.

Thirty-Fourth Embodiment

The working method for cutting in accordance with the thirty-fourth embodiment of the present invention will now be explained. While omitting the same descriptions as those of the above-mentioned thirty-third embodiment, their differences will mainly be explained.

In the working method for cutting in accordance with this embodiment, after peeling off the dicing tape 16 from the rear face 21 of the object 1 (see FIG. 78(*c*)), the breaking device 32 such as a knife edge is pressed against the object 1 along the line to cut 5 from under the dicing tape 22 while the dicing tape 22 is expanded. This divides the object 1 into the chips 26, 26 and separates the chips 26, 26 from each other. Then, the chip 26 is taken out.

The working method for cutting in accordance with this embodiment also yields advantageous effects similar to those of the above-mentioned thirty-first embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Since this embodiment divides the object 1 into the chips 26, 26 by pressing the breaking device 32 thereto as mentioned above, the object 1 can be divided into the chips 26, 26 more reliably.

Thirty-Fifth Embodiment

The working method for cutting in accordance with the thirty-fifth embodiment of the present invention will now be explained. While omitting the same descriptions as those of the above-mentioned first embodiment, their differences will mainly be explained.

Figure 79:
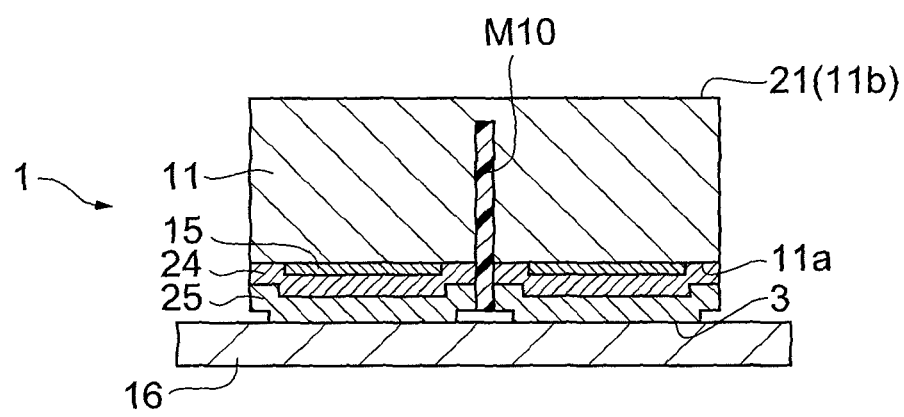
FIG. 79 is a schematic sectional view, taken along the line XXIII-XXIII of FIG. 22, for explaining the working method for cutting in accordance with a thirty-fifth embodiment.

In the working method for cutting in accordance with this embodiment, after the object 1 having the dicing tape 16 attached to the front face 3 is mounted on the mount table (see FIG. 23(*a*)), the object 1 is irradiated with laser light through the rear face 21 while locating a converging point at the object 1, so as to form a modified region M10 in the object 1 along the line to cut 5 as illustrated in FIG. 79. Specifically, the modified region M10 extending from within the silicon wafer 11 (near the rear face 21) to the front face 3 of the object 1 (so as to be exposed at the front face 3) is formed in the object 1.

Figure 80:
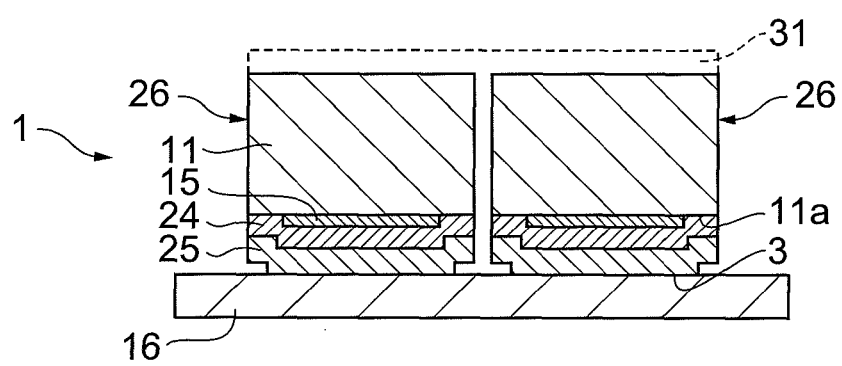
FIG. 80 is a view illustrating a sequel to FIG. 79.

Subsequently, the etching liquid is applied from the rear face 21 side of the object 1, so that the region 31 on the rear face 21 side of the object 1 is etched away as illustrated in FIG. 80. Then, the etching progresses along the modified region M10, whereby the modified region M10 is selectively etched. Thereafter, the dicing tape 22 is transferred to the etched rear face 21 as illustrated in FIG. 81(*a*), the resulting product is turned upside down as illustrated in FIG. 81(*b*), the dicing tape 16 is peeled off as illustrated in FIG. 81(*c*), and the chip 26 is taken out.

The working method for cutting in accordance with this embodiment also yields advantageous effects similar to those of the above-mentioned first embodiment. In this embodiment, since the modified region M10 is not exposed at the rear face 21 of the object 1 as mentioned above, Si, device surface materials, and the like can be inhibited from dispersing over the surroundings, whereby ambient contamination can be suppressed. Also, since the modified region M10 is thus kept from being exposed at the rear face 21, the object 1 formed with the modified region M10 is relatively hard to break and excellent in transportability.

By controlling the length of the modified region M10 to be formed in the thickness direction of the object 1, this embodiment can reduce the amount of etching in regions, other than the modified region, in the depicted lateral directions and the like.

Since the chip 26 is taken out without expanding the dicing tape 16 as mentioned above, this embodiment can reduce takt time and process ultrasmall chips to which no external stress is applicable. Since there is no full cut, the dicing tapes 16, 22 can easily be reattached.

This embodiment is effective in particular for the silicon wafer 11 or the like, whose front face 11*a* is a (111) plane or the like, having a cleavage plane in a direction inclining to its thickness direction.

Thirty-Sixth Embodiment

The working method for cutting in accordance with the thirty-sixth embodiment of the present invention will now be explained. While omitting the same descriptions as those of the above-mentioned thirty-fifth embodiment, their differences will mainly be explained.

In the working method for cutting in accordance with this embodiment, after peeling off the dicing tape 16 from the rear face 21 of the object 1 (see FIG. 81(*c*)), the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned thirty-fifth embodiment. Since this embodiment divides the object 1 into the chips 26, 26 not only by the etching process but also by expanding the dicing tape 22 as mentioned above, the object 1 can reliably be divided into the chips 26, 26.

Thirty-Seventh Embodiment

The working method for cutting in accordance with the thirty-seventh embodiment of the present invention will now be explained. While omitting the same descriptions as those of the above-mentioned thirty-fifth embodiment, their differences will mainly be explained.

Figure 82:
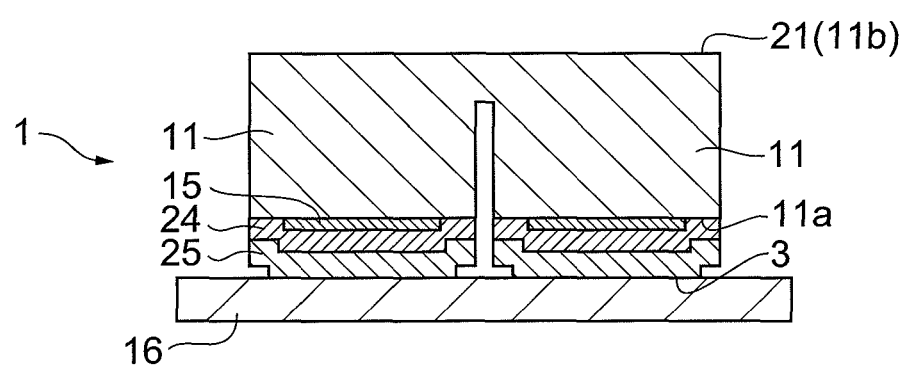
FIG. 82 is a schematic sectional view, taken along the line XXIII-XXIII of FIG. 22, for explaining the working method for cutting in accordance with a thirty-seventh embodiment.

In the working method for cutting in accordance with this embodiment, after the modified region M10 is formed in the object 1 (see FIG. 79), the etching liquid is applied from the outer peripheral face 41 side of the object 1, so that the modified region M10 is selectively etched as illustrated in FIG. 82. Subsequently, the dicing tape 22 is transferred to the rear face 21 as illustrated in FIG. 83(a), the resulting product is turned upside down as illustrated in FIG. 83(b), and the dicing tape 16 is peeled off as illustrated in FIG. 83(c). Then, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned thirty-fifth embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Since this embodiment divides the object 1 into the chips 26, 26 not only by the etching process but also by expanding the dicing tape 22 as mentioned above, the object 1 can reliably be divided into the chips 26, 26.

Thirty-Eighth Embodiment

The working method for cutting in accordance with the thirty-eighth embodiment of the present invention will now be explained. While omitting the same descriptions as those of the above-mentioned thirty-seventh embodiment, their differences will mainly be explained.

In the working method for cutting in accordance with this embodiment, after peeling off the dicing tape 16 from the rear face 21 of the object 1 (see FIG. 83(c)), the breaking device 32 such as a knife edge is pressed against the object 1 along the line to cut 5 from under the dicing tape 22 while the dicing tape 22 is expanded. This divides the object 1 into the chips 26, 26 and separates the chips 26, 26 from each other. Then, the chip 26 is taken out.

The working method for cutting in accordance with this embodiment also yields advantageous effects similar to those of the above-mentioned thirty-fifth embodiment. Also, as mentioned above, the etching process is carried out from the outer peripheral face 41 side of the object 1 in this embodiment, so as to regulate a start point for the etching process and cause the etching liquid to infiltrate aggressively into the object, thereby making it possible to inhibit the rear face 21 side of the object 1 from being etched, suppress damages to the rear face 21 side of the object 1, and increase the etching speed.

Since this embodiment divides the object 1 into the chips 26, 26 by pressing the breaking device 32 thereto as mentioned above, the object 1 can be divided into the chips 26, 26 more reliably.

Thirty-Ninth Embodiment

The working method for cutting in accordance with the thirty-ninth embodiment of the present invention will now be explained. While omitting the same descriptions as those of the above-mentioned first embodiment, their differences will mainly be explained.

Figure 84:
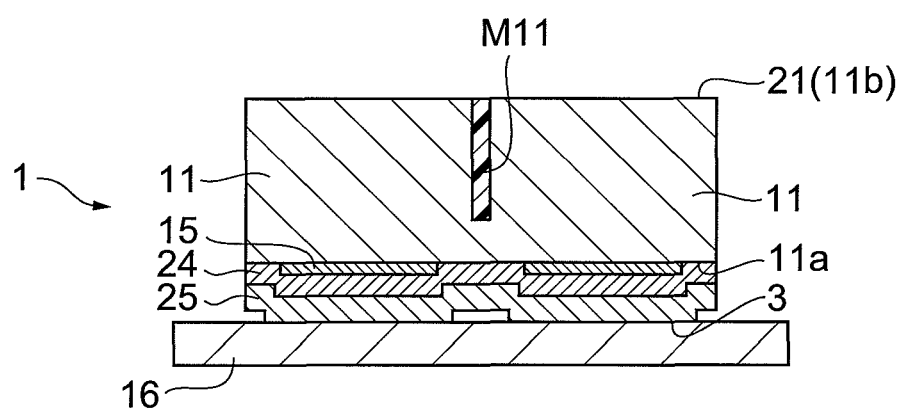
FIG. 84 is a schematic sectional view, taken along the line XXIII-XXIII of FIG. 22, for explaining the working method for cutting in accordance with a thirty-ninth embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M11 in the object 1 along the line to cut 5 as illustrated in FIG. 84. Specifically, the modified region M11 extending from within the silicon wafer 11 (near the front face 11a) to the rear face 21 of the object 1 (so as to be exposed at the rear face 21) is formed in the object 1.

Figure 85:
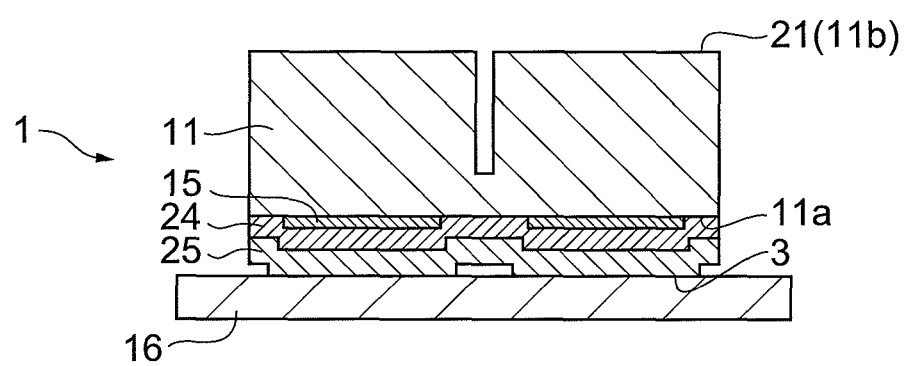
FIG. 85 is a view illustrating a sequel to FIG. 84.

Subsequently, the etching liquid is applied from the rear face 21 side, so that the etching progresses along the modified region M11 as illustrated in FIG. 85, whereby the modified region M11 is selectively etched. Then, the dicing tape 22 is transferred to the etched rear face 21 of the object 1 as illustrated in FIG. 86(a), the resulting product is turned upside down as illustrated in FIG. 86(b), and the dicing tape 16 is peeled off as illustrated in FIG. 86(c). Thereafter, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned first embodiment. In this embodiment, as mentioned above, the modified region M11 is exposed at the rear face 21 of the object 1, i.e., an etching start point is exposed. Therefore, the etching liquid aggressively infiltrates into the object 1 through the exposed modified region M11. This can inhibit the rear face 21 of the object 1 from being etched, suppress damages to the rear face 21 of the object 1, and increase the etching speed.

By controlling the length in the thickness direction of the modified region M11 to be formed, this embodiment can regulate the amount of etching in regions, other than the modified region, in the depicted lateral directions and the like.

This embodiment is effective in particular for the silicon wafer 11 or the like, whose front face 11a is a (111) plane or the like, having a cleavage plane in a direction inclining to its thickness direction.

Fortieth Embodiment

The working method for cutting in accordance with the fortieth embodiment of the present invention will now be explained. While omitting the same descriptions as those of the above-mentioned thirty-ninth embodiment, their differences will mainly be explained.

In the working method for cutting in accordance with this embodiment, after etching the modified region M11 (see FIG. 85), the dicing tape 16 is expanded as illustrated in FIG. 87(a), so as to divide the object 1 into the chips 26, 26 and separate the chips 26, 26 from each other. Subsequently, the dicing tape 22 is transferred to the rear face 21 of the object 1 as illustrated in FIG. 87(b), and the resulting product is turned upside down as illustrated in FIG. 87(c). Then, the dicing tape 16 is peeled off, the dicing tape 22 is expanded, and the chip 26 is taken out.

The working method for cutting in accordance with this embodiment also yields advantageous effects similar to those of the above-mentioned thirty-ninth embodiment. Since the dicing tape 22 is expanded after the object 1 is divided into the chips 26, 26 by expanding the dicing tape 16 as mentioned above, the object 1 can be divided into the chips 26, 26 more reliably in this embodiment.

Forty-First Embodiment

The working method for cutting in accordance with the forty-first embodiment of the present invention will now be explained. While omitting the same descriptions as those of the above-mentioned thirty-ninth embodiment, their differences will mainly be explained.

In the working method for cutting in accordance with this embodiment, after etching the modified region M11 (see FIG. 85), the breaking device 32 such as a knife edge is pressed against the object 1 along the line to cut 5 from under the dicing tape 16 while the dicing tape 16 is expanded as illustrated in FIG. 88(a). This divides the object 1 into the chips 26, 26 and separates the chips 26, 26 from each other. Subsequently, the dicing tape 22 is transferred to the rear face 21 of the object 1 as illustrated in FIG. 88(b), and the resulting product is turned upside down as illustrated in FIG. 88(c). Then, the dicing tape 16 is peeled off, the dicing tape 22 is expanded, and the chip 26 is taken out.

The working method for cutting in accordance with this embodiment also yields advantageous effects similar to those of the above-mentioned thirty-ninth embodiment. Since the dicing tape 22 is expanded after the object 1 is divided into the chips 26, 26 by the dicing tape 16 and breaking device 32, the object 1 can be divided into the chips 26, 26 reliably in this embodiment. Since this embodiment divides the object 1 into the chips 26, 26 by pressing the breaking device 32 thereto as mentioned above, the object 1 can be divided into the chips 26, 26 more reliably.

Forty-Second Embodiment

The working method for cutting in accordance with the forty-second embodiment of the present invention will now be explained. While omitting the same descriptions as those of the above-mentioned first embodiment, their differences will mainly be explained.

Figure 89:
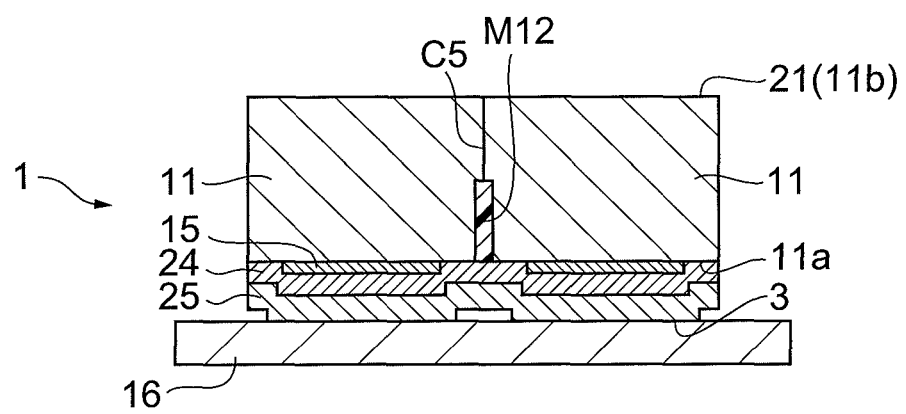
FIG. 89 is a schematic sectional view, taken along the line XXIII-XXIII of FIG. 22, for explaining the working method for cutting in accordance with a forty-second embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M12 in the object 1 along the line to cut 5 as illustrated in FIG. 89. Specifically, the modified region M12 extending from within the silicon wafer 11 to the front face 11a (so as to be exposed at the front face 11a) is formed, while a fracture C5 extending in the thickness direction and being exposed at the rear face 21 of the object 1 is generated from the modified region M12.

Figure 90:
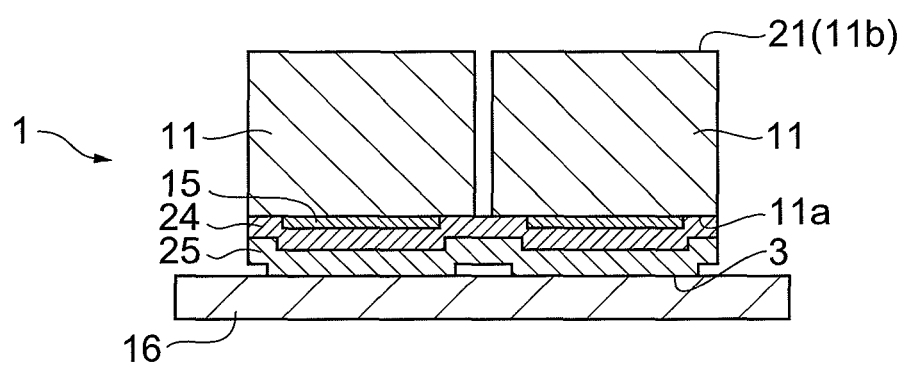
FIG. 90 is a view illustrating a sequel to FIG. 89.

Subsequently, the etching liquid is applied from the rear face 21 side, so that the etching progresses in the fracture C5 and modified region M12 in this order, whereby the fracture C5 and modified region M12 are selectively etched as illustrated in FIG. 90. Then, the dicing tape 22 is transferred to the rear face 21 of the object 1 as illustrated in FIG. 91(a), the resulting product is turned upside down as illustrated in FIG. 91(b), and the dicing tape 16 is peeled off as illustrated in FIG. 91(c). Thereafter, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned first embodiment. In this embodiment, since the fracture C5 is formed as mentioned above, the object can be cut while causing the etching liquid to infiltrate through the fracture C5, whereby the cutting speed can be increased.

As mentioned above, the fracture C5 is exposed at the rear face 21 of the object, i.e., an etching start point is exposed. Therefore, the etching liquid aggressively infiltrates into the object 1 through the exposed fracture C5. This can inhibit the rear face 21 of the object 1 from being etched, suppress damages to the rear face 21 of the object 1, and increase the etching speed.

By controlling the length in the thickness direction of the modified region M12 to be formed, this embodiment can regulate the amount of etching in regions, other than the modified region, in the depicted lateral directions and the like.

Forty-Third Embodiment

The working method for cutting in accordance with the forty-third embodiment of the present invention will now be explained. While omitting the same descriptions as those of the above-mentioned forty-second embodiment, their differences will mainly be explained.

In the working method for cutting in accordance with this embodiment, after the fracture C5 and modified region M12 are etched by the etching process (see FIG. 90), the dicing tape 16 is expanded as illustrated in FIG. 92(a), so as to divide the object 1 into the chips 26, 26 and separate the chips 26, 26 from each other. Subsequently, the dicing tape 22 is transferred to the rear face 21 of the object 1 as illustrated in FIG. 92(b), and the resulting product is turned upside down as illustrated in FIG. 92(c). Then, the dicing tape 16 is peeled off, the dicing tape 22 is expanded, and the chip 26 is taken out.

The working method for cutting in accordance with this embodiment also yields advantageous effects similar to those of the above-mentioned forty-second embodiment. Since the dicing tape 22 is expanded after the object 1 is divided into the chips 26, 26 by expanding the dicing tape 16, the object 1 can reliably be divided into the chips 26, 26 in this embodiment.

Forty-Fourth Embodiment

The working method for cutting in accordance with the forty-fourth embodiment of the present invention will now be explained. While omitting the same descriptions as those of the above-mentioned first embodiment, their differences will mainly be explained.

Figure 93:
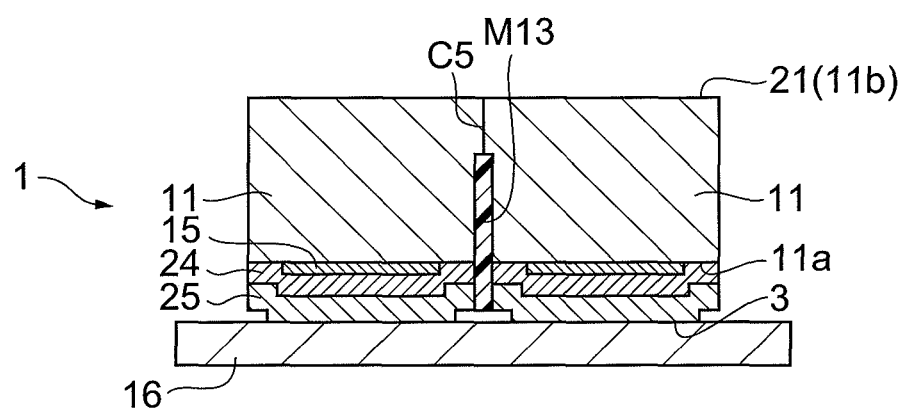
FIG. 93 is a schematic sectional view, taken along the line XXIII-XXIII of FIG. 22, for explaining the working method for cutting in accordance with a forty-fourth embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M13 in the object 1 along the line to cut 5 as illustrated in FIG. 93. Specifically, the modified region M13 extending from within the silicon wafer 11 to the front face 3 of the object 1 (so as to be exposed at the front face 3) is formed, while a fracture C5 extending in the thickness direction and being exposed at the rear face 21 of the object 1 is generated from the modified region M13.

Figure 94:
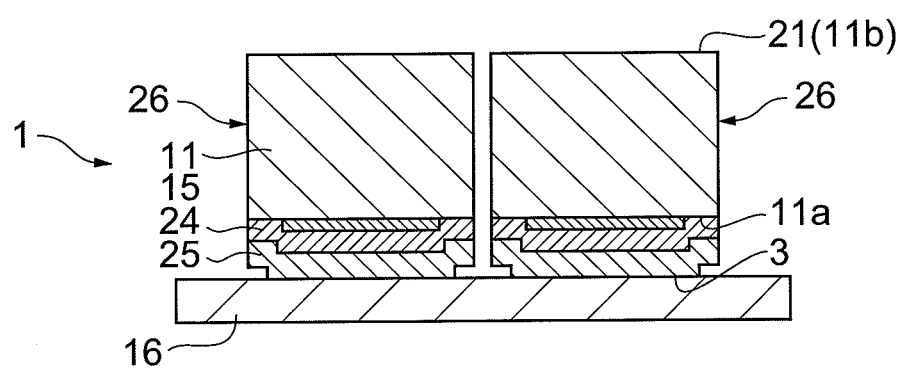
FIG. 94 is a view illustrating a sequel to FIG. 93.

Subsequently, the etching liquid is applied from the rear face 21 side, so that the etching progresses in the fracture C5 and modified region M13 in this order, whereby the fracture C5 and modified region M13 are selectively etched, thus dividing the object 1 into the chips 26, 26 as illustrated in FIG. 94. Then, the dicing tape 22 is transferred to the rear face 21 of the object 1 as illustrated in FIG. 95(a), and the resulting product is turned upside down as illustrated in FIG. 95(b).

Thereafter, the dicing tape 16 is peeled off as illustrated in FIG. 95(c), and the chip 26 is taken out as illustrated in FIG. 32.

The working method for cutting in accordance with this embodiment also yields advantageous effects similar to those of the above-mentioned first embodiment. As mentioned above, this embodiment can finally divide the object 1 into the chips 26, 26 by the etching process. Therefore, the chip 26 can be taken out without expanding the dicing tape 16, thus making it possible to reduce takt time and process ultrasmall chips to which no external stress is applicable.

Forty-Fifth Embodiment

The working method for cutting in accordance with the forty-fifth embodiment of the present invention will now be explained. While omitting the same descriptions as those of the above-mentioned forty-fourth embodiment, their differences will mainly be explained.

In the working method for cutting in accordance with this embodiment, after peeling off the dicing tape 16 (see FIG. 95(c)), the dicing tape 22 is expanded, and the chip 26 is taken out.

The working method for cutting in accordance with this embodiment also yields advantageous effects similar to those of the above-mentioned forty-fourth embodiment. Since this embodiment divides the object 1 into the chips 26, 26 not only by the etching process but also by expanding the dicing tape 22 as mentioned above, the object can reliably be divided into the chips 26, 26.

Forty-Sixth Embodiment

The working method for cutting in accordance with the forty-sixth embodiment of the present invention will now be explained. While omitting the same descriptions as those of the above-mentioned forty-fourth embodiment, their differences will mainly be explained.

In the working method for cutting in accordance with this embodiment, after the modified region M13 and fracture C5 are etched by the etching process (see FIG. 94), the dicing tape 16 is expanded as illustrated in FIG. 96(a), so as to divide the object 1 into the chips 26, 26 and separate the chips 26, 26 from each other. Subsequently, the dicing tape 22 is transferred to the rear face 21 of the object 1 as illustrated in FIG. 96(b), and the resulting product is turned upside down as illustrated in FIG. 96(c). Then, the dicing tape 16 is peeled off, the dicing tape 22 is expanded, and the chip 26 is taken out.

The working method for cutting in accordance with this embodiment also yields advantageous effects similar to those of the above-mentioned forty-fourth embodiment. Since the dicing tape 16 is expanded after the etching process, and then the dicing tape 22 is expanded as mentioned above, the object 1 can reliably be divided into the chips 26, 26 in this embodiment.

Forty-Seventh Embodiment

The working method for cutting in accordance with the forty-seventh embodiment of the present invention will now be explained. While omitting the same descriptions as those of the above-mentioned first embodiment, their differences will mainly be explained.

Figure 97:
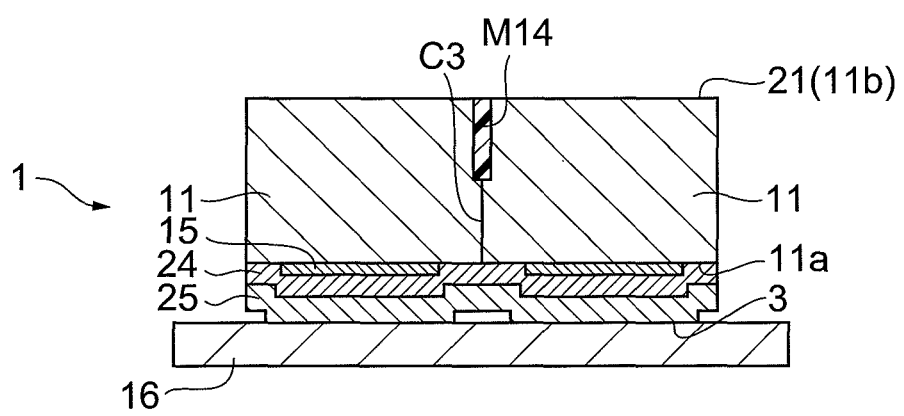
FIG. 97 is a schematic sectional view, taken along the line XXIII-XXIII of FIG. 22, for explaining the working method for cutting in accordance with a forty-seventh embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M14 in the object 1 along the line to cut 5 as illustrated in FIG. 97. Specifically, the modified region M14 extending from within the object 1 to the rear face 21 (so as to be exposed at the rear face 21) is formed, while a fracture C3 extending in the thickness direction and being exposed at the front face 11a of the silicon wafer 11 is generated from the modified region M14.

Figure 98:
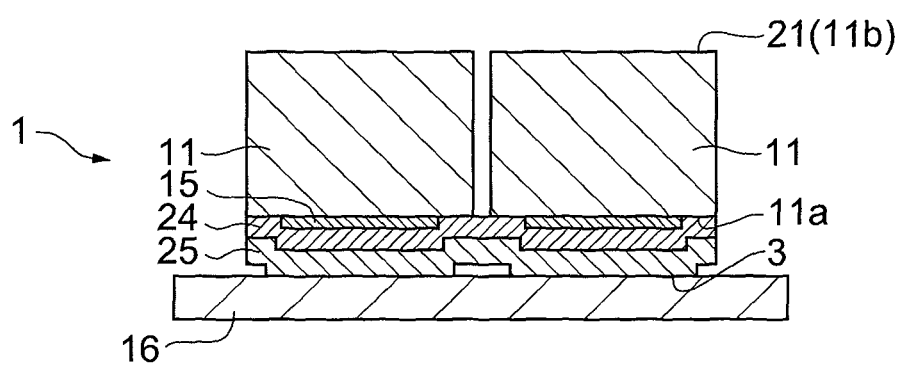
FIG. 98 is a view illustrating a sequel to FIG. 97.

Subsequently, the etching liquid is applied from the rear face 21 side, so that the etching progresses in the modified region M14 and fracture C3 in this order, whereby the modified region M14 and fracture C3 are selectively etched as illustrated in FIG. 98. Then, the dicing tape 22 is transferred to the rear face 21 of the object 1 as illustrated in FIG. 99(a), and the resulting product is turned upside down as illustrated in FIG. 99(b). Thereafter, the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned first embodiment. In this embodiment, since the fracture C3 is formed as mentioned above, the object can be cut while causing the etching liquid to infiltrate through the fracture C3, whereby the cutting speed can be increased.

As mentioned above, the modified region M14 is exposed at the rear face 21 of the object 1, i.e., an etching start point is exposed. Therefore, the etching liquid aggressively infiltrates into the object 1 through the exposed modified region M14. This can inhibit the rear face 21 of the object 1 from being etched, suppress damages to the rear face 21 of the object 1, and increase the etching speed.

By controlling the length in the thickness direction of the modified region M14 to be formed, this embodiment can regulate the amount of etching in regions, other than the modified region, in the depicted lateral directions and the like.

Since this embodiment divides the object 1 into the chips 26, 26 not only by the etching process but also by expanding the dicing tape 22 as mentioned above, the object 1 can reliably be divided into the chips 26, 26.

Forty-Eighth Embodiment

The working method for cutting in accordance with the forty-eighth embodiment of the present invention will now be explained. While omitting the same descriptions as those of the above-mentioned forty-seventh embodiment, their differences will mainly be explained.

In the working method for cutting in accordance with this embodiment, after the modified region M14 and fracture C3 are etched (see FIG. 98), the dicing tape 16 is expanded as illustrated in FIG. 100(a), so as to divide the object 1 into the chips 26, 26 and separate the chips 26, 26 from each other. Subsequently, the dicing tape 22 is transferred to the rear face 21 of the object 1 as illustrated in FIG. 100(b), and the resulting product is turned upside down as illustrated in FIG. 100(c). Then, the dicing tape 16 is peeled off, the dicing tape 22 is expanded, and the chip 26 is taken out.

The working method for cutting in accordance with this embodiment also yields advantageous effects similar to those of the above-mentioned forty-seventh embodiment. Since the dicing tape 22 is expanded after the object 1 is divided into the chips 26, 26 by expanding the dicing tape 16, the object 1 can reliably be divided into the chips 26, 26 in this embodiment.

Forty-Ninth Embodiment

The working method for cutting in accordance with the forty-ninth embodiment of the present invention will now be explained. While omitting the same descriptions as those of the above-mentioned forty-seventh embodiment, their differences will mainly be explained.

Figure 101:
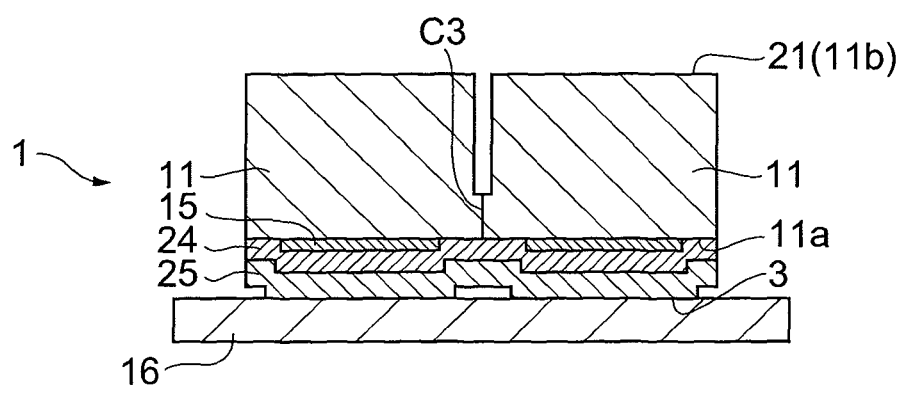
FIG. 101 is a schematic sectional view, taken along the line XXIII-XXIII of FIG. 22, for explaining the working method for cutting in accordance with a forty-ninth embodiment.

In the working method for cutting in accordance with this embodiment, after the modified region M14 and fracture C3 are formed in the object 1 (see FIG. 97), the etching liquid is applied from the rear face 21 side, so that the etching progresses along the modified region M14, whereby the modified region M14 is selectively etched as illustrated in FIG. 101. Here, the fracture C3 remains without being etched. Subsequently, the dicing tape 22 is transferred to the rear face 21 of the object 1 as illustrated in FIG. 102(a), and the resulting product is turned upside down as illustrated in FIG. 102(b). Then, the dicing tape 16 is peeled off as illustrated in FIG. 102(c), and the chip 26 is taken out.

The working method for cutting in accordance with this embodiment also yields advantageous effects similar to those of the above-mentioned forty-seventh embodiment. Since the chip 26 is taken out without expanding the dicing tape 16 as mentioned above, this embodiment can reduce takt time and process ultrasmall chips to which no external stress is applicable.

Fiftieth Embodiment

The working method for cutting in accordance with the fiftieth embodiment of the present invention will now be explained. While omitting the same descriptions as those of the above-mentioned forty-ninth embodiment, their differences will mainly be explained.

In the working method for cutting in accordance with this embodiment, after peeling off the dicing tape 16 from the rear face 21 of the object 1 (see FIG. 102(c)), the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned forty-seventh embodiment. Since this embodiment divides the object 1 into the chips 26, 26 not only by the etching process but also by expanding the dicing tape 22 as mentioned above, the object 1 can reliably be divided into the chips 26, 26.

Fifty-First Embodiment

The working method for cutting in accordance with the fifty-first embodiment of the present invention will now be explained. While omitting the same descriptions as those of the above-mentioned first embodiment, their differences will mainly be explained.

Figure 103:
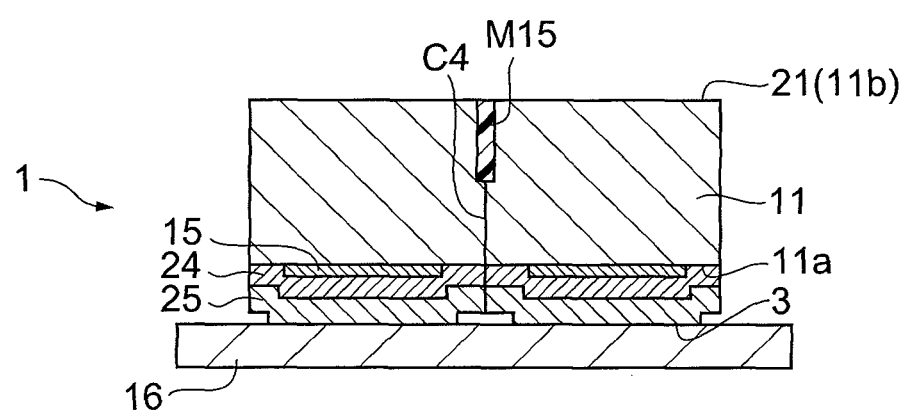
FIG. 103 is a schematic sectional view, taken along the line XXIII-XXIII of FIG. 22, for explaining the working method for cutting in accordance with a fifty-first embodiment.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a modified region M15 having a fracture C4 along the line to cut 5 as illustrated in FIG. 103. Specifically, the modified region M15 extending from within the silicon wafer 11 to the front face 21 (so as to be exposed at the rear face 21) is formed, while the fracture C4 extending in the thickness direction and being exposed at the front face 3 of the object 1 is generated from the modified region M15.

Figure 104:
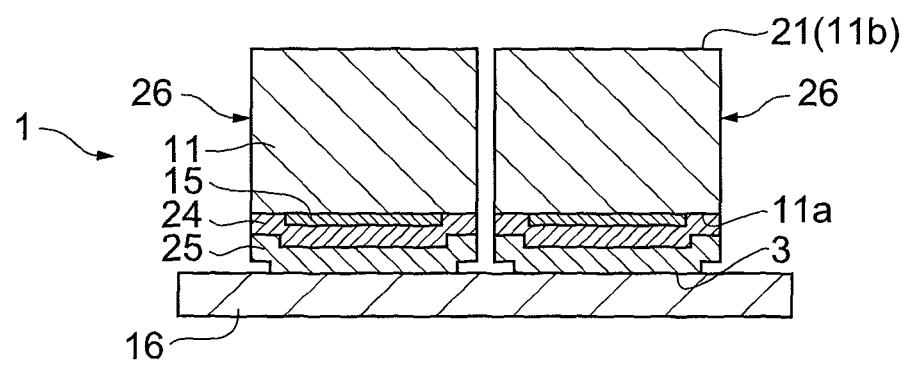
FIG. 104 is a view illustrating a sequel to FIG. 103.

Subsequently, the etching liquid is applied from the rear face 21 side, so that the etching progresses in the modified region M15 and fracture C4 in this order, whereby the modified region M15 and fracture C4 are selectively etched as illustrated in FIG. 104. Then, the dicing tape 22 is transferred to the rear face 21 of the object 1 as illustrated in FIG. 105(a), and the resulting product is turned upside down as illustrated in FIG. 105(b). Thereafter, the dicing tape 16 is peeled off as illustrated in FIG. 105(c), and the chip 26 is taken out.

The working method for cutting in accordance with this embodiment also yields advantageous effects similar to those of the above-mentioned first embodiment. In this embodiment, since the fracture C4 is formed as mentioned above, the object can be cut while causing the etching liquid to infiltrate through the fracture C4, whereby the cutting speed can be increased.

As mentioned above, the modified region M15 is exposed at the rear face 21 of the object 1, i.e., an etching start point is exposed. Therefore, the etching liquid aggressively infiltrates into the object 1 through the exposed modified region M15. This can inhibit the rear face 21 of the object 1 from being etched, suppress damages to the rear face 21 of the object 1, and increase the etching speed.

By controlling the length in the thickness direction of the modified region M15 to be formed, this embodiment can regulate the amount of etching in regions, other than the modified region, in the depicted lateral directions and the like.

Since the chip 26 is taken out without expanding the dicing tape 16 as mentioned above, this embodiment can reduce takt time and process ultrasmall chips to which no external stress is applicable.

Fifty-Second Embodiment

The working method for cutting in accordance with the fifty-second embodiment of the present invention will now be explained. While omitting the same descriptions as those of the above-mentioned fifty-first embodiment, their differences will mainly be explained.

In the working method for cutting in accordance with this embodiment, after peeling off the dicing tape 16 from the rear face 21 of the object 1 (see FIG. 105(c)), the dicing tape 22 is expanded, so as to divide the object 1 into the chips 26, 26 and separate the chips 26, 26 from each other, and the chip 26 is taken out.

The working method for cutting in accordance with this embodiment also yields advantageous effects similar to those of the above-mentioned fifty-first embodiment. Since this embodiment divides the object 1 into the chips 26, 26 not only by the etching process but also by expanding the dicing tape 22 as mentioned above, the object 1 can reliably be divided into the chips 26, 26.

Fifty-Third Embodiment

The working method for cutting in accordance with the fifty-third embodiment of the present invention will now be explained. While omitting the same descriptions as those of the above-mentioned fifty-first embodiment, their differences will mainly be explained.

In the working method for cutting in accordance with this embodiment, after the modified region M15 and fracture C4 are etched by the etching process (see FIG. 104), the dicing tape 16 is expanded as illustrated in FIG. 106(a), so as to divide the object 1 into the chips 26, 26 and separate the chips 26, 26 from each other. Subsequently, the dicing tape 22 is transferred to the rear face 21 of the object 1 as illustrated in FIG. 106(b), and the resulting product is turned upside down as illustrated in FIG. 106(c). Then, the dicing tape 16 is peeled off, the dicing tape 22 is expanded as illustrated in FIG. 28(a), and the chip 26 is taken out.

The working method for cutting in accordance with this embodiment also yields advantageous effects similar to those of the above-mentioned fifty-first embodiment. Since the dicing tape 22 is expanded after the object 1 is divided into the chips 26, 26 by expanding the dicing tape 16, the object 1 can reliably be divided into the chips 26, 26 in this embodiment.

Fifty-Fourth Embodiment

The working method for cutting in accordance with the fifty-fourth embodiment of the present invention will now be explained. While omitting the same descriptions as those of the above-mentioned fifty-first embodiment, their differences will mainly be explained.

Figure 107:
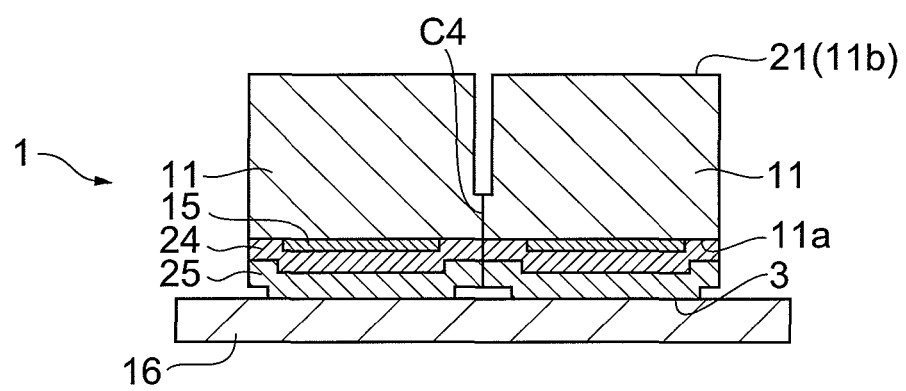
FIG. 107 is a schematic sectional view, taken along the line XXIII-XXIII of FIG. 22, for explaining the working method for cutting in accordance with a fifty-fourth embodiment.

In the working method for cutting in accordance with this embodiment, after the modified region M15 having the fracture C4 is formed in the object 1 (see FIG. 103), the etching liquid is applied from the rear face 21 side, so that the etching progresses along the modified region M15, whereby the modified region M15 is selectively etched as illustrated in FIG. 107. Here, the fracture C4 remains without being etched. Subsequently, the dicing tape 22 is transferred to the rear face 21 of the object 1 as illustrated in FIG. 108(a), and the resulting product is turned upside down as illustrated in FIG. 108(b). Then, the dicing tape 16 is peeled off as illustrated in FIG. 108(c), and the chip 26 is taken out.

The working method for cutting in accordance with this embodiment also yields advantageous effects similar to those of the above-mentioned fifty-first embodiment.

Fifty-Fifth Embodiment

The working method for cutting in accordance with the fifty-fifth embodiment of the present invention will now be explained. While omitting the same descriptions as those of the above-mentioned fifty-fourth embodiment, their differences will mainly be explained.

In the working method for cutting in accordance with this embodiment, after peeling off the dicing tape 16 from the rear face 21 of the object 1 (see FIG. 108(c)), the dicing tape 22 is expanded, so as to divide the object 1 into the chips 26, 26 and separate the chips 26, 26 from each other as mentioned above, whereby the object 1 can reliably be divided into the chips 26, 26.

The working method for cutting in accordance with this embodiment also yields advantageous effects similar to those of the above-mentioned fifty-first embodiment. Since this embodiment divides the object 1 into the chips 26, 26 not only by the etching process but also by expanding the dicing tape 22 as mentioned above, the object 1 can reliably be divided into the chips 26, 26.

Fifty-Sixth Embodiment

The working method for cutting in accordance with the fifty-sixth embodiment of the present invention will now be explained. While omitting the same descriptions as those of the above-mentioned fifty-fourth embodiment, their differences will mainly be explained.

In the working method for cutting in accordance with this embodiment, after etching the modified region M15 (see FIG. 107), the dicing tape 16 is expanded as illustrated in FIG. 109(a), so as to divide the object 1 into the chips 26, 26 and separate the chips 26, 26 from each other. Subsequently, the dicing tape 22 is transferred to the rear face 21 of the object 1 as illustrated in FIG. 109(b), and the resulting product is turned upside down as illustrated in FIG. 109(c). Then, the dicing tape 16 is peeled off, the dicing tape 22 is expanded, and the chip 26 is taken out.

The working method for cutting in accordance with this embodiment also yields advantageous effects similar to those of the above-mentioned fifty-first embodiment. Since the dicing tape 22 is expanded after the object 1 is divided into the chips 26, 26 by expanding the dicing tape 16, the object 1 can reliably be divided into the chips 26, 26 in this embodiment.

Fifty-Seventh Embodiment

The working method for cutting in accordance with the fifty-seventh embodiment of the present invention will now be explained. While omitting the same descriptions as those of the above-mentioned sixth embodiment, their differences will mainly be explained.

In the working method for cutting in accordance with this embodiment, after the object 1 having the dicing tape 16 attached to the front face 3 is mounted on the mount table (see FIG. 23(a)), the object 1 is irradiated with laser light through the rear face 21 while locating a converging point at the object 1, so as to form a plurality of modified regions (M3 and M16 here) in the thickness direction in the object 1 along the line to cut 5 as illustrated in FIG. 119(a).

Specifically, while the modified region M3 is formed within the object 1, the modified region M16 is formed parallel to the modified region M3 on the device surface 3 side. While fractures C1, C2 extending in the thickness direction are generated from the modified region M3, fractures C6, C7 extending in the thickness direction are generated from the modified region M16. Here, the fractures C2, C6 are connected to each other.

Subsequently, as illustrated in FIG. 119(b), a mask 35 made of Sin, for example, which is resistant to the etching liquid is attached to the rear face 21. The mask 35 is provided with an opening 33 having an opening area corresponding to the etching width.

Next, the etching liquid is applied to the rear face 21 of the object 1 through the opening 33 of the mask 35, so that the region 31 on the rear face 21 side of the object 1 is etched away. The etching progresses in the fracture C1, modified region M3, and fracture C2 in this order, whereby the fractures C1, C2 and modified region M3 are selectively etched. Here, the etching time is controlled, the object is washed, and so forth, such that the etching stops without reaching the device surface 3, while leaving the modified region M16.

Subsequently, the mask 35 is peeled off, the dicing tape 22 is transferred to the rear face 21, the resulting product is turned upside down, and the dicing tape 16 is peeled off. Then, the dicing tape 22 is expanded as illustrated in FIG. 19(c), so as to divide the object 1 into the chips 26, 26 from the modified region M16 acting as a cutting start point (i.e., using the modified region M16 as a cutting modified region 16 to become a base point for the cutting) and separate the chips 26, 26 from each other. The mask 35 may be peeled off as appropriate, or the object may be divided into chips while leaving the mask 35.

The working method for cutting in accordance with this embodiment also yields advantageous effects similar to those of the above-mentioned sixth embodiment. In particular, since the object 1 is etched so as to save the device surface 3, the etching liquid can be inhibited from adversely affecting the devices 15, whereby the chips 26 having a favorable quality can be obtained in this embodiment.

When the etching is thus carried out so as not to reach the device surface 3 (i.e., the object 1 is not completely cut by the etching), the object 1 is typically cut by generating fractures from a leading end part 31a of the region 31 removed by the etching. Since the developing direction of fractures occurring from the leading end part 31a is hard to control, however, the object 1 may not be cut accurately in this case.

In this regard, while the modified regions M3, M16 arranged parallel to each other in the thickness direction are formed within the object 1, the etching process is carried out such as to save the cutting modified region M16 in this embodiment. Therefore, even when the etching does not reach the device surface 3, the object 1 is cut from the cutting modified region 16 acting as a cutting start point and thus can be cut easily and accurately. Hence, this embodiment can yield the chips 26 having a favorable quality by inhibiting the etching liquid from adversely affecting the devices 15 and cut the object 1 easily and accurately.

When the object 1 is completely etched until it is cut, the etching liquid may adversely affect it at the interface between the device 15 and silicon wafer 11 depending on the device 15. By contrast, this embodiment can reduce the adverse effect on the interface, since the object 1 is etched such as to save the device surface 3.

In this embodiment, the rear face 21 of the object 1 is exposed to the etching liquid through the opening 33 of the mask 35 as mentioned above. This inhibits the rear face 21 from being etched such that the etching depth (i.e., the distance from the rear face 21 to the leading end part 31a of the region 31) fluctuates, and thus can enhance the uniformity in etching depth. As a result, the object 1 can be cut stably, whereby the chips 26 having a better quality can be obtained.

Figure 120:
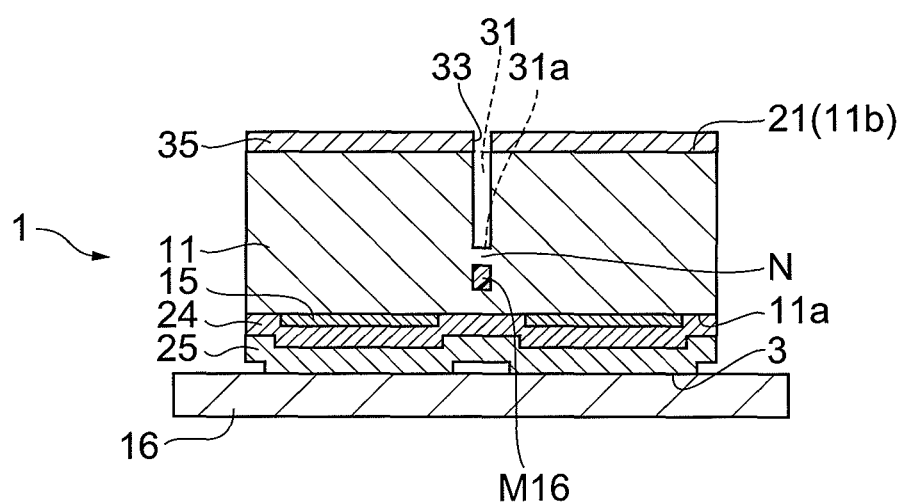
FIG. 120 is a schematic sectional view, taken along the line XXIII-XXIII of FIG. 22, for explaining a modified example of FIG. 119.

Though the fractures C6, C7 are generated from the modified region M16 in this embodiment, one of them may be generated alone. Further, as illustrated in FIG. 120, there is a case where none of the fractures C6, C7 is generated. An unmodified region N which is located closer to the rear face 21 than is the cutting modified region M16 exhibits an etching rate lower than that of the modified region, and thus serves as an etching stopper for retarding the etching when the fracture C6 is not generated. In this case, the etching liquid does not infiltrate into the cutting modified region M16 through the fracture C6 (see FIG. 119). Therefore, when the fracture C6 is not generated, the etching can easily be stopped from progressing, so as to save the modified region M16.

Though this embodiment forms and etches the modified region M3, the modified region to be etched is not limited thereto. Various modified regions may be etched as long as the object 1 is etched such as to save the device surface 3.

Though this embodiment forms the modified regions M3, M16 in parallel with each other in the thickness direction and carries out the etching process such as to save the cutting region M16, three or more modified regions may be formed in the thickness direction while the etching process may be carried out such that at least one of the modified regions remains as the cutting modified region.

Though preferred embodiments of the present invention are explained in the foregoing, the present invention is not limited to the above-mentioned embodiments.

For example, though the above-mentioned embodiments attach the dicing tape 16 to the front face 3 of the object 1, mount the object 1 on the mount table such that the rear face 21 faces up, and irradiate the object 1 with laser light from the rear face 21 side (back illumination), the following cases are also possible. That is, as illustrated in FIG. 110(*a*), the dicing tape 16 may be attached to the rear face 21 of the object 1, and the object 1 may be mounted on the mount table such that the front face 3 side faces up and irradiated with laser light from the front face 3 side (depicted upper side) (front illumination)

As illustrated in FIG. 110(*b*), the dicing tape 16 may be attached to the front face 3 of the object 1, and the object 1 may be mounted on the mount table such that the front face 3 (the dicing tape 16) faces up and irradiated with laser light through the dicing tape 16 from the front face 3 side. As illustrated in FIG. 110(*c*), the dicing tape 16 may be attached to the rear face 21 of the object 1, and the object 1 may be mounted on the mount table such that the rear face 21 faces up and irradiated with laser light through the dicing tape 16 from the rear face 21 side.

Though the above-mentioned embodiments are equipped with the protective film 25 as preferable for protecting the functional devices 15 from the etching liquid, this protective film may be omitted when it is not so necessary to protect the functional devices 15.

Though the above-mentioned embodiments form the modified regions such that an etched cut section of the object 1 is parallel to the thickness direction, laser conditions of the laser light, positions at which the modified regions are formed, and the like, for example, may be adjusted so that this cut section attains a predetermined surface form. When a modified region is formed at a predetermined position in the object in this case, the etched cut section of the object can acquire a desirable surface form such as a V-shape or semicircular form by utilizing a high etching rate in the modified region, whereby the bending strength of the object can be set to a desirable value, for example. When a modified region is formed such that the center part in the thickness direction of a cut section is etched in particular, for example, a recessed cut section depressed at the center in the thickness direction as seen in a direction along the line to cut from a side can be obtained. This improves the bending strength of chips.

When a modified region is formed such that an end part in the thickness direction of a cut section is etched in particular, for example, a cut section whose end part in the thickness direction is cut off can be obtained. This makes it unnecessary for a post-process such as chamfering to be carried out separately.

EXAMPLES

Examples will now be explained.

Example 1

A silicon bare wafer (front face: mirror; rear face: BG) having a thickness of 300 µm and a resistance value of 1 Ω·cm or greater was prepared, a PET base tape (UV type) was attached to the rear face of the silicon bare wafer, and the silicon bare wafer was irradiated with laser light from the front face side, so as to form 7 rows of modified regions in the thickness direction along each line to cut (7 scans). Here, a half cut was formed (a fracture was exposed at the front face) on the silicon bare wafer. Then, this silicon bare wafer was subjected to an etching process, so as to divide (cut) the object into a plurality of chips. KOH at a temperature 70° C. having a concentration of 32 wt % was used as the etching liquid, while the etching time was about 10 min.

As a result, the object was divided (cut) into a plurality of chips at a cut ratio of 100% as illustrated in FIGS. 111(*a*) and 112(*a*). As illustrated in FIGS. 111(*b*) and 112(*b*), the etching width (gap between adjacent chips) was such that the etching width L1 on the front face side was 20 µm (16 to 20 µm), while the etching width L2 on the rear face side was 12 µm. No chipping was seen (it was chipping-free). This verified the above-mentioned advantageous effect of reliably cutting the object 1 along the lines to cut 5.

Figure 113:
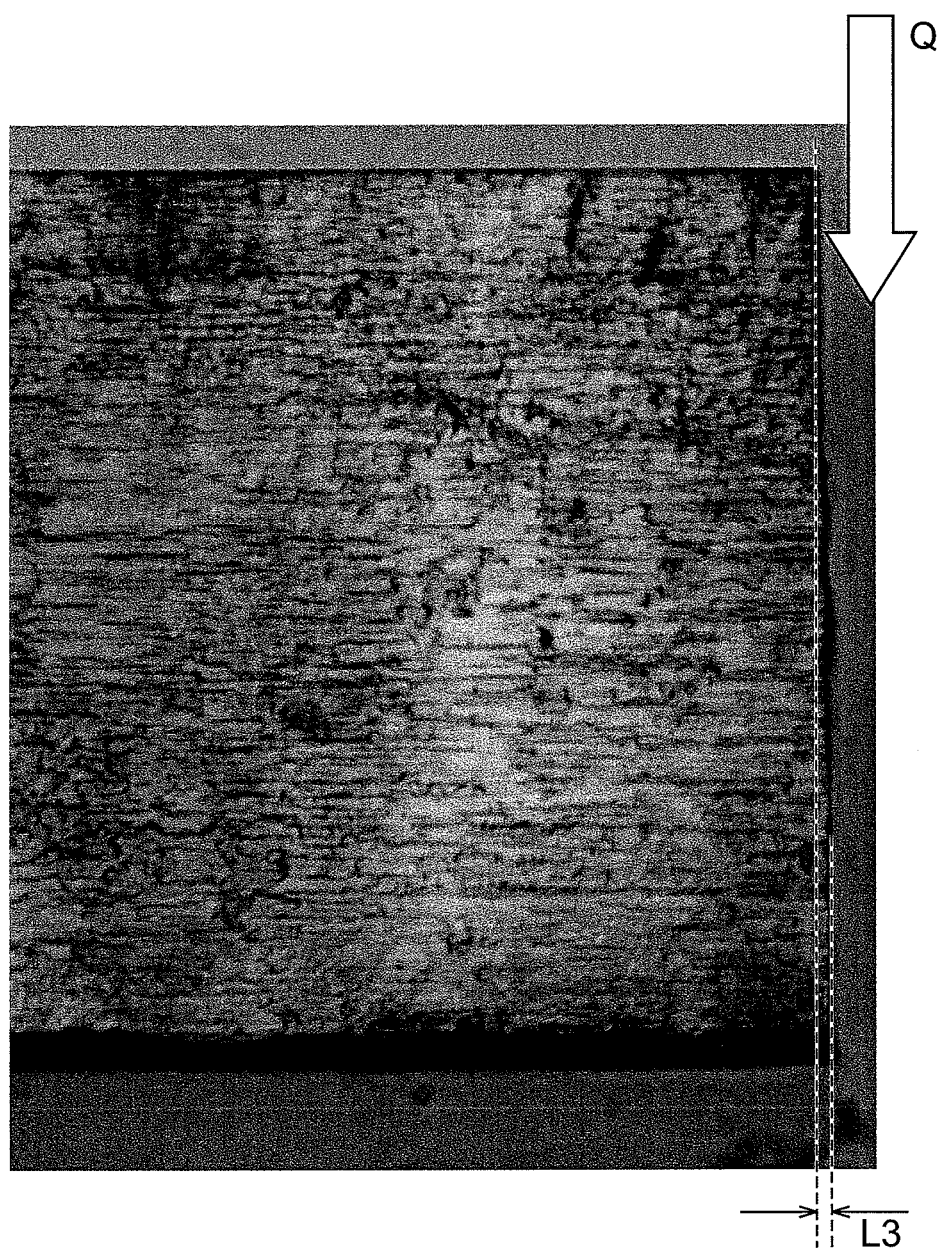
FIG. 113 is a photographic view illustrating a cut section of the object in FIG. 111.

As illustrated in FIG. 113, it was seen that the maximum irregularity of the cut section was 4 μm and that the modified regions were completely etched away. It was also seen that Si pieces and the like left in the modified regions were completely removed. Here, the cut section had the end part on the rear face projecting by 4 μm (depicted L3) from the end part on the front face side and exhibited a thin V groove, thereby indicating that the etching progressed in the direction of arrow Q from the front face side (the depicted upper side).

Example 2

Next, the resistance of holders against the etching liquid was evaluated for each material of the holders. Specifically, respective objects to be processed having the holders attached thereto were immersed in KOH for a predetermined time, and states of the holders were observed and evaluated. The concentration of the etching liquid was 32 wt %. FIGS. 114 to 118 illustrate the results.

Figure 114:
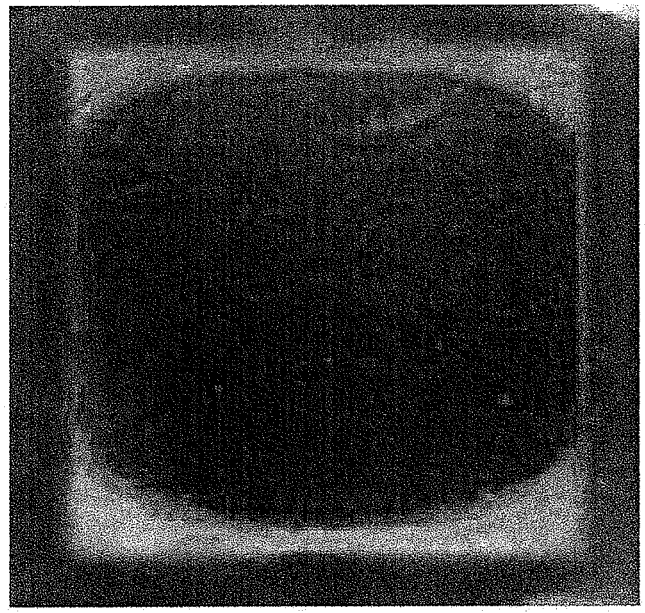
FIG. 114 is a photographic view illustrating a state of a holder made of polyolefin after being immersed in an etching liquid.

FIG. 114 is a photographic view illustrating the state of a holder made of polyolefin after being immersed in the etching liquid, FIG. 115 is a chart illustrating resistance evaluation results of a holder made of polyolefin with respect to the etching liquid, and FIG. 116 is a chart illustrating resistance evaluation results of a holder made of PET with respect to the etching liquid. As illustrated in FIGS. 114 and 115, the holder made of polyolefin exhibited waving (a state where the holder became wavy) and peeling (a state where a peripheral part of the holder peeled off from the object), but was sufficiently usable in regions other than the peripheral part. As illustrated in FIG. 114, the peeling occurred greatly in one end part (the depicted lower end part), thereby indicating that the thermal deformation of the material had an anisotropic characteristic. As illustrated in FIG. 116, the holder made of PET exhibited favorable resistance to the etching up to 30 sec. Usable ranges of etching liquid temperature and etching time for the holders were seen from the foregoing. The holder made of an EVA material was unusable at an etching liquid temperature of 67° C. and etching time of 30 sec.

FIG. 117 is a chart illustrating resistance evaluation results of holders with respect to the etching liquid at normal temperature, while FIG. 118 is a chart illustrating resistance evaluation results of holders with respect to the etching liquid at different temperatures. As illustrated in FIG. 117, no change was seen (waving and peeling were favorable) in the holders (tapes) made of any materials, and each material was suitable for the holder (evaluated favorable). The holders fully secured stickiness, and hydrophilic properties were seen on silicon surfaces after the etching process. As listed in FIG. 118, a dicing tape made of polyolefin and a BG tape made of PET were seen to be preferred as the holders.

INDUSTRIAL APPLICABILITY

The present invention can reliably cut an object to be processed along a line to cut.

The invention claimed is:

1. A working method for cutting a planar object to be processed along a line to cut, the method comprising the steps of:
   irradiating the object with laser light while locating a converging point at the object, so as to form a modified region in the object along the line to cut; and
   thereafter etching the modified region formed along the line to cut by infiltrating an etchant through a fracture incorporated into the modified region, by an etching process,
   wherein a groove is formed by etching the modified region; and
   wherein the modified region and fractures are not exposed at an outer surface of the object, just before etching, and
   wherein the step of etching the modified region carries out etching of the object so as not to reach a device surface with a device formed thereon.

2. A working method for cutting according to claim 1, further comprising the step of attaching the object to holding member for holding the object.

3. A working method for cutting according to claim 2, wherein, after subjecting the object to the etching process, the holding member is expanded, so as to cut the object along the line to cut.

4. A working method for cutting according to claim 1, wherein the modified region is etched, so as to cut the object along the line to cut.

5. A working method for cutting according to claim 1, wherein the modified region is formed at a predetermined position such that an etched cut section of the object attains a predetermined surface form.

6. A working method for cutting according to claim 1, wherein the modified region is formed in the object such that a fracture occurs from the modified region.

7. A working method for cutting according to claim 1, wherein a crystal plane of a principal plane of the object is a (111) plane.

8. A working method for cutting according to claim 1, wherein the step of forming the modified region forms a plurality of modified regions in a thickness direction of the object; and
   wherein the step of etching the modified region carries out the etching process such that at least one of the plurality of modified regions remains as a cutting modified region to become a base point for the cutting.

9. A working method for cutting according to claim 1, wherein the step of etching the modified region carries out the etching process utilizing an etchant exhibiting a higher etching rate for the modified region than for an unmodified region.

* * * * *

UNITED STATES PATENT AND TRADEMARK OFFICE
CERTIFICATE OF CORRECTION

| | | |
|---|---|---|
| PATENT NO. | : 8,603,351 B2 | Page 1 of 1 |
| APPLICATION NO. | : 12/601090 | |
| DATED | : December 10, 2013 | |
| INVENTOR(S) | : Takeshi Sakamoto, Hideki Shimoi and Naoki Uchiyama | |

It is certified that error appears in the above-identified patent and that said Letters Patent is hereby corrected as shown below:

Title page, item (87) "PCT Pub. Date"

change "Apr. 12, 2008" to --Dec. 4, 2008--

Signed and Sealed this
Fifteenth Day of April, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,603,351 B2  Page 1 of 1
APPLICATION NO. : 12/601090
DATED : December 10, 2013
INVENTOR(S) : Sakamoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 703 days.

Signed and Sealed this
Twenty-second Day of September, 2015

Michelle K. Lee
*Director of the United States Patent and Trademark Office*